(12) United States Patent
Kitamura

(10) Patent No.: US 8,980,441 B2
(45) Date of Patent: Mar. 17, 2015

(54) ORGANIC ELECTROLUMINESCENT DEVICE HAVING SPECIFIC DIAMINE COMPOUND

(75) Inventor: Tetsu Kitamura, Ashigarakami-gun (JP)

(73) Assignee: UDC Ireland Limited, Dublin (IE)

( * ) Notice: Subject to any disclaimer, the term of this patent is extended or adjusted under 35 U.S.C. 154(b) by 552 days.

(21) Appl. No.: 12/644,303

(22) Filed: Dec. 22, 2009

(65) Prior Publication Data
US 2010/0155712 A1 Jun. 24, 2010

(30) Foreign Application Priority Data
Dec. 22, 2008 (JP) .................. 2008-326513

(51) Int. Cl.
*H01L 51/54* (2006.01)
*C09K 11/06* (2006.01)
*H01L 51/00* (2006.01)
*H01L 51/50* (2006.01)

(52) U.S. Cl.
CPC ........ *H01L 51/0059* (2013.01); *H01L 51/0087* (2013.01); *H01L 51/004* (2013.01); *H01L 51/0085* (2013.01); *H01L 51/0094* (2013.01); *H01L 51/5012* (2013.01); *Y10S 428/917* (2013.01)
USPC ............. 428/690; 428/917; 313/504; 257/40; 257/E51.022

(58) Field of Classification Search
None
See application file for complete search history.

(56) References Cited

U.S. PATENT DOCUMENTS

| | | | |
|---|---|---|---|
| 5,514,508 A * | 5/1996 | Fukami et al. ................. | 430/76 |
| 6,180,217 B1 * | 1/2001 | Ueda et al. .................... | 428/212 |
| 6,303,238 B1 | 10/2001 | Thompson | |
| 2002/0028329 A1 * | 3/2002 | Ise et al. ........................ | 428/336 |
| 2003/0146443 A1 * | 8/2003 | Yamazaki et al. .............. | 257/80 |
| 2004/0209116 A1 | 10/2004 | Ren | |
| 2007/0018571 A1 * | 1/2007 | Hwang et al. ................. | 313/504 |
| 2008/0001530 A1 * | 1/2008 | Ise et al. ........................ | 313/504 |

FOREIGN PATENT DOCUMENTS

| | | |
|---|---|---|
| JP | 4-126790 A | 4/1992 |
| WO | 00/57676 A1 | 9/2000 |
| WO | WO 2007072962 A1 * 6/2007 | ............. C09K 11/06 |

OTHER PUBLICATIONS

Katsume et al. "High photon conversion in a light transducer combining organic electroluminescent diode with photoresponsive organic pigment film" Appl. Phys. Lett. 1994, 64, 2546-2548. Year of publication: 1994.*

Getautis et al. "Hole-drift mobility in phenylenediamine derivatives pssesing methyl substituents" Journal of Photochemistry and Photobiology A: Chemistry 2002, 151, 39-43. Year of publication: 2002.*

* cited by examiner

*Primary Examiner* — Andrew K Bohaty
(74) *Attorney, Agent, or Firm* — Riverside Law LLP

(57) ABSTRACT

An organic electroluminescent device is provided and includes: a cathode; an anode; and a light-emitting layer between the cathode and the anode. The light-emitting layer includes a compound represented by formula (1).

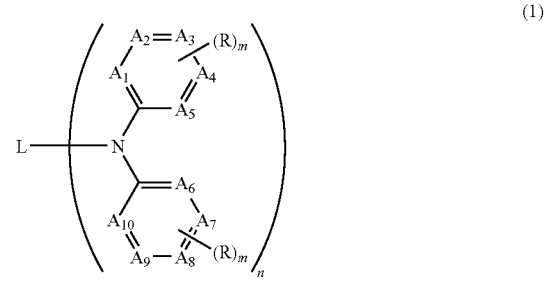

In formula (1), L represents a linking group; $A_1$, $A_2$, $A_3$, $A_4$, $A_5$, $A_6$, $A_7$, $A_8$, $A_9$, and $A_{10}$ each independently represent a carbon atom or a nitrogen atom, provided that at least two of $A_1$, $A_5$, $A_6$, and $A_{10}$ each represent a carbon atom having R'; R' represents a substituent having a carbon atom at a bonding position thereof; a plurality of Rs each independently represent a substituent; m represents an integer; and n represents an integer of 2 to 10.

12 Claims, No Drawings

ORGANIC ELECTROLUMINESCENT DEVICE HAVING SPECIFIC DIAMINE COMPOUND

This application is based on and claims priority under 35 U.S.C. §119 from Japanese Patent Application No. 2008-326513 filed Dec. 22, 2008, the entire disclosure of which is herein incorporated by reference.

BACKGROUND OF THE INVENTION

1. Field of the Invention

This invention relates to an organic electroluminescent device.

2. Background Art

An organic electroluminescent device (hereinafter "organic EL device") has been studied extensively for providing high-brightness luminescence at a low driving voltage. An organic electroluminescent device has an organic light emitting layer sandwiched between a pair of opposing electrodes. With an electric field applied to the electrodes, electrons and holes are injected from the cathode and the anode, respectively, into the organic layer, where they are recombined to generate excitons, the energy of which is utilized for light emission.

Recently, the luminescence efficiency of devices has been increasing by the use of a phosphorescent material. Phosphorescent electroluminescent devices using an iridium complex or a platinum complex as a phosphorescent material are disclosed, e.g., in U.S. Pat. No. 6,303,238 and WO 00/57676. Devices achieving both high efficiency and high durability, however, have not yet been developed. One of the reasons for the difficulty in developing a phosphorescent device with high efficiency and high durability is that there are limited host materials that have good chemical stability, excellent carrier injection/transport properties, and a high energy level of the lowest excited triplet state ($T_1$ energy). A host material is required to have a higher $T_1$ than a phosphorescent material because, and if not, the luminescence is quenched. When the $T_1$ of a host material is higher than, but with only a small difference from, that of a phosphorescent material, back energy transfer from the phosphorescent material to the host material occurs partially, which causes a reduction in efficiency or durability. Therefore, a host material having a sufficiently high $T_1$, good chemical stability, and excellent carrier injection/transport properties.

An organic electroluminescent device having a tetraphenylsilane compound of the following formula as a host material forming a light emitting layer along with a phosphorescent material is disclosed (U.S. Patent Publication No. 2004/0209116). Although the $T_1$ energy level of the host material proposed is high, the charge injection and transfer properties are low so that the device needs an increased driving voltage. Improvements in this respect have been demanded.

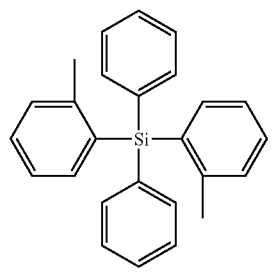 [SMILES: Cc1ccccc1[Si](c1ccccc1)(c1ccccc1)c1ccccc1C]

JP-4-126790A describes an organic electroluminescent device having an m-phenylenediamine compound of the following formula.

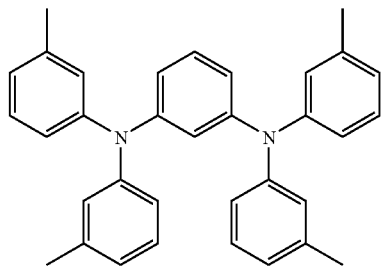 [SMILES: Cc1cccc(N(c2cccc(C)c2)c2cccc(N(c3cccc(C)c3)c3cccc(C)c3)c2)c1]

The above compound was turned out by the present inventors' study to have a low $T_1$ energy level. When it is used with a phosphorescent material, the compound quenches the luminescence of the phosphorescent material, only to achieve low luminescence efficiency and insufficient driving durability.

SUMMARY OF THE INVENTION

An object of an illustrative, non-limiting embodiment of the invention is to provide an organic electroluminescent device having high efficiency, low driving voltage, and high driving durability.

According to an aspect of the invention, there is provided the following electroluminescent devices.

1. An organic electroluminescent device including: a cathode; an anode; and a light-emitting layer between the cathode and the anode, the light-emitting layer including a compound represented by formula (1):

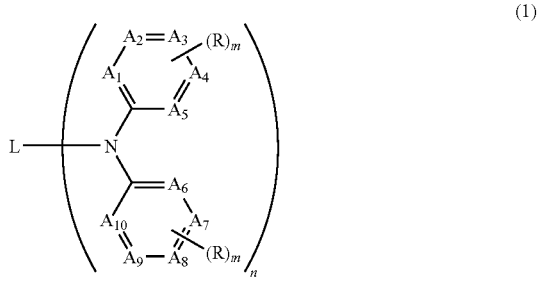

wherein L represents a linking group; $A_1$, $A_2$, $A_3$, $A_4$, $A_5$, $A_6$, $A_7$, $A_8$, $A_9$, and $A_{10}$ each independently represent a carbon atom or a nitrogen atom, provided that at least two of $A_1$, $A_5$, $A_6$, and $A_{10}$ each represent a carbon atom having R'; R' represents a substituent having a carbon atom at a bonding position thereof; a plurality of Rs each independently represent a substituent; m represents an integer; and n represents an integer of 2 to 10.

2. The organic electroluminescent device according to item 1 above, wherein the compound of formula (1) is a compound represented by formula (2):

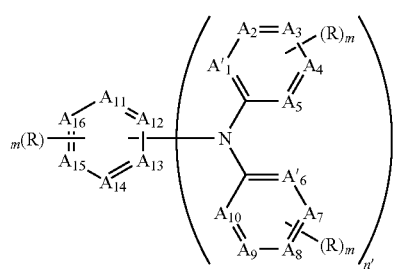

(2)

wherein $A_2$, $A_3$, $A_4$, $A_5$, $A_7$, $A_8$, $A_9$, $A_{10}$, $A_{11}$, $A_{12}$, $A_{13}$, $A_{14}$, $A_{15}$, and $A_{16}$ each independently represent a carbon atom or a nitrogen atom; $A'_1$ and $A'_6$ each represent a carbon atom having R'; R' represents a substituent having a carbon atom at a bonding position thereof; a plurality of Rs each independently represent a substituents; m represents an integer; and n' represents 2 or 3.

3. The organic electroluminescent device according to item 2 above, wherein the compound of formula (2) is a compound represented by formula (3):

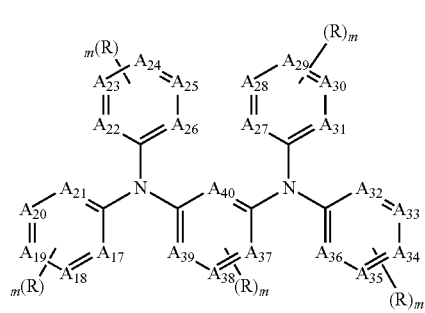

(3)

wherein $A_{18}$, $A_{19}$, $A_{20}$, $A_{21}$, $A_{23}$, $A_{24}$, $A_{25}$, $A_{26}$, $A_{28}$, $A_{29}$, $A_{30}$, $A_{31}$, $A_{33}$, $A_{34}$, $A_{35}$, $A_{36}$, $A_{37}$, $A_{38}$, $A_{39}$, and $A_{40}$ each independently represent a carbon atom or a nitrogen atom; $A_{17}$, $A_{22}$, $A_{27}$, and $A_{32}$ each represent a carbon atom having R''; R'' represents a substituent having an sp$^3$ carbon atom at a bonding position thereof; a plurality of Rs each independently represent a substituents; and m represents an integer.

4. The organic electroluminescent device according to any one of items 1 to 3 above, wherein the compound has an excited triplet level $T_1$ of 2.8 to 3.5 eV in a form of a thin film.

5. The organic electroluminescent device according to any one of items 1 to 4 above, wherein the light emitting layer further includes a phosphorescent material.

6. The organic electroluminescent device according to item 5 above, wherein the phosphorescent material is an iridium complex or a platinum complex.

7. The organic electroluminescent device according to item 6 above, wherein the phosphorescent material is a platinum complex containing a tridentate or higher polydentate ligand.

8. The organic electroluminescent device according to item 6 above, wherein the phosphorescent material is a platinum complex represented by formula (4):

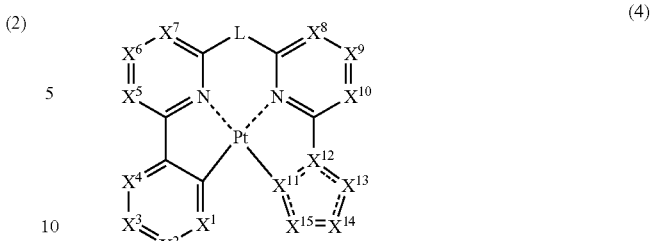

(4)

wherein $X^1$, $X^2$, $X^3$, and $X^4$ each independently represent a carbon atom or a nitrogen atom, provided that at least one of $X^1$, $X^2$, $X^3$, and $X^4$ represents a nitrogen atom; $X^5$, $X^6$, $X^7$, $X^8$, $X^9$, and $X^{10}$ each independently represent a carbon atom or a nitrogen atom; $X^{11}$ and $X^{12}$ each independently represent a carbon atom or a nitrogen atom; $X^{13}$, $X^{14}$, and $X^{15}$, each independently represent a carbon atom, a nitrogen atom, an oxygen atom, or a sulfur atom; a 5-membered ring skeleton formed of $X^{11}$, $X^{12}$, $X^{13}$, $X^{14}$, and $X^{15}$ contains 2 or less nitrogen atoms; and L represents a single bond or a divalent linking group.

9. The organic electroluminescent device according to item 5 above, wherein the phosphorescent material has a maximum luminescence wavelength of 500 nm or shorter.

DETAILED DESCRIPTION OF THE
EXEMPLARY EMBODIMENTS

According to an exemplary embodiment of the invention, an organic electroluminescent device having high efficiency, low driving voltage, and high driving durability can be obtained.

An organic electroluminescent device according to an exemplary embodiment of the invention includes a cathode, an anode, and a light-emitting layer between the cathode and the anode. The light-emitting layer contains a compound represented by formula (1):

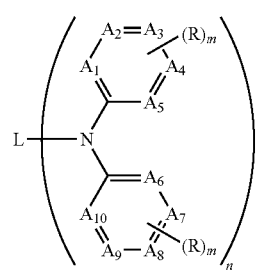

(1)

In formula (1), L represents a linking group; $A_1$, $A_2$, $A_3$, $A_4$, $A_5$, $A_6$, $A_7$, $A_8$, $A_9$, and $A_{10}$ each independently represent a carbon atom or a nitrogen atom, provided that at least two of $A_1$, $A_5$, $A_6$, and $A_{10}$ each represent a carbon atom having R'; R' represents a substituent having a carbon atom at the bonding position thereof; a plurality of Rs each independently represent a substituent; m represents an integer; and n represents an integer of 2 to 10.

The organic electroluminescent device contains at least one light-emitting layer as an organic layer. The organic electroluminescent device may have plural light-emitting layers. As organic layers than the light-emitting layer, a hole injection layer, a hole transport layer, an electron blocking layer, an exciton blocking layer, a hole blocking layer, an electron transport layer, an electron injection layer, and/or a protective layer may be arranged in the organic electroluminescent device. Each layer may serve other functions than described and each layer may include two or more sublayers.

The organic electroluminescent device of the invention may be either of the type utilizing light emission from singlet excitons (fluorescent light emission) or of the type utilizing light emission from triplet excitons (phosphorescent light emission) but is preferably of the latter type in terms of luminescence efficiency.

The light-emitting layer preferably contains at least one luminescent material and at least one host material. As used herein, the term "host material" refers to a material constituting a light-emitting layer other than a luminescent material and performing at least one of a function to disperse and retain the luminescent material therein, a function to accepting holes from an anode or a hole transport layer, etc., a function to accept electrons from a cathode or an electron transport layer, etc., a function to transport holes and/or electrons, a function to provide a site for hole-electron recombination, a function to shift the energy of excitons generated by the recombination to the luminescent material, and a function to transport holes and/or electrons to the luminescent material.

The compound of formula (1) may be present in not only a light-emitting layer but any one of or two or more of other organic layers. The compound of formula (1) is preferably present in a hole injection layer, a hole transport layer, an electron blocking layer, a light-emitting layer, a hole blocking layer, an electron transport layer, and an electron injection layer, more preferably in a light-emitting layer, an electron blocking layer, a hole transport layer, and a hole injection layer, even more preferably in a light-emitting layer. It is the most preferred for the compound of formula (1) be present in a light-emitting layer as a host material. In a case where the compound of formula (1) is used as a host material in a light-emitting layer, the content of the compound of formula (1) in a light-emitting layer is preferably 30% to 99.9%, more preferably 50% to 99%, even more preferably 70% to 100%, by mass. Where the compound of formula (1) is incorporated into a hole injection layer, hole transport layer, electron blocking layer, hole blocking layer, electron transport layer, or electron injection layer, the content of the compound of formula (1) in each layer is preferably 50% to 100%, more preferably 70% to 100%, even more preferably 90% to 100%, by mass.

The compound of formula (1) will be described.

The compound of formula (1) is chemically stable and has high carrier transport properties and a large $T_1$ and is therefore useful in a light-emitting layer.

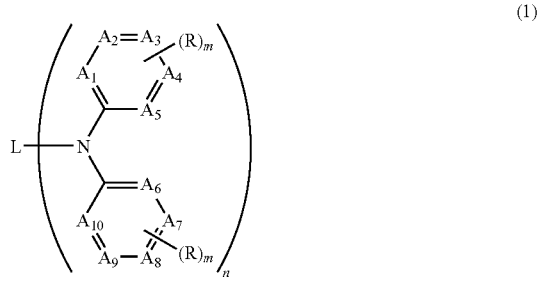

In formula (1), L represents a linking group; $A_1$, $A_2$, $A_3$, $A_4$, $A_5$, $A_6$, $A_7$, $A_8$, $A_9$, and $A_{10}$ each independently represent a carbon atom or a nitrogen atom, provided that at least two of $A_1$, $A_5$, $A_6$, and $A_{10}$ each represent a carbon atom having R';

R' represents a substituent having a carbon atom at a bonding position thereof; a plurality of Rs each independently represent a substituent; m represents an integer; and n represents an integer of 2 to 10.

The compound of formula (1) may have its molecular assembly state in a film, ionization potential energy (Ip), $T_1$ energy, and so on controlled by selection of substituents and linking group L in formula (1). Ip is preferably 5.0 to 7.0 eV, more preferably 5.3 to 6.5 eV, even more preferably 5.5 to 6.2 eV, in terms of chemical stability and hole transport properties, while varying depending on intended uses.

As stated previously, a host material of a light-emitting layer preferably has a sufficiently larger energy gap (higher excited triplet level, i.e., $T_1$ energy, in the case of a phosphorescent device) than a luminescent material. Otherwise, energy transfer from the luminescent material to the host material would occur, causing reductions in efficiency and durability. When the energy gap of the host material is higher than, but with only a small difference from, that of the luminescent material, back energy transfer from the luminescent material to the host material will partially occur, which also causes reductions in efficiency and durability. Accordingly, in using a luminescent material with a larger energy gap, a host material is required to have a still larger energy gap. Because an energy gap descends in the order of phosphorescence, fluorescence and in the order of blue, green, and red, a host material having a largest energy gap ($T_1$) will be required when in using a phosphorescent material having a short wavelength (i.e., blue). $T_1$ energy of the compound of formula (1) is preferably 2.7 to 4.0 eV, more preferably 2.8 to 3.5 eV, even more preferably 2.9 to 3.3 eV, while depending on a luminescent material to be combined with the compound.

In the invention, Ip of a compound is determined by analyzing a thin film formed of the compound by photoelectron spectrometry in an atmosphere using, for example, AC-1 from Riken Keiki Co., Ltd. $T_1$ energy of a compound is obtained from the short wavelength end of the phosphorescence spectrum of a thin film of the compound. For example, a material to be analyzed is deposited on a cleaned quartz glass substrate by vacuum evaporation to a thickness of about 50 nm. The deposit film is analyzed with a spectrophotofluorometer F-7000 from Hitachi High-Technologies Corp. at a liquid nitrogen temperature. The wavelength at the rising edge of the luminescence spectrum (the short wavelength side end) is converted to energy unit to obtain $T_1$ energy.

Substituents in formula (1) include the following group of substituents, designated substituent group A.

Substituent Group A:

An alkyl group preferably having 1 to 30, more preferably 1 to 20, even more preferably 1 to 10, carbon atoms, such as methyl, ethyl, isopropyl, tert-butyl, n-octyl, n-decyl, n-hexadecyl, cyclopropyl, cyclopentyl, or cyclohexyl; an alkenyl group preferably having 2 to 30, more preferably 2 to 20, even more preferably 2 to 10, carbon atoms, such as vinyl, allyl, 2-butenyl, or 3-pentenyl; an alkynyl group preferably having 2 to 30, more preferably 2 to 20, even more preferably 2 to 10, carbon atoms, such as propargyl or 3-pentynyl; an aryl group preferably having 6 to 30, more preferably 6 to 20, even more preferably 6 to 12, carbon atoms, such as phenyl, p-methylphenyl, naphthyl, or anthranyl; an amino group preferably having 0 to 30, more preferably 0 to 20 carbon atoms, even more preferably 0 to 10, carbon atoms, such as amino, methylamino, dimethylamino, diethylamino, dibenzylamino, diphenylamino, or ditolylamino; an alkoxy group preferably having 1 to 30, more preferably 1 to 20, even more preferably 1 to 10, carbon atoms, such as methoxy, ethoxy, butoxy, or 2-ethylhexyloxy; an aryloxy group preferably having 6 to 30, more preferably 6 to 20, even more preferably 6 to 12, carbon atoms, such as phenyloxy, 1-naphthyloxy, or 2-naphthyloxy; a heterocyclic oxy group preferably having 1 to 30, more preferably 1 to 20 carbon atoms, even more preferably 1 to 12, carbon atoms, such as pyridyloxy, pyrazyloxy, pyrimidyloxy, or quinolyloxy; an acyl group preferably having 2 to 30, more preferably 2 to 20, even more preferably 2 to 12, carbon atoms, such as acetyl, benzoyl, formyl, or pivaloyl; an alkoxycarbonyl group preferably having 2 to 30, more preferably 2 to 20, even more preferably 2 to 12, carbon atoms, such as methoxycarbonyl or ethoxycarbonyl; an aryloxycarbonyl group preferably having 7 to 30, more preferably 7 to 20, even more preferably 7 to 12, carbon atoms, such as phenyloxycarbonyl; an acyloxy group preferably having 2 to 30, more preferably 2 to 20, even more preferably 2 to 10, carbon atoms, such as acetoxy or benzoyloxy; an acylamino group preferably having 2 to 30, more preferably 2 to 20, even more preferably 2 to 10, carbon atoms, such as acetylamino or benzoylamino; an alkoxycarbonylamino group preferably having 2 to 30, more preferably 2 to 20, even more preferably 2 to 12, carbon atoms, such as methoxycarbonylamino; an aryloxycarbonylamino group preferably having 7 to 30, more preferably 7 to 20, even more preferably 7 to 12, carbon atoms, such as phenyloxycarbonylamino; a sulfonylamino group preferably having 1 to 30, more preferably 1 to 20, even more preferably 1 to 12, carbon atoms, such as methanesulfonylamino or benzenesulfonylamino; a sulfamoyl group preferably having 0 to 30, more preferably 0 to 20, even more preferably 0 to 12, carbon atoms, such as sulfamoyl, methylsulfamoyl, dimethylsulfamoyl, or phenylsulfamoyl; carbamoyl group preferably having 1 to 30, more preferably 1 to 20, even more preferably 1 to 12, carbon atoms, such as carbamoyl, methylcarbamoyl, diethylcarbamoyl, or phenylcarbamoyl; an alkylthio group preferably having 1 to 30, more preferably 1 to 20, even more preferably 1 to 12, carbon atoms, such as methylthio or ethylthio; an arylthio group preferably having 6 to 30 carbon atoms, more preferably 6 to 20, even more preferably 6 to 12, carbon atoms, such as phenylthio; a heterocyclic thio group preferably having 1 to 30, more preferably 1 to 20, even more preferably 1 to 12, carbon atoms, such as pyridylthio, 2-benzimidazolylthio, 2-benzoxazolylthio, or 2-benzothiazolylthio; a sulfonyl group preferably having 1 to 30, more preferably 1 to 20, even more preferably 1 to 12, carbon atoms, such as mesyl or tosyl; a sulfinyl group preferably having 1 to 30, more preferably 1 to 20, even more preferably 1 to 12, carbon atoms, such as methanesulfinyl or benzenesulfinyl; a ureido group preferably having 1 to 30, more preferably 1 to 20, even more preferably 1 to 12, carbon atoms, such as ureido, methylureido, or phenylureido; an phosphoramide group preferably having 1 to 30, more preferably 1 to 20, even more preferably 1 to 12, carbon atoms, such as diethylphosphoramide or phenylphosphoramide; a hydroxyl group, a mercapto group, a halogen atom (e.g., fluorine, chlorine, bromine, or iodine), a cyano group, a sulfo group, a carboxyl group, a nitro group, a hydroxamic acid group, a sulfino group, a hydrazino group, an imino group; a heterocyclic group, either aromatic or non-aromatic, having preferably 1 to 30, more preferably 1 to 12, carbon atoms, with examples of the hetero atom including nitrogen, oxygen, sulfur, phosphorus, silicon, selenium, and tellurium, such as pyridyl, pyrazinyl, pyrimidyl, pyridazinyl, pyrrolyl, pyrazolyl, triazolyl, imidazolyl, oxazolyl, thiazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, carbazolyl, azepinyl, and silolyl; a silyl group preferably having 3 to 40, more preferably 3 to 30, even more preferably 3 to 24, carbon atoms, such as trimethylsilyl or triphenylsilyl; a silyloxy preferably having 3 to 40, more preferably 3 to 30, even more preferably 3 to 24, carbon atoms, such as trimethylsilyloxy or triphenylsilyloxy; and a phosphoryl group, such as diphenylphosphoryl or dimethylphosphoryl. If possible, the substituents listed as substituent group A may further have a substituent selected from, for example, the substituent group A.

In a case where the substituent described above and hereunder, such as an alkyl group, has a carbon atom-containing substituent, the number of carbon atoms recited includes the number of carbon atoms contained in the carbon atom-containing substituent.

$A_1, A_2, A_3, A_4, A_5, A_6, A_7, A_8, A_9$, and $A_{10}$ each independently represent a carbon atom or a nitrogen atom each optionally having a substituent. The substituent that may be possessed by $A_1$ through $A_{10}$ include the substituent group A.

At least two of $A_1, A_5, A_6$, and $A_{10}$ each represent a carbon atom having R'. R' is a substituent having a carbon atom at the bonding position thereof. Examples of the substituent R' having a carbon atom at the bonding position thereof include those listed as the substituent group A and having a carbon atom at the bonding position thereof. In view of chemical stability, carrier transport properties, and $T_1$ energy of the compound of formula (1), R' is preferably an alkyl group having 1 to 18 carbon atoms, an aryl group having 6 to 18 carbon atoms, a carbamoyl group having 2 to 18 carbon atoms, a cyano group, or a heterocyclic group having 2 to 10 carbon atoms, more preferably an alkyl group having 1 to 18 carbon atoms or an aryl group having 6 to 18 carbon atoms, even more preferably an alkyl group having 1 to 18 carbon atoms.

In view of chemical stability, carrier transport properties, and $T_1$ energy of the compound, R is preferably an alkyl group having 1 to 18 carbon atoms, an aryl group having 6 to 18 carbon atoms, an amino group having 2 to 12 carbon atoms, an alkoxy group having 1 to 18 carbon atoms, an aryloxy group having 6 to 18 carbon atoms, a heterocyclic oxy group having 2 to 10 carbon atoms, an acyl group having 1 to 18 carbon atoms, an acylamino group having 1 to 18 carbon atoms, a sulfonylamino group having 1 to 18 carbon atoms, a sulfamoyl group having 2 to 18 carbon atoms, a carbamoyl group having 2 to 18 carbon atoms, an alkylthio group having 1 to 18 carbon atoms, a heterocyclic thio group having 2 to 10 carbon atoms, a sulfonyl group having 1 to 18 carbon atoms, a halogen atom, a cyano group, a nitro group, a heterocyclic group having 2 to 10 carbon atoms, a silyl group having 3 to 18 carbon atoms, a silyloxy group having 3 to 18 carbon atoms, or a phosphoryl group having 1 to 18 carbon atoms; more preferably an alkyl group having 1 to 18 carbon atoms, an aryl group having 6 to 18 carbon atoms, an amino group having 2 to 12 carbon atoms, a halogen atom, a cyano group, a nitro group, a heterocyclic group having 2 to 10 carbon atoms, a silyl group having 3 to 18 carbon atoms, or a phosphoryl group having 1 to 18 carbon atoms; even more preferably an alkyl group having 1 to 18 carbon atoms, a halogen atom, a cyano group, or a silyl group having 3 to 18 carbon atoms.

R' and R may have a substituent selected from, for example, the substituent group A.

In terms of chemical stability, carrier transport properties, and $T_1$ energy of the compound, L is preferably an alkylene group having 1 to 18 carbon atoms, an arylene group having 6 to 24 carbon atoms, a divalent heterocyclic group having 2 to 10 carbon atoms, or a combination thereof; more preferably an arylene group having 6 to 24 carbon atoms, a divalent heterocyclic group having 2 to 10 carbon atoms, or a combination thereof; even more preferably a 6-membered aromatic cyclic group, a 5-membered aromatic heterocyclic group, a 6-membered aromatic heterocyclic group, or a combination thereof.

In terms of carrier injection and transport properties, n is preferably 2 to 10, more preferably 2 to 6, even more preferably 2 to 4.

m is preferably 0 to 3, more preferably 0 to 2, even more preferably 0 to 1.

While $A_1$ through $A_{10}$ each independently represent a carbon atom or a nitrogen atom, the total number of nitrogen atoms contained as $A_1$ through $A_{10}$ is preferably 0 to 6, more preferably 0 to 4, even more preferably up to 2.

In terms of carrier transport properties and chemical stability, the compound (1) is preferably a compound represented by formula (2):

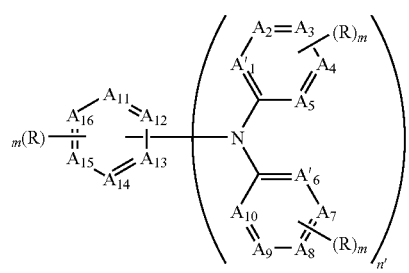

(2)

In formula (2), $A_2$, $A_3$, $A_4$, $A_5$, $A_7$, $A_8$, $A_9$, $A_{10}$, $A_{11}$, $A_{12}$, $A_{13}$, $A_{14}$, $A_{15}$, and $A_{16}$ each independently represent a carbon atom or a nitrogen atom; $A'_1$ and $A'_6$ each represent a carbon atom having R'; R' represents a substituent having a carbon atom at a bonding position thereof; a plurality of Rs each independently represent a substituents; m represents an integer; and n' represents 2 or 3.

Having a substituent R' at the meta position of the 6-membered aromatic rings, the compound represented by formula (2) is preferred as being chemically stable and less likely to crystallize.

The carbon atom or nitrogen atom as represented by $A_2$, $A_3$, $A_4$, $A_5$, $A_7$, $A_8$, $A_9$, $A_{10}$, $A_{11}$, $A_{12}$, $A_{13}$, $A_{14}$, $A_{15}$, and $A_{16}$ may have a substituent. Examples of the substituent that may be possessed by the carbon or nitrogen atom as $A_2$, $A_3$, $A_4$, $A_5$, $A_7$, $A_8$, $A_9$, $A_{10}$, $A_{11}$, $A_{12}$, $A_{13}$, $A_{14}$, $A_{15}$, and $A_{16}$ include the substituent group A.

Preferred examples of R' and R in formula (2) are the same as those described with respect to formula (1). n' is preferably 2.

m is preferably 0 to 3, more preferably 0 to 2, even more preferably 0 to 1.

In formula (2), the n' arylamine moieties may be bonded to the 6-membered aromatic cyclic linking group at o-, m-, and p-positions. When they are in a p- or m-position relative to each other, the molecular strain is smaller to provide higher chemical stability. When they are in an o- or m-position relative to each other, the molecule is less symmetric and therefore less likely to crystallize. Accordingly, the n' arylamine moieties are preferably bonded to the 6-membered aromatic cyclic linking group at m-position relative to each other.

In terms of carrier transport properties and chemical stability, the compound of formula (2) is preferably a compound represented by formula (3):

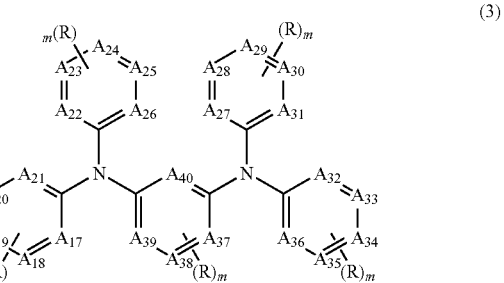

(3)

In formula (3), $A_{18}$, $A_{19}$, $A_{20}$, $A_{21}$, $A_{23}$, $A_{24}$, $A_{25}$, $A_{26}$, $A_{28}$, $A_{29}$, $A_{30}$, $A_{31}$, $A_{33}$, $A_{34}$, $A_{35}$, $A_{36}$, $A_{37}$, $A_{38}$, $A_{39}$, and $A_{40}$ each independently represent a carbon atom or a nitrogen atom; $A_{17}$, $A_{22}$, $A_{27}$, and $A_{32}$ each represent a carbon atom having R"; R" represents a substituent having an sp$^3$ carbon atom at a bonding position thereof; a plurality of Rs each independently represent a substituents; and m represents an integer.

$A_{18}$, $A_{19}$, $A_{20}$, $A_{21}$, $A_{23}$, $A_{24}$, $A_{25}$, $A_{26}$, $A_{28}$, $A_{29}$, $A_{30}$, $A_{31}$, $A_{33}$, $A_{34}$, $A_{35}$, $A_{36}$, $A_{37}$, $A_{38}$, $A_{39}$, and $A_{40}$ each independently represent a carbon atom or a nitrogen atom, and $A_{17}$, $A_{22}$, $A_{27}$, and $A_{32}$ each represent a carbon atom having R". The carbon atom or nitrogen atom represented by $A_{17}$ to $A_{40}$ each independently may include a substituent, and examples of the substituent includes the substituent group A.

In terms of chemical stability, carrier transport properties, and $T_1$ energy of the compound, the number of nitrogen atoms contained in $A_{18}$ to $A_{21}$, $A_{23}$ to $A_{26}$, $A_{28}$ to $A_{31}$, and $A_{33}$ to $A_{40}$ is preferably 0 to 10, more preferably 0 to 5, even more preferably 0 to 2.

In terms of chemical stability, carrier transport properties, and $T_1$ energy, R in formula (3) is preferably an alkyl group having 1 to 18 carbon atoms, an aryl group having 6 to 18 carbon atoms, an amino group having 2 to 12 carbon atoms, an alkoxy group having 1 to 18 carbon atoms, an aryloxy group having 6 to 18 carbon atoms, a heterocyclic oxy group having 2 to 10 carbon atoms, an acyl group having 1 to 18 carbon atoms, an acylamino group having 1 to 18 carbon atoms, a sulfonylamino group having 1 to 18 carbon atoms, a sulfamoyl group having 2 to 18 carbon atoms, a carbamoyl group having 2 to 18 carbon atoms, an alkylthio group having 1 to 18 carbon atoms, a heterocyclic thio group having 2 to 10 carbon atoms, a sulfonyl group having 1 to 18 carbon atoms, a halogen atom, a cyano group, a nitro group, a heterocyclic group having 2 to 10 carbon atoms, a silyl group having 3 to 18 carbon atoms, a silyloxy group having 3 to 18 carbon atoms, or a phosphoryl group having 1 to 18 carbon atoms; more preferably an alkyl group having 1 to 18 carbon atoms, an aryl group having 6 to 18 carbon atoms, an amino group having 2 to 12 carbon atoms, a halogen atom, a cyano group, a nitro group, a heterocyclic group having 2 to 10 carbon atoms, a silyl group having 3 to 18 carbon atoms, or a phosphoryl group having 1 to 18 carbon atoms; even more preferably an alkyl group having 1 to 18 carbon atoms, a halogen atom, a cyano group, or a silyl group having 3 to 18 carbon atoms.

The substituent R" having an sp$^3$ carbon atom at the bonding position thereof is preferably an alkyl group having 1 to 18 carbon atoms, more preferably an alkyl group having 1 to 6 carbon atoms, even more preferably methyl, trifluoromethyl, ethyl, n-propyl, isopropyl, n-butyl, or t-butyl.

Examples of the substituent that may be possessed by R or R" include the substituent group A.

m is preferably 0 to 3, more preferably 0 to 2, even more preferably 0 or 1.

T₁ energy generally decreases as a pi-conjugated system is extended in the molecule, and T₁ energy of a molecule is decided by a partial structure where T₁ energy level is the lowest in the molecule. Therefore, T₁ energy of a molecule having even one moiety with an extended pi conjugated system is decided by that moiety. Therefore, it is generally unfavorable from the viewpoint of T₁ that the compound contains a biaryl structure or a fused aromatic ring structure in its molecule. Nevertheless, the compound may have a biaryl structure when the two benzene ring planes are in a twisted relationship as a result of, for example, steric hindrance because the T₁ energy is kept on a relatively high level.

The compound of formula (1), (2), or (3) preferably has a molecular weight of 350 to 1200, more preferably 400 to 1000, even more preferably 450 to 800. With the molecular weight falling within that range, the compound in film form exhibits good stability, and a high degree of purification is attained easily in view of solvent solubility and sublimation temperature. The compound preferably has a glass transition temperature (Tg), which provides a measure of stability in film form, of 60° to 450° C., more preferably 100° to 450° C., even more preferably 130° to 450° C.

Tg is determined by thermal analysis, such as differential scanning calorimetry (DSC) or differential thermal analysis (DTA), X-ray diffractometry (XRD), polarizing microscopic observation, and the like. The compound of formula (1), (2), or (3) preferably has as high purity as possible because a poorly purified compound would act as a trap in electron transport. The purity is determined by, for example, high performance liquid chromatography (HPLC). The purity as expressed in peak area ratio detected by measuring absorption intensity at 254 nm is preferably 95.0% or more, more preferably 97.0% or more, even more preferably 99.0% or more, most preferably 99.9% or more.

Specific but non-limiting examples of the compound of formula (1) are shown below.

1

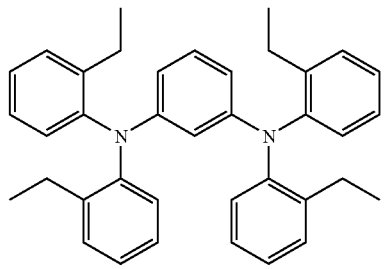

2

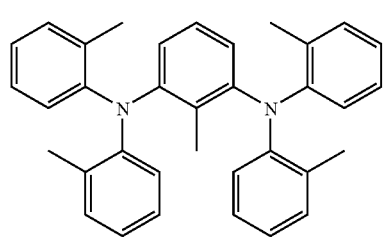

3

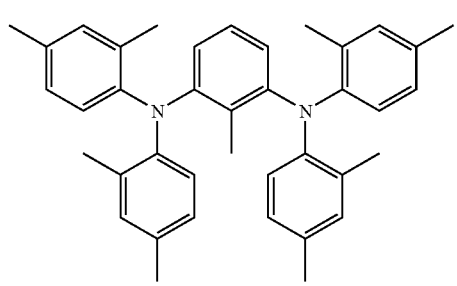

4

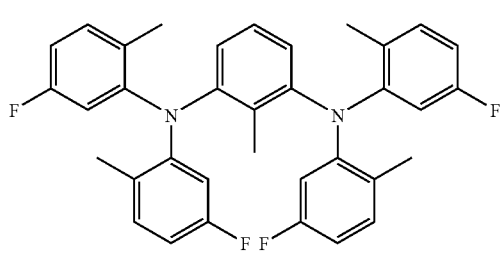

5

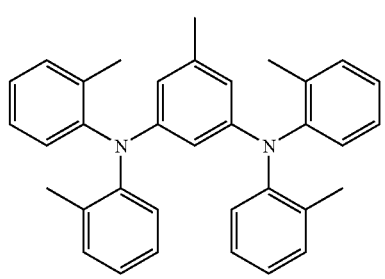

6

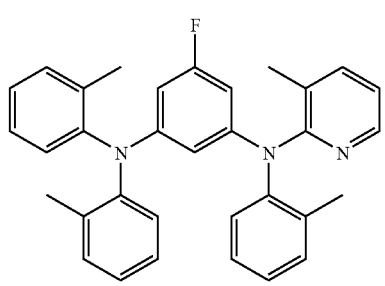

7

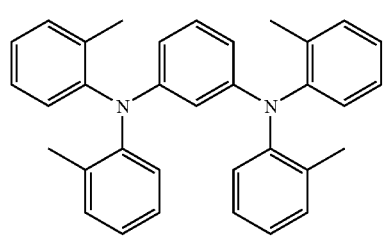

8

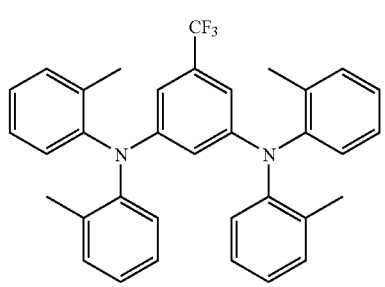

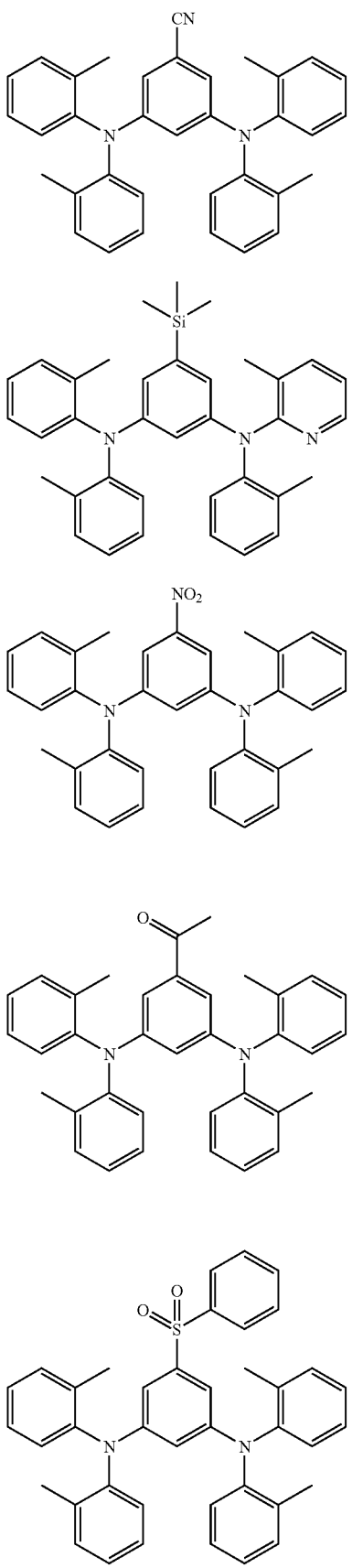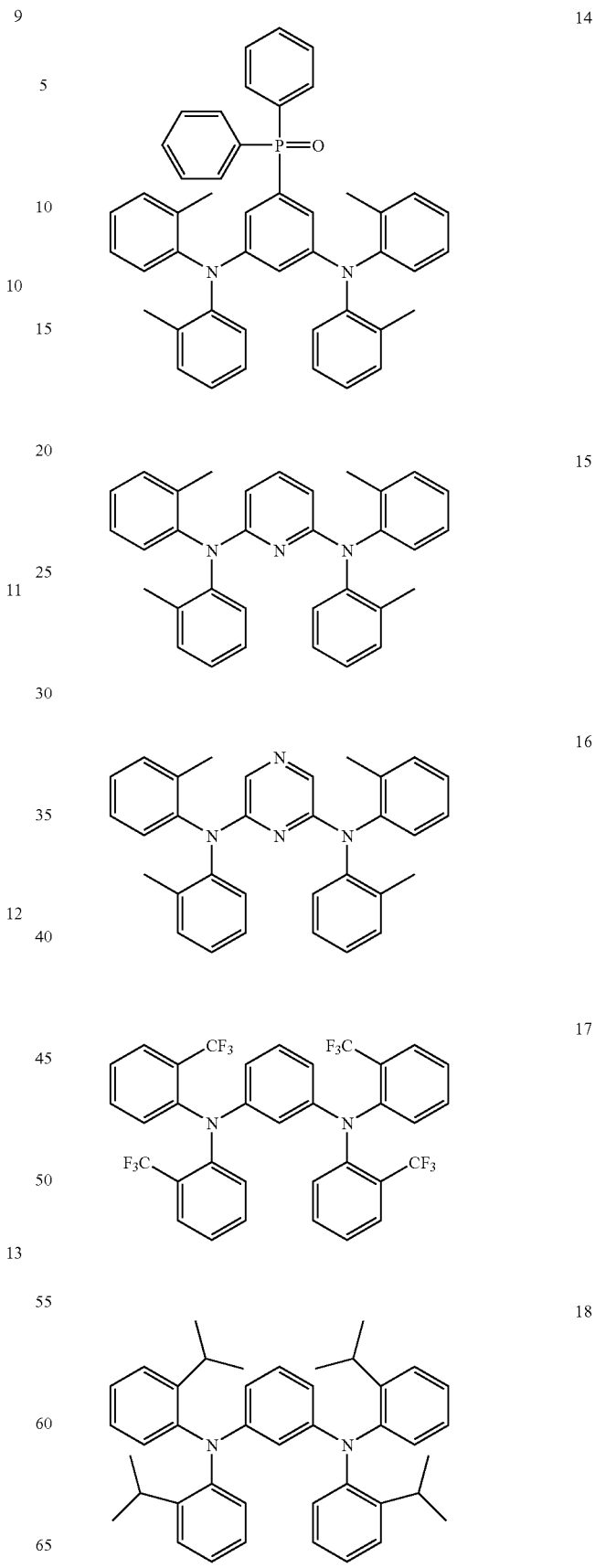

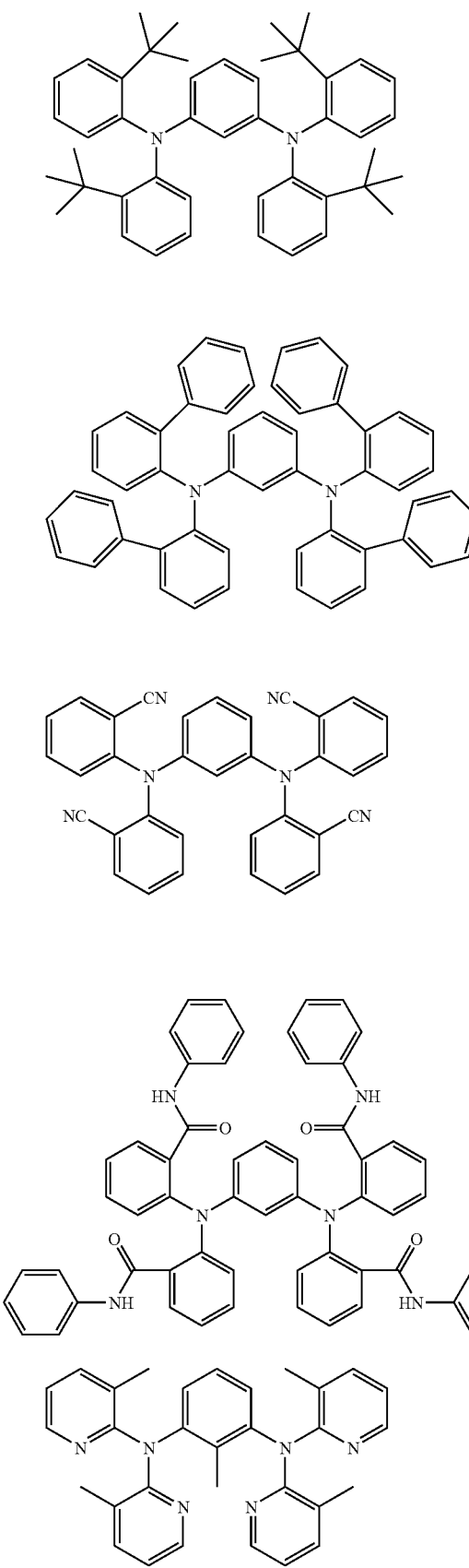

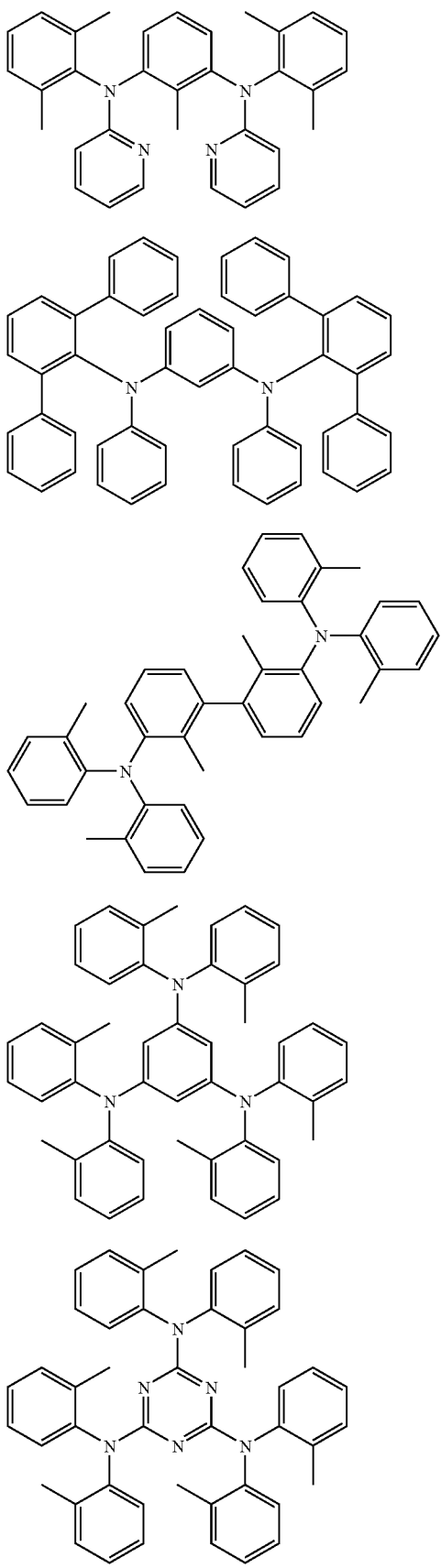

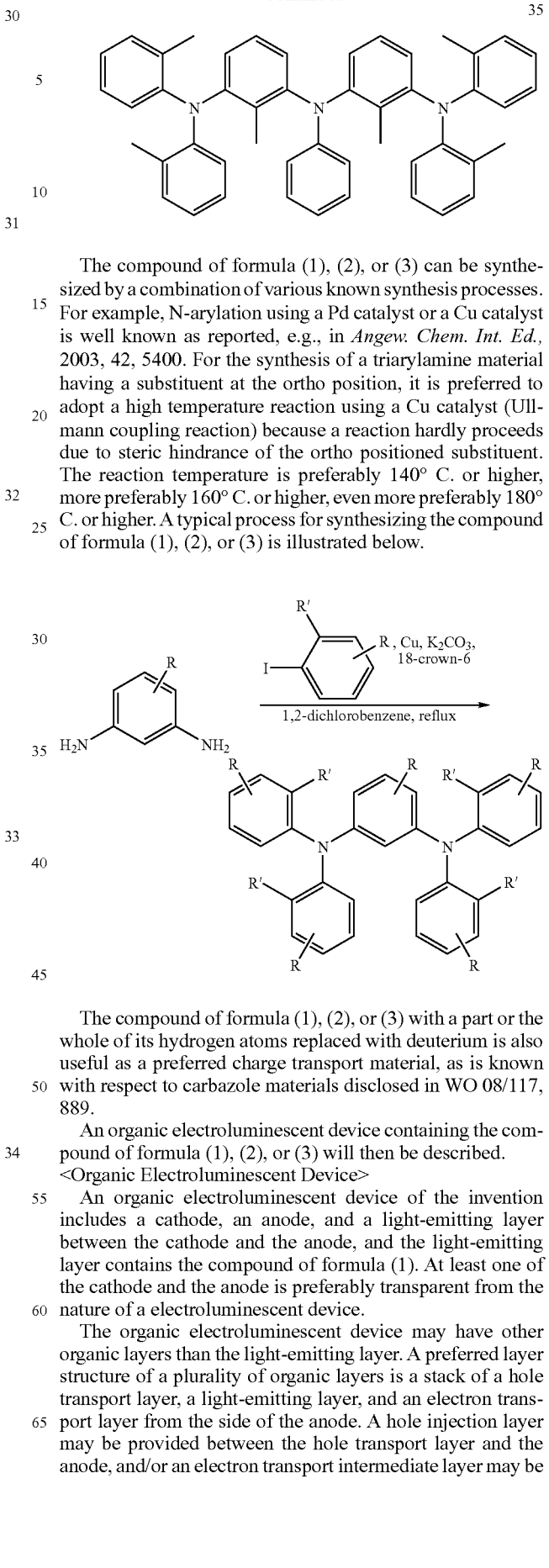

The compound of formula (1), (2), or (3) can be synthesized by a combination of various known synthesis processes. For example, N-arylation using a Pd catalyst or a Cu catalyst is well known as reported, e.g., in *Angew. Chem. Int. Ed.*, 2003, 42, 5400. For the synthesis of a triarylamine material having a substituent at the ortho position, it is preferred to adopt a high temperature reaction using a Cu catalyst (Ullmann coupling reaction) because a reaction hardly proceeds due to steric hindrance of the ortho positioned substituent. The reaction temperature is preferably 140° C. or higher, more preferably 160° C. or higher, even more preferably 180° C. or higher. A typical process for synthesizing the compound of formula (1), (2), or (3) is illustrated below.

The compound of formula (1), (2), or (3) with a part or the whole of its hydrogen atoms replaced with deuterium is also useful as a preferred charge transport material, as is known with respect to carbazole materials disclosed in WO 08/117,889.

An organic electroluminescent device containing the compound of formula (1), (2), or (3) will then be described.

<Organic Electroluminescent Device>

An organic electroluminescent device of the invention includes a cathode, an anode, and a light-emitting layer between the cathode and the anode, and the light-emitting layer contains the compound of formula (1). At least one of the cathode and the anode is preferably transparent from the nature of a electroluminescent device.

The organic electroluminescent device may have other organic layers than the light-emitting layer. A preferred layer structure of a plurality of organic layers is a stack of a hole transport layer, a light-emitting layer, and an electron transport layer from the side of the anode. A hole injection layer may be provided between the hole transport layer and the anode, and/or an electron transport intermediate layer may be provided between the light-emitting layer and the electron transport layer. A hole transport intermediate layer may be provided between the light-emitting layer and the hole transport layer. Likewise, an electron injection layer may be provided between the cathode and the electron transport layer. Each of these organic layers may include two or more sublayers.

Each organic layer is formed conveniently by dry film formation, such as vapor deposition and sputtering, transfer, printing, wet coating, inkjet printing, spraying, and so forth.

Each element in the electroluminescent device will be described.

(Substrate)

The above layer structure may be stacked above a substrate.

The substrate that may be used in the invention preferably does not scatter nor attenuate the light emitted from the organic layer.

(Anode)

The anode usually serves as an electrode supplying positive holes to the organic layer. The shape, structure, and size of the anode are not limited and are chosen from known electrode materials as appropriate to the use of the electroluminescent device. The anode is usually formed as a transparent electrode.

(Cathode)

The cathode usually functions to supply electrons to the organic layer. The shape, structure, size, etc. of the cathode are not particularly limited and selected from among known electrode materials as appropriate to the use of the device.

(Organic Layers)

The organic electroluminescent device of the invention has at least one organic layer including a light-emitting layer. As previously stated, examples of the organic layers other than the light-emitting layer include a hole transport layer, an electron transport layer, a charge blocking layer, a hole injection layer, and an electron injection layer.

The light-emitting layer functions to accept holes from the anode, hole injection layer, or hole transport layer and electrons from the cathode, electron injection layer, or electron transport layer and allow the holes and electrons to recombine to emit light.

The details of the substrate, anode, cathode, organic layer(s), and light-emitting layer are described, e.g., in JP 2008-270736A and JP 2007-266458A, which are herein incorporated by reference.

<Luminescent Material>

The luminescent material that can be used in the invention may be either a phosphorescent material or a fluorescent material.

The light-emitting layer may contain two or more luminescent materials so as to improve color purity or to broaden the luminescent wavelength region. At least one of the luminescent materials is preferably a phosphorescent material.

It is preferred in terms of driving durability that the luminescent material is related to the above described host material by the relationship: 1.2 eV>ΔIp>0.2 eV and/or the relationship: 1.2 eV>ΔEa>0.2 eV, wherein ΔIp is the difference of Ip between the host material and the luminescent material, and ΔEa is the difference in electron affinity (Ea) between the host material and the luminescent material.

It is preferred that the luminescent material contains a platinum complex or an iridium complex.

The details of fluorescent materials and phosphorescent materials are described, e.g., in JP-2008-270736A and JP-2007-266458A, which are herein incorporated by reference.

The platinum complex is preferably represented by formula (4):

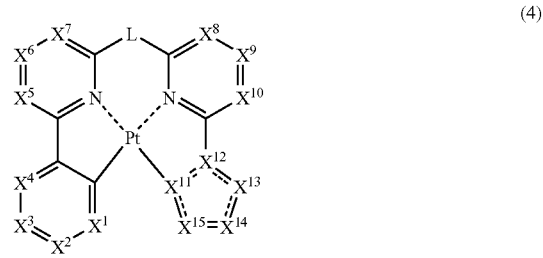

In formula (4), $X^1$, $X^2$, $X^3$, and $X^4$ each independently represent a carbon atom or a nitrogen atom, provided that at least one of them is a nitrogen atom; $X^5$, $X^6$, $X^7$, $X^8$, $X^9$, and $X^{10}$ each independently represent a carbon atom or a nitrogen atom; $X^{11}$ and $X^{12}$ each independently represent a carbon atom or a nitrogen atom; $X^{13}$, $X^{14}$, and $X^{15}$ each independently represent a carbon atom, a nitrogen atom, an oxygen atom, or a sulfur atom; the number of nitrogen atoms contained in the 5-membered ring skeleton including $X^{11}$, $X^{12}$, $X^{13}$, $X^{14}$, and $X^{15}$ is 2 or less nitrogen atoms; and represents a single bond or a divalent linking group.

$X^1$, $X^2$, $X^3$, and $X^4$ each independently represent a carbon atom or a nitrogen atom. If possible, $X^1$, $X^2$, $X^3$, and $X^4$ may independently optionally have a substituent selected from, for example, the substituent group A. Preferred substituents are an alkyl group, a perfluoroalkyl group, an aryl group, an aromatic heterocyclic group, a dialkylamino group, a diarylamino group, an alkoxy group, a cyano group, and a halogen atom; more preferably an alkyl group, a perfluoroalkyl group, an aryl group, a dialkylamino group, a cyano group, and a fluorine atom; even more preferably an alkyl group, a trifluoromethyl group, and a fluorine atom. If possible, the substituents may be connected to each other to form a fused ring.

While at least one of $X^1$, $X^2$, $X^3$, and $X^4$ is a nitrogen atom, the number of nitrogen atoms contained in the ring skeleton formed of them is preferably 1 or 2, more preferably 1. The position of the nitrogen atom is preferably, but not limited to, $X^2$ and/or $X^3$, more preferably $X^3$.

In formula (4), examples of the 6-membered ring including $X^1$, $X^2$, $X^3$, and $X^4$ together with the two carbon atoms include pyridine, pyrazine, pyrimidine, pyridazine, and triazine, preferably pyridine, pyrazine, pyrimidine, and pyridazine, more preferably pyridine. Compared with a benzene ring, a pyridine, pyrazine, pyrimidine, or pyridazine ring (particularly a pyridine ring) is desirable because the hydrogen atom at the position where to bond a metal atom to form a metal-carbon bond exhibits higher acidity, which favors to the formation of a metal complex.

$X^5$, $X^6$, $X^7$, $X^8$, $X^9$, and $X^{10}$ each independently represent a carbon atom or a nitrogen atom. Preferably, $X^5$, $X^6$, $X^7$, $X^8$, $X^9$, and $X^{10}$ each represent a carbon atom. If possible, $X^5$, $X^6$, $X^7$, $X^8$, $X^9$, and $X^{10}$ may independently optionally have a substituent selected from, for example, the substituent group A. Preferred substituents are an alkyl group, a perfluoroalkyl group, an aryl group, an aromatic heterocyclic group, a dialkylamino group, a diarylamino group, an alkoxy group, a cyano group, and a halogen atom; more preferably an alkyl group, a perfluoroalkyl group, an aryl group, a dialkylamino group, a cyano group, and a fluorine atom; even more preferably an alkyl group, a dialkylamino group, a trifluoromethyl group, and a fluorine atom. If possible, the substituents may be connected to each other to form a fused ring.

$X^{11}$ and $X^{12}$ each independently represent a carbon atom or a nitrogen atom. It is preferred that either one of $X^{11}$ and $X^{12}$ is a carbon atom with the other being a nitrogen atom.

$X^{13}$, $X^{14}$, and $X^{15}$ each independently represent a carbon atom, a nitrogen atom, an oxygen atom, or a sulfur atom, preferably a carbon atom or a nitrogen atom.

The number of nitrogen atoms contained in the 5-membered ring skeleton composed of $X^{11}$, $X^{12}$, $X^{13}$, $X^{14}$, and $X^{15}$ is 2 or less (0, 1, or 2), preferably 1 or 2, more preferably 2. If possible, $X^{11}$, $X^{12}$, $X^{13}$, $X^{14}$, and $X^{15}$ may independently optionally have a substituent selected from, for example, the substituent group A. Preferred substituents are an alkyl group, a perfluoroalkyl group, an aryl group, an aromatic heterocyclic group, a dialkylamino group, a diarylamino group, an alkoxy group, a cyano group, and a halogen atom; more preferably an alkyl group, a perfluoroalkyl group, an aryl group, a dialkylamino group, a cyano group, and a fluorine atom; even more preferably an alkyl group, a cyano group, a trifluoromethyl group, and a fluorine atom. If possible, the substituents may be connected to each other to form a fused ring.

The bonds between adjacent two of $X^{11}$, $X^{12}$, $X^{13}$, $X^{14}$, and $X^{15}$ may be any combination of a single bond and a double bond. Examples of the 5-membered ring composed of $X^{11}$, $X^{12}$, $X^{13}$, $X^{14}$, and $X^{15}$ include pyrrole, pyrazole, imidazole, furan, and thiophene; more preferably pyrrole, pyrazole, and imidazole; even more preferably pyrrole and pyrazole. The metal complex in which the 5-membered ring composed of $X^{11}$, $X^{12}$, $X^{13}$, $X^{14}$, and $X^{15}$ is a pyrrole, pyrazole, or imidazole ring (particularly a pyrrole or pyrazole ring) exhibits improved stability.

L represents a single bond or a divalent linking group. Examples of the divalent linking group as represented by L include an alkylene group (e.g., methylene, ethylene, or propylene), an arylene group (e.g., phenylene or naphthalene-diyl), a heteroarylene group (e.g., pyridinediyl or thiophene-diyl), an imido group —NR— (e.g., phenylimino), an oxy group —O—, a thio group —S—, a phosphinylidene group —PR— (e.g., phenylphosphinylidene), a silylene group —SiRR'— (e.g., dimethylsilylene or diphenylsilylene), and a combination thereof. The linking group may optionally have a substituent selected from, for example, the substituent group A.

L is preferably a single bond, an alkylene group, an arylene group, a heteroarylene group, an imino group, an oxy group, a thio group, or a silylene group; more preferably a single bond, an alkylene group, an arylene group, or an imino group; even more preferably a single bond, an alkylene group, or an arylene group; still more preferably a single bond, a methylene group, or a phenylene group, particularly preferably a single bond or a di-substituted methylene group; still more preferably a single bond, a dimethylmethylene group, a diethylmethylene group, diisobutylmethylene group, a dibenzylmethylene group, an ethylmethylmethylene group, a methylpropylmethylene group, an isobutylmethylmethylene group, a diphenylmethylene group, a methylphenylmethylene group, a cyclohexanediyl group, a cyclopentanediyl group, a fluorenediyl group, or a fluoromethylmethylene group; still more preferably a single bond, a dimethylmethylene group, a diphenylmethylene group, or a cyclohexanediyl group; and most preferably a dimethylmethylene group or a diphenylmethylene group.

Typical, but non-limiting, examples of the divalent linking group are shown below.

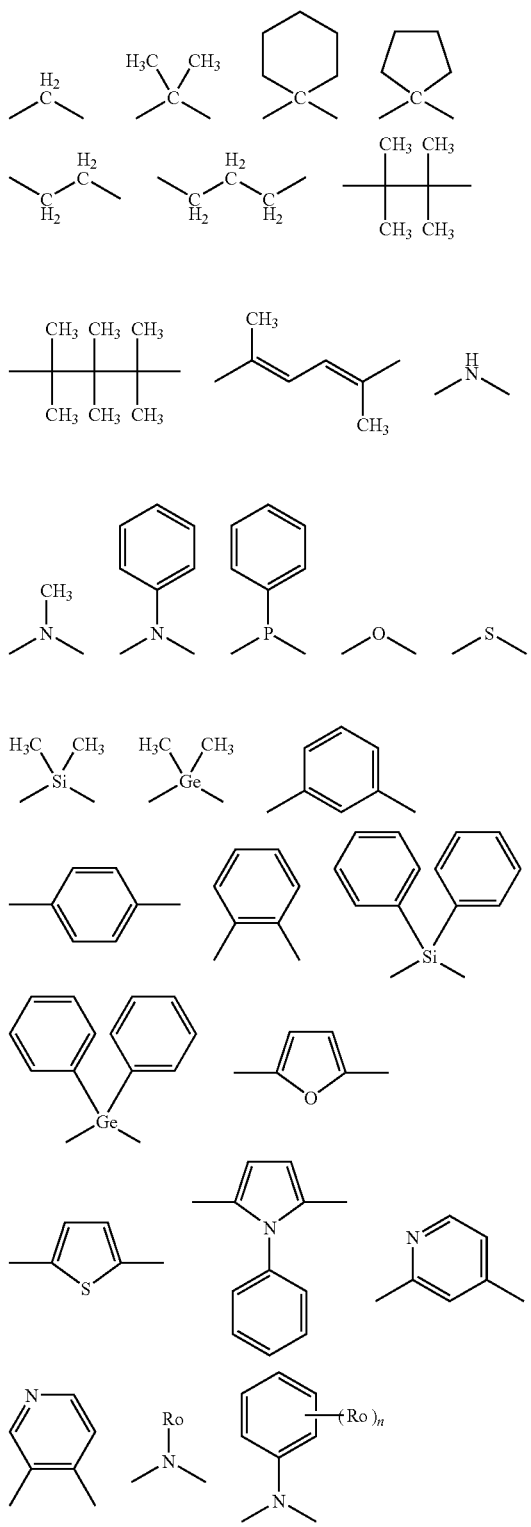

$R_0$ represents a substituent selected from the substituent group A, preferably an alkyl group, more preferably an alkyl group having 1 to 6 carbon atoms; and m represents an integer of 1 to 5, preferably 2 to 5, even more preferably 2 or 3.

The platinum complex of formula (4) is preferably represented by formula (5):

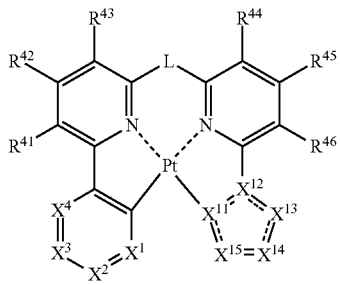

(5)

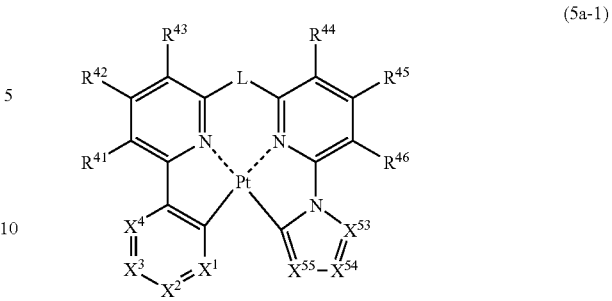

(5a-1)

In formula (5), $X^1$, $X^2$, $X^3$, and $X^4$ each independently represent a carbon atom or a nitrogen atom, provided that at least one of $X^1$, $X^2$, $X^3$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{11}$ and $X^{12}$ each independently represent a carbon atom or a nitrogen atom; $X^{13}$, $X^{14}$, and $X^{15}$ each independently represent a carbon atom, a nitrogen atom, an oxygen atom, or a sulfur atom; the number of nitrogen atoms contained in the 5-membered ring skeleton including $X^{11}$, $X^{12}$, $X^{13}$, $X^{14}$, and $X^{15}$ is 2 or less nitrogen atoms; and L represents a single bond or a divalent linking group.

Preferred ranges of $X^1$, $X^2$, $X^3$, $X^4$, $X^{11}$, $X^{12}$, $X^{13}$, $X^{14}$, $X^{15}$ and L in formula (5) are the same as those for $X^1$, $X^2$, $X^3$, $X^4$, $X^{11}$, $X^{12}$, $X^{13}$, $X^{14}$, $X^{15}$ and L in formula (4).

In formula (5), $R^{41}$, $R^{42}$, $R^{43}$, $R^{44}$, $R^{45}$, and $R^{46}$ each independently represent a hydrogen atom or a substituent. The substituent represented by $R^{41}$, $R^{42}$, $R^{43}$, $R^{44}$, $R^{45}$, or $R^{46}$ is selected from the substituent group A. If possible, $R^{41}$, $R^{42}$, $R^{43}$, $R^{44}$, $R^{45}$, and $R^{46}$ may be connected to each other to form a ring.

$R^{41}$ and $R^{46}$ are each preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, a halogen atom, a cyano group, or a heterocyclic group; even more preferably a hydrogen atom, a methyl group, a t-butyl group, a trifluoromethyl group, a phenyl group, a fluorine atom, a cyano group, or a pyridyl group; still more preferably a hydrogen atom, a methyl group, or a fluorine atom; and most preferably a hydrogen atom.

The preferred ranges of $R^{43}$ and $R^{44}$ are the same as those recited for $R^{41}$ and $R^{46}$.

$R^{42}$ and $R^{45}$ are each preferably a hydrogen atom, an alkyl group, an aryl group, an amino group, an alkoxy group, an aryloxy group, an alkylthio group, an arylthio group, a halogen atom, a cyano group, or a heterocyclic group; more preferably a hydrogen atom, an alkyl group, an aryl group, an amino group, an alkoxy group, an aryloxy group, a halogen atom, or a heterocyclic group; even more preferably a hydrogen atom, an alkyl group, an amino group, an alkoxy group, a halogen atom, or a heterocyclic group; still more preferably a hydrogen atom, a methyl group, a t-butyl group, a dialkylamino group, a diphenylamino group, a methoxy group, a phenoxy group, a fluorine atom, an imidazolyl group, a pyrrolyl group, or a carbazolyl group; particularly preferably a hydrogen atom, a fluorine atom, or a methyl group; and most preferably a hydrogen atom.

A preferred embodiment of the platinum complex of formula (5) is represented by formula (5a-1):

In formula (5a-1), $X^1$, $X^2$, $X^3$, and $X^4$ each independently represent a carbon atom or a nitrogen atom, provided that at least one of $X^1$, $X^2$, $X^3$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{53}$, $X^{54}$, and $X^{55}$ each independently represent a carbon atom or a nitrogen atom; and the number of nitrogen atoms contained in the 5-membered ring skeleton including $X^{53}$, $X^{54}$, and $X^{55}$ is 1 or 2; and L represents a single bond or a divalent linking group.

The preferred ranges of $X^1$, $X^2$, $X^3$, $X^4$, $R^{41}$, $R^{42}$, $R^{43}$, $R^{44}$, $R^{45}$, $R^{46}$, and L in formula (5a-1) are the same as those in formula (5).

$X^{53}$, $X^{54}$, and $X^{55}$ each independently represent a carbon atom or a nitrogen atom. If possible, $X^{53}$, $X^{54}$, and $X^{55}$ may independently optionally have a substituent selected from, for example, the substituent group A. Preferred substituents are an alkyl group, a perfluoroalkyl group, an aryl group, an aromatic heterocyclic group, a dialkylamino group, a diarylamino group, an alkoxy group, a cyano group, and a halogen atom; more preferably an alkyl group, a perfluoroalkyl group, an aryl group, a dialkylamino group, a cyano group, and a fluorine atom; even more preferably an alkyl group, a trifluoromethyl group, and a fluorine atom. If possible, the substituents may be connected to each other to form a fused ring.

In formula (5a-1), the number of nitrogen atoms contained in the 5-membered ring skeleton including $X^{53}$, $X^{54}$, and $X^{55}$ is 1 or 2, preferably 2.

Examples of the 5-membered ring including $X^{53}$, $X^{54}$, and $X^{55}$ together with the carbon atom and the nitrogen atom include pyrrole, pyrazole, and imidazole rings, more preferably pyrrole, pyrazole, and imidazole ring, even more preferably pyrrole and pyrazole rings; and most preferably a pyrazole ring.

The platinum complex of formula (5a-1) is preferably represented by formula (5a-2):

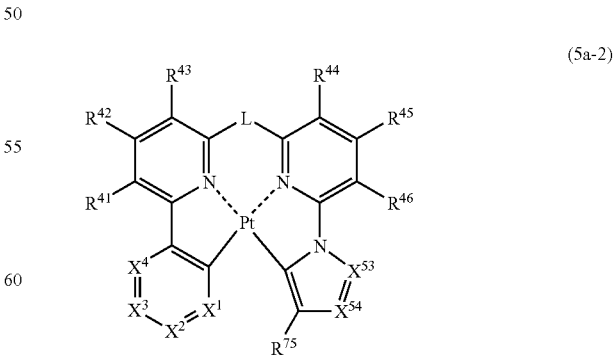

(5a-2)

In formula (5a-2), $X^1$, $X^2$, $X^3$, and $X^4$ each independently represent a carbon atom or a nitrogen atom, provided that at least one of $X^1$, $X^2$, $X^3$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{54}$ and $X^{55}$ each independently represent a carbon atom or a nitrogen atom; and the number of nitrogen atoms contained in the 5-membered ring skeleton including $X^{54}$ and $X^{55}$ is 1 or 2; $R^{75}$ represents a hydrogen atom or a substituents; and L represents a single bond or a divalent linking group.

The preferred ranges of $X^1$, $X^2$, $X^3$, $X^4$, $R^{41}$, $R^{42}$, $R^{43}$, $R^{44}$, $R^{45}$, $R^{46}$, $R^{53}$, $R^{54}$, and L in formula (5a-2) are the same as those recited with respect to formula (5a-1).

$R^{75}$ represents a hydrogen atom or a substituent. The substituent is selected from, for example, the substituent group A. $R^{75}$ is preferably a hydrogen atom, an alkyl group, a perfluoroalkyl group, an aryl group, an aromatic heterocyclic group, a dialkylamino group, a diarylamino group, an alkoxy group, a cyano group, or a halogen atom; more preferably a hydrogen atom, an alkyl group, a perfluoroalkyl group, an aryl group, a dialkylamino group, a cyano group, or a fluorine atom; even more preferably a hydrogen atom, an alkyl group, a trifluoromethyl group, a cyano group, or a fluorine atom; and most preferably a cyano group, a fluorine atom, or a hydrogen atom. If possible, the substituent may be connected to the substituent of $X^{54}$ or $X^{53}$ to form a fused ring.

The platinum complex of formula (5a-2) is preferably represented by formula (5a-3):

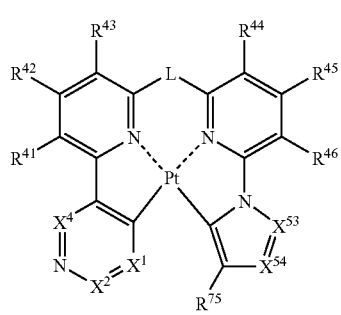

(5a-3)

In formula (5a-3), $X^1$, $X^2$, $X^3$, and $X^4$ each independently represent a carbon atom or a nitrogen atom; $R^{41}$, $R^{42}$, $R^{43}$, $R^{44}$, $R^{45}$, and $R^{46}$ each independently represent a hydrogen atom or a substituents; $X^{54}$ and $X^{55}$ each independently represent a carbon atom or a nitrogen atom; and the number of nitrogen atoms contained in the 5-membered ring skeleton including $X^{54}$ and $X^{55}$ is 1 or 2; $R^{75}$ represents a hydrogen atom or a substituents; and L represents a single bond or a divalent linking group.

The preferred ranges of $X^1$, $X^2$, $X^4$, $R^{41}$, $R^{42}$, $R^{43}$, $R^{44}$, $R^{45}$, $R^{46}$, $R^{53}$, $R^{54}$, $R^{75}$, and L in formula (5a-3) are the same as those in formula (5a-2).

The number of nitrogen atoms contained in the 6-membered ring skeleton including) $X^1$, $X^2$, $X^4$, the nitrogen atom, and the two carbon atoms in formula (5a-3) is 1 to 3, preferably 1 or 2, even more preferably 1. The 6-membered ring is preferably pyridine, pyrazine, pyrimidine, pyridazine, or triazine; more preferably pyridine, pyrazine, pyrimidine, or pyridazine; even more preferably pyridine, pyrazine, or pyrimidine; and most preferably pyridine.

The platinum complex of formula (5a-3) is preferably represented by formula (5a-4) shown below. The platinum complex of formula (5a-4) is a novel compound.

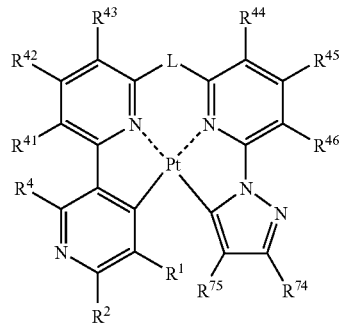

(5a-4)

In formula (5a-4), $R^1$, $R^2$, $R^4$, $R^{41}$, $R^{42}$, $R^{43}$, $R^{44}$, $R^{45}$, $R^{46}$, $R^{74}$, and $R^{75}$ each independently represent a hydrogen atom or a substituents; and L represents a single bond or a divalent linking group.

The preferred ranges of $R^{41}$, $R^{42}$, $R^{43}$, $R^{44}$, $R^{45}$, $R^{46}$, $R^{75}$, and L in formula (5a-4) are the same as those in formula (5a-3).

$R^1$, $R^2$, $R^4$, and $R^{74}$ each independently represent a hydrogen atom or a substituent. The substituent is selected from, for example, the substituent group A. If possible, $R^4$ and $R^{41}$ may be taken together, and $R^1$ and $R^2$ may be taken together, each to form a fused ring. If possible, the substituents of $R^1$ and $R^{75}$ may be taken together, in which case the total ligands form a cyclic structure.

$R^1$ is preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, an alkoxy group, an aryloxy group, an alkylthio group, a halogen atom, or a cyano group; even more preferably a hydrogen atom, an alkyl group, a perfluoroalkyl group, an aryl group, a halogen atom, or a cyano group; still more preferably a hydrogen atom, a methyl group, a trifluoromethyl group, or a cyano group; particularly preferably a hydrogen atom, a trifluoromethyl group, a fluorine atom, or a cyano group.

$R^2$ and $R^4$ are each preferably a hydrogen atom, a halogen atom, a fluorine-substituted phenyl group, a fluorine-substituted alkoxy group, a perfluoroalkyl group, a cyano group, a nitro group, or an aryloxy group; more preferably a hydrogen atom, a fluorine atom, a fluorine-substituted phenyl group, a trifluoromethoxy group, a trifluoromethyl group, a cyano group, or a phenoxy group; even more preferably a hydrogen atom, a fluorine atom, a perfluorophenyl group, a trifluoromethyl group, a cyano group, or a phenoxy group substituted with an electrophilic substituent; particularly preferably a hydrogen atom or a fluorine atom; most preferably a fluorine atom.

$R^{74}$ is preferably a hydrogen atom, an alkyl group, an aryl group, an amino group, an alkoxy group, an aryloxy group, an acyl group, an alkoxycarbonyl group, an alkylthio group, a sulfonyl group, a hydroxyl group, a halogen atom, a cyano group, a nitro group, or a heterocyclic group; more preferably a hydrogen atom, an alkyl group, an aryl group, an alkoxy group, an aryloxy group, an alkylthio group, a halogen atom, or a cyano group; even more preferably a hydrogen atom, an alkyl group, a perfluoroalkyl group, an aryl group, a halogen atom, or a cyano group; still more preferably a hydrogen atom, a methyl group, a trifluoromethyl group, a fluorine atom, or a cyano group; particularly preferably a hydrogen atom, a trifluoromethyl group, a fluorine atom, or a cyano group; most preferably a trifluoromethyl group or a cyano group.

The platinum complex of formula (5a-4) is not only useful as various materials in organic EL devices but also finds use as luminescent materials in other applications, such as display devices, displays, backlights, electrophotography, lighting sources, light sources for writing, reading, or exposure, signs, billboards, and interior accessories; materials for medical uses; fluorescent brightening agents, photographic materials, UV absorbing materials, laser dyes, recording medium materials, inkjet pigments, color filter dyes, color conversion filters, analyses, solar cell materials, and organic thin film transistor materials.

A compound that functions as a ligand to provide the novel platinum complex represented by formula (5a-4) is represented by formula (5a-4') shown below. The compound of formula (5a-4') is a novel compound.

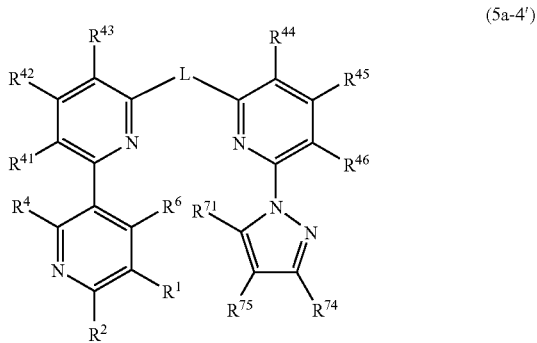

(5a-4')

In formula (5a-4'), $R^1$, $R^2$, $R^4$, $R^{41}$, $R^{42}$, $R^{43}$, $R^{44}$, $R^{45}$, $R^{46}$, $R^{74}$, and $R^{75}$ each independently represent a hydrogen atom or a substituents; and L represents a single bond or a divalent linking group.

The preferred ranges of $R^1$, $R^2$, $R^4$, $R^{41}$, $R^{42}$, $R^{43}$, $R^{44}$, $R^{45}$, $R^{46}$, $R^{74}R^{75}$, and L in formula (5a-4') are the same as those described with respect to formula (5a-4). $R^6$ and $R^{71}$ each independently represent a hydrogen atom or a substituent selected from, for example, the substituent group A. $R^6$ and $R^{71}$ are each preferably a halogen atom or a hydrogen atom, more preferably a hydrogen atom.

The compound of formula (5a-4') is useful as not only a ligand of the metal complex of formula (5a-4) but also an intermediate for fluorescent materials, charge transport materials, pharmaceuticals, and agricultural chemicals.

Another preferred embodiment of the platinum complex of formula (5) is represented by formula (5b-1):

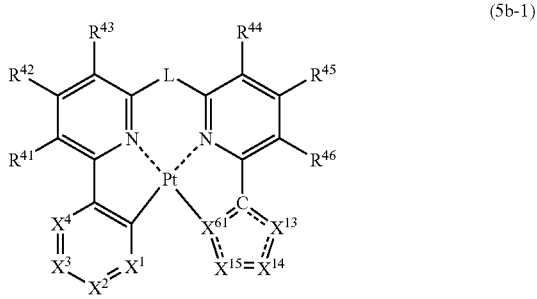

(5b-1)

In formula (5b-1), $X^1$, $X^2$, $X^3$, and $X^4$ each independently represent a carbon atom or a nitrogen atom, provided that at least one of $X^1$, $X^2$, $X^3$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{61}$ represents a carbon atom or a nitrogen atom; $X^{13}$, $X^{14}$, and $X^{15}$ each independently represent a carbon atom, a nitrogen atom, an oxygen atom, or a sulfur atom; the number of nitrogen atoms contained in the 5-membered ring skeleton including $X^{13}$, $X^{14}$, $X^{15}$, $X^{61}$, and the carbon atom is 2 or less; and L represents a single bond or a divalent linking group.

The preferred ranges of $X^1$, $X^2$, $X^3$, $X^4$, $X^{13}$, $X^{14}$, $X^{15}$, $R^{41}$, $R^{42}$, $R^{43}$, $R^{44}$, $R^{45}$, $R^{46}$, and L in formula (5b-1) are the same as those described with respect to formula (5).

$X^{61}$ represents a carbon atom or a nitrogen atom, preferably a nitrogen atom.

In formula (5b-1), the number of nitrogen atoms contained in the 5-membered ring skeleton composed of $X^{13}$, $X^{14}$, $X^{15}$, $X^{61}$, and the carbon atom is 0, 1, or 2, preferably 1 or 2, more preferably 2.

The bonds between adjacent two of $X^{61}$, the carbon atom, $X^{13}$, $X^{14}$, and $X^{15}$ may be any combination of a single bond and a double bond. Examples of the 5-membered ring composed of $X^{61}$, the carbon atom, $X^{13}$, $X^{14}$, and $X^{15}$ include pyrrole, pyrazole, imidazole, furan, and thiophene, more preferably pyrrole, pyrazole, and imidazole; even more preferably pyrazole.

The platinum complex of formula (5b-1) is preferably represented by formula (5b-2):

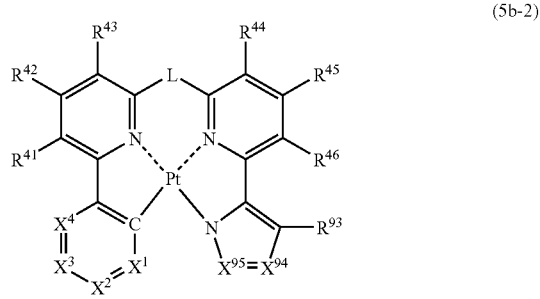

(5b-2)

In formula (5b-2), $X^1$, $X^2$, $X^3$, and $X^4$ each independently represent a carbon atom or a nitrogen atom, provided that at least one of $X^1$, $X^2$, $X^3$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{94}$ and $X^{95}$ each independently represent a carbon atom or a nitrogen atom, provided that at least one of $X^{94}$ and $X^{95}$ is a carbon atom; $R^{93}$ represents a hydrogen atom or a substituent; and L represents a single bond or a divalent linking group.

The preferred ranges of $X^1$, $X^2$, $X^3$, $X^4$, $R^{41}$, $R^{42}$, $R^{43}$, $R^{44}$, $R^{45}$, $R^{46}$, and L in formula (5b-2) are the same as those recited with respect to formula (5b-1).

$X^{94}$ and $X^{95}$ each independently represent a carbon atom or a nitrogen atom, provided that at least one of them is a carbon atom. Preferably, $X^{94}$ is a carbon atom, and $X^{95}$ is a nitrogen atom. If possible, $X^{94}$ and $X^{95}$ may each independently optionally have a substituent selected from, for example, the substituent group A. Preferred substituents are an alkyl group, a perfluoroalkyl group, an aryl group, an aromatic heterocyclic group, a dialkylamino group, a diarylamino group, an alkyloxy group, a cyano group, and a halogen atom; more preferably an alkyl group, a perfluoroalkyl group, an aryl group, a dialkylamino group, a cyano group, and a fluorine atom; even more preferably an alkyl group, a trifluoromethyl group, and a fluorine atom. If possible, the substituents may be connected to each other to form a fused ring.

Examples of the 5-membered ring composed of $X^{94}$ and $X^{95}$ together with the nitrogen atom and the two carbon atoms include pyrrole, pyrazole, and imidazole, more preferably pyrazole and imidazole, even more preferably pyrazole.

$R^{93}$ represents a hydrogen atom or a substituent. The substituent as $R^{93}$ is selected from, for example, the substituent group A. $R^{93}$ is preferably a hydrogen atom, an alkyl group, a perfluoroalkyl group, an aryl group, an aromatic heterocyclic group, a dialkylamino group, a diarylamino group, an alkoxy group, a cyano group, or a halogen atom; more preferably a hydrogen atom, an alkyl group, a perfluoroalkyl group, an aryl group, a dialkylamino group, a cyano group, or a fluorine atom; even more preferably a hydrogen atom, an alkyl group, a trifluoromethyl group, or a fluorine atom; and most preferably a fluorine atom or a hydrogen atom. If possible, the substituents of $X^{94}$ and $X^{95}$ may be connected to each other to form a fused ring.

The platinum catalyst of formula (5b-2) is preferably represented by formula (5b-3):

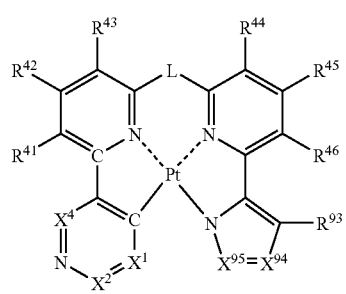

(5b-3)

In formula (5b-3), $X^1$, $X^2$, and $X^4$ each independently represent a carbon atom or a nitrogen atom, provided that at least one of $X^1$, $X^2$, and $X^4$ is a nitrogen atom; $R^{41}$, $R^{42}$, $R^{43}$, $R^{44}$, $R^{45}$, and $R^{46}$ each independently represent a hydrogen atom or a substituents; $X^{94}$ and $X^{95}$ each independently represent a carbon atom or a nitrogen atom, provided that at least one of $X^{94}$ and $X^{95}$ is a carbon atom; $R^{93}$ represents a hydrogen atom or a substituent; and L represents a single bond or a divalent linking group.

The preferred ranges of $X^1$, $X^2$, $X^4$, $X^{95}$, $R^{41}$, $R^{42}$, $R^{43}$, $R^{44}$, $R^{45}$, $R^{46}$, $R^{93}$, and L in formula (5b-3) are the same as those recited with respect to formula (5b-2).

The number of nitrogen atoms contained in the 6-membered ring skeleton composed of $X^1$, $X^2$, $X^4$, the nitrogen atom, and the two carbon atoms in formula (5b-3) is 1 to 3, preferably 1 or 2, even more preferably 1. The 6-membered ring is preferably pyridine, pyrazine, pyrimidine, pyridazine, or triazine; more preferably pyridine, pyrazine, pyrimidine, or pyridazine; even more preferably pyridine, pyrazine, or pyrimidine; and most preferably pyridine.

The metal complex having the above described specific structure may be a low molecular compound, a high molecular compound in which the residue is bonded to the polymer main chain thereof (the high molecular compound preferably having a mass average molecular weight of 1,000 to 5,000,000, more preferably 5,000 to 2,000,000, even more preferably 10,000 to 1,000,000) or a high molecular compound having the metal complex having the above specific structure in the main chain (the high molecular compound preferably having a mass average molecular weight of 1,000 to 5,000,000, more preferably 5,000 to 2,000,000, even more preferably 10,000 to 1,000,000). The low molecular weight compound is preferred to the high molecular weight compound.

The high molecular compound may be a homopolymer or a copolymer that may be a random copolymer or a block copolymer. The copolymer may comprise a component having a light emitting function and/or a component having a charge transport function.

Preferred but non-limiting examples of the metal complex of formula (4) are shown below.

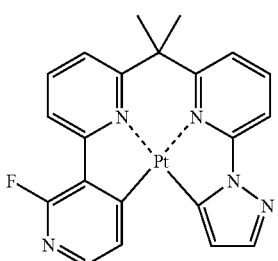

1

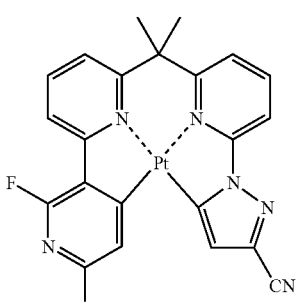

2

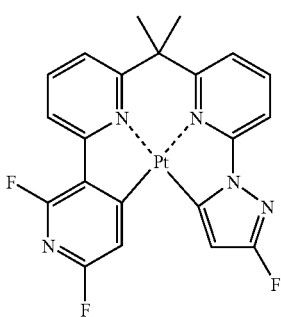

3

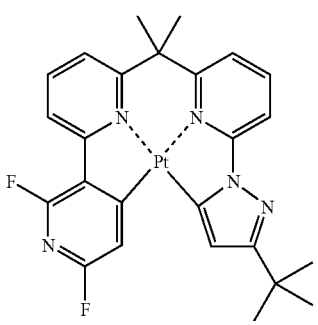

4

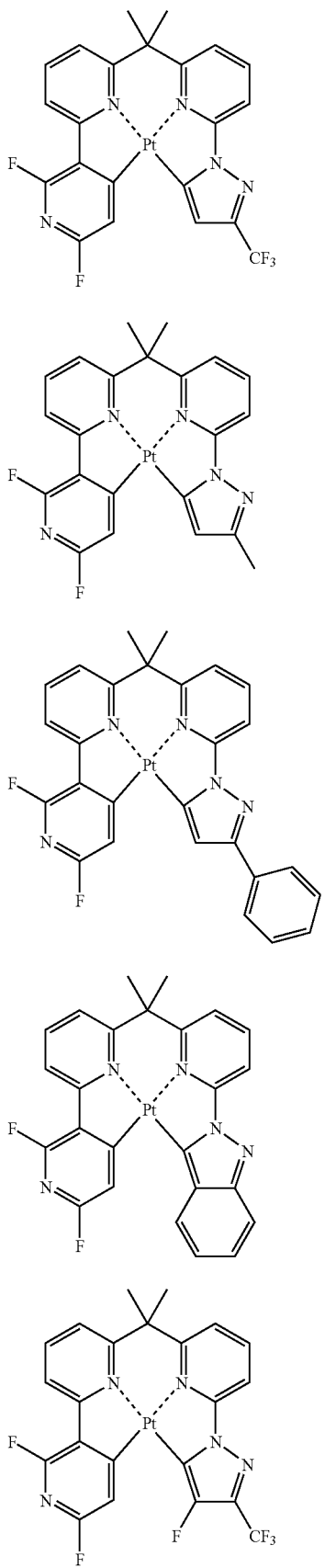
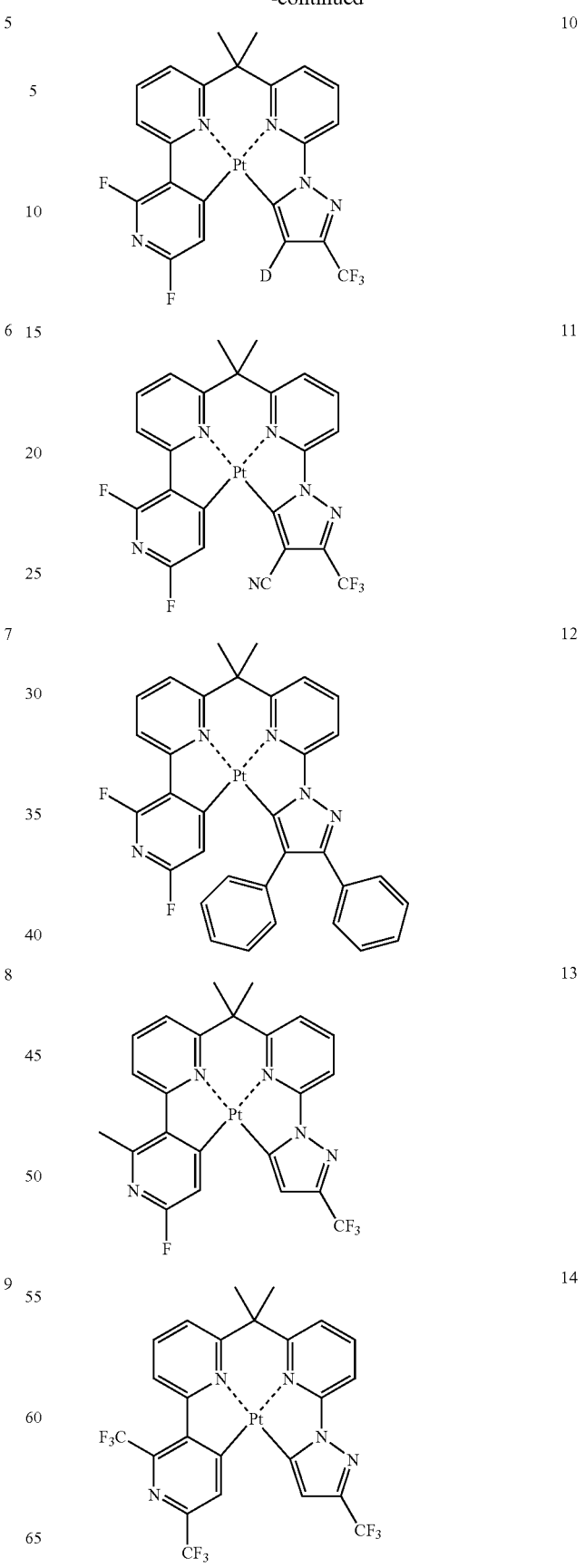

15
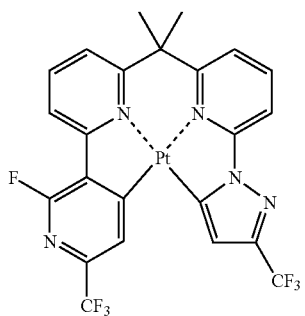
16
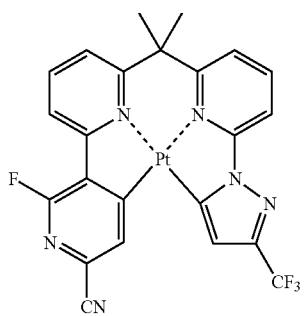
17
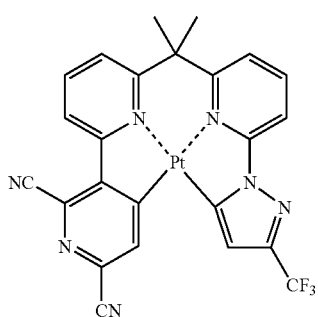
18
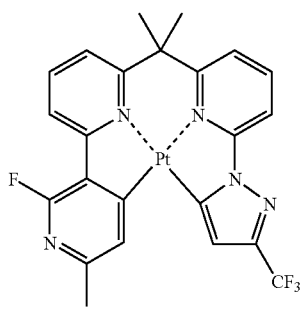
19
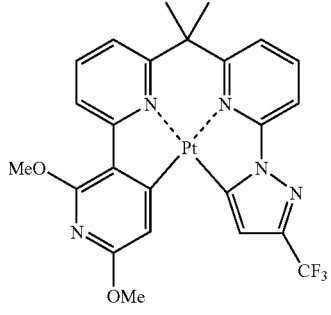
20
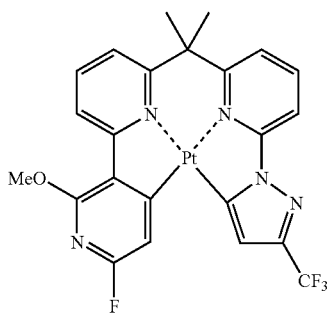
21
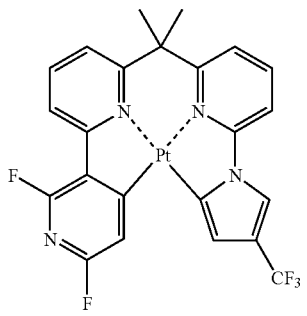
22
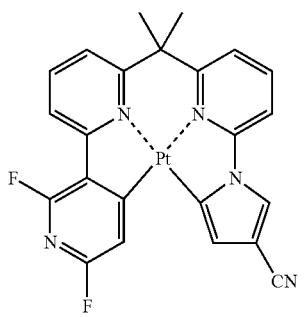
23
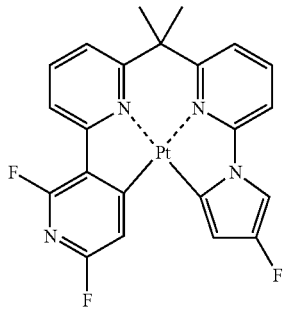
24
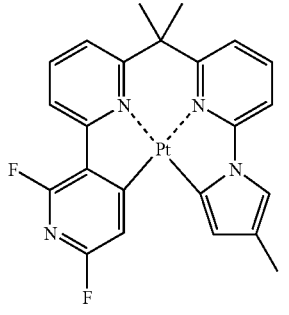

35
-continued
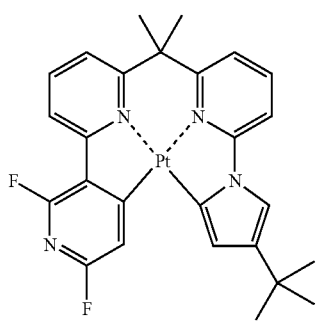
25
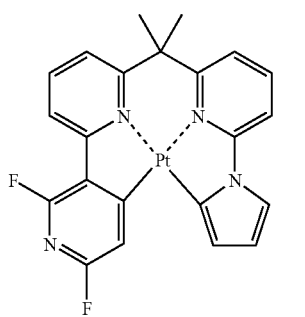
26
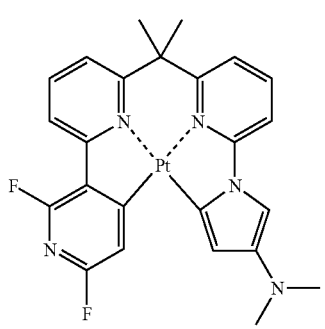
27
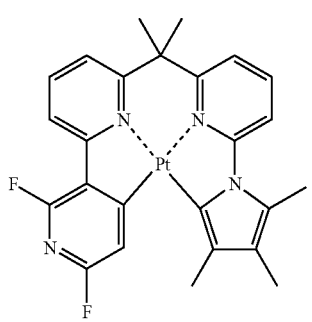
28
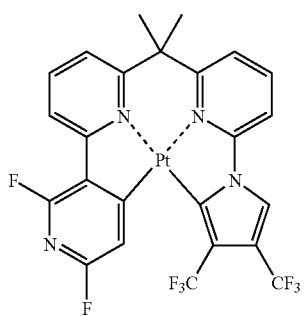
29
36
-continued
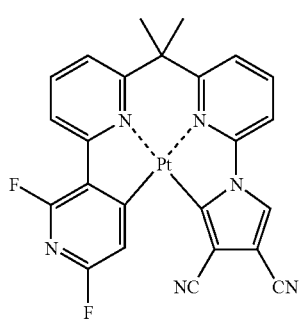
30
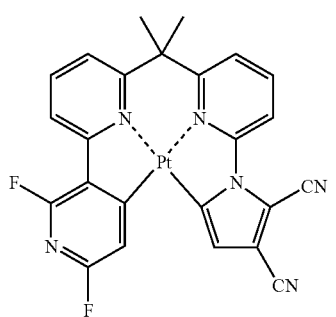
31
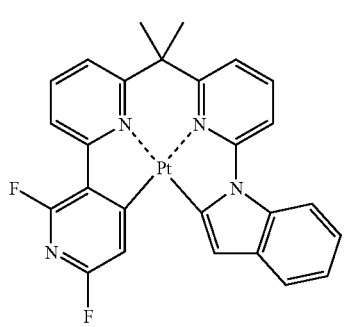
32
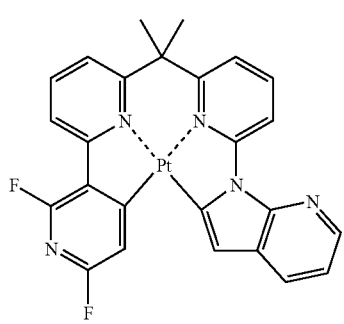
33
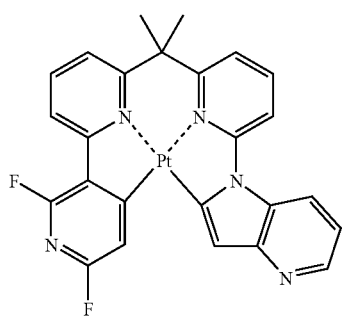
34

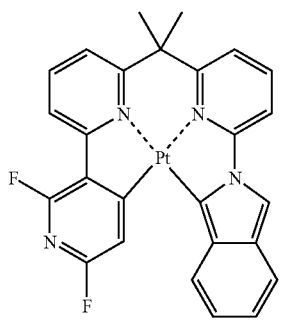
35
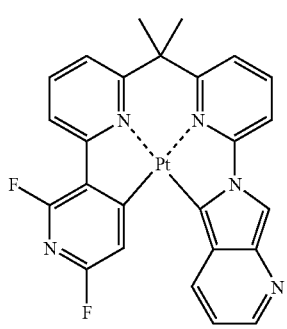
36
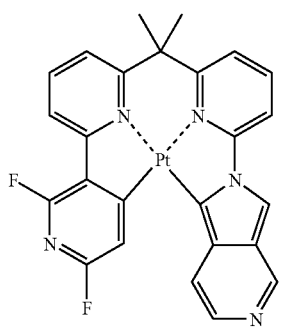
37
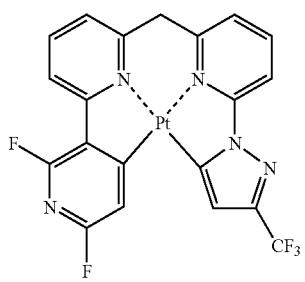
38
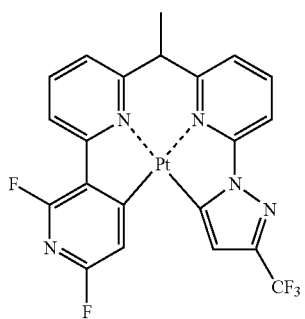
39
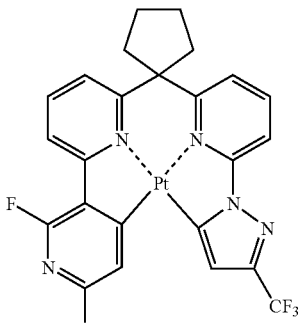
40
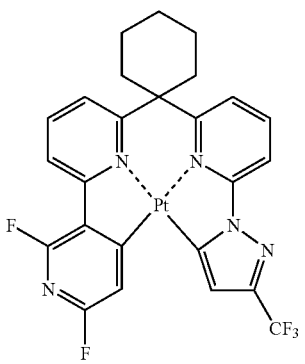
41
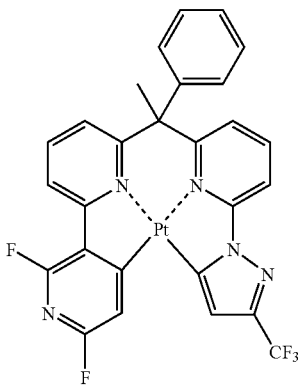
42
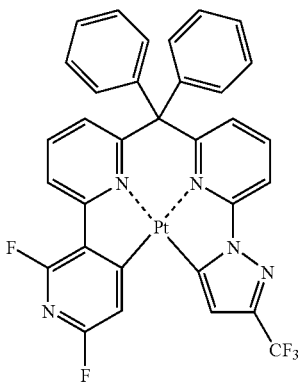
43

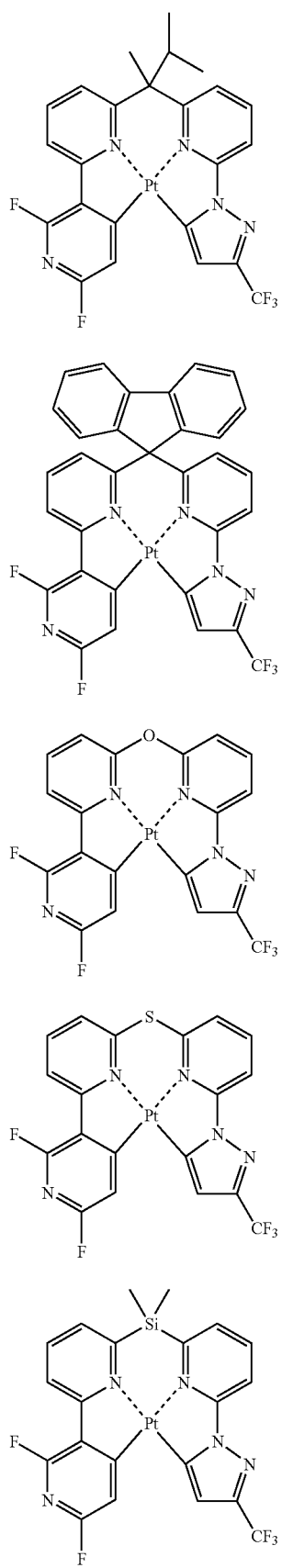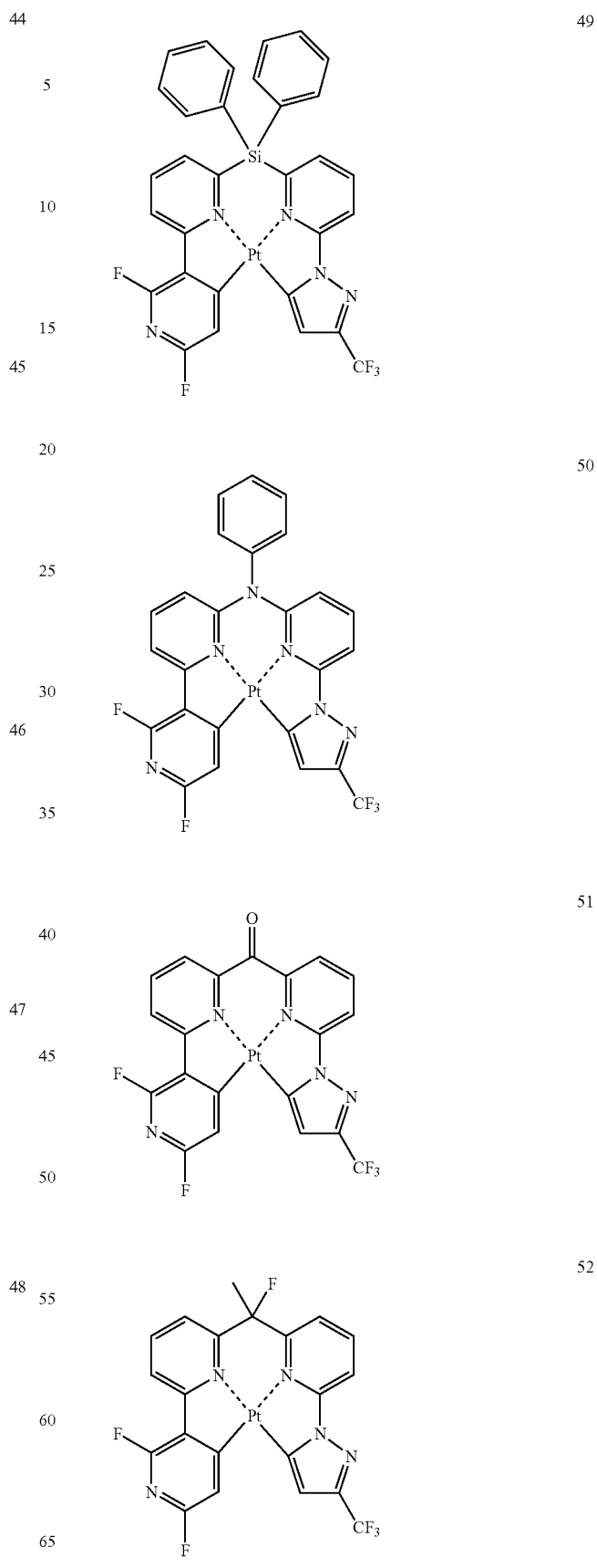

53
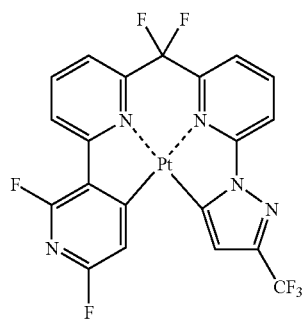
54
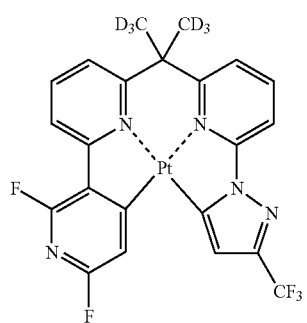
55
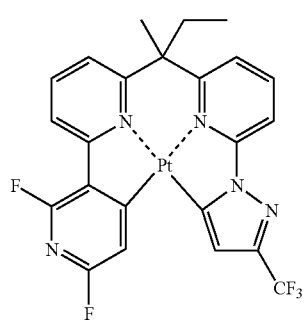
56
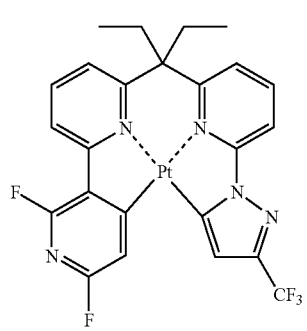
57
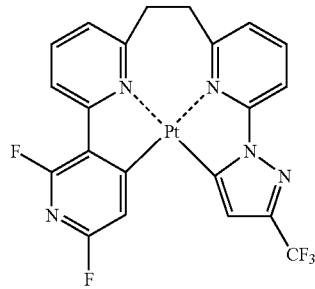
58
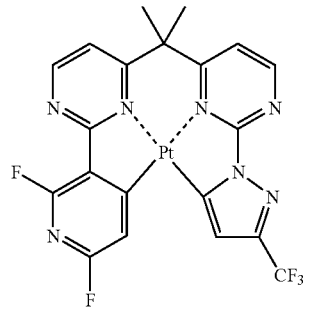
59
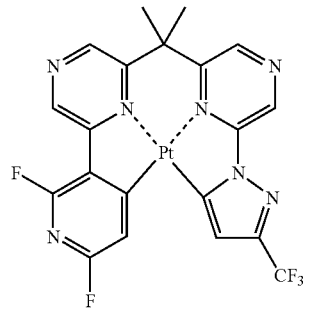
60
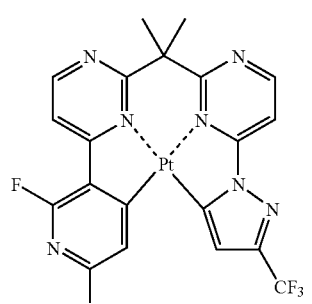
61
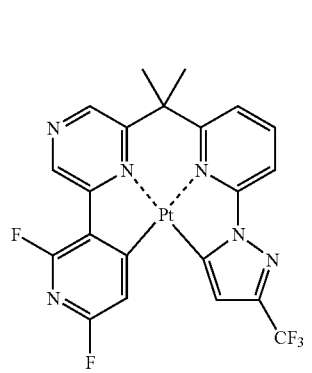
62
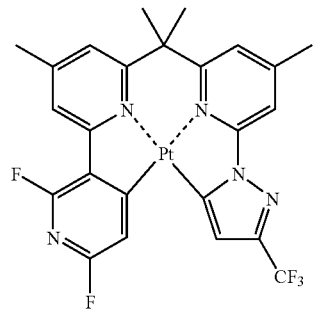

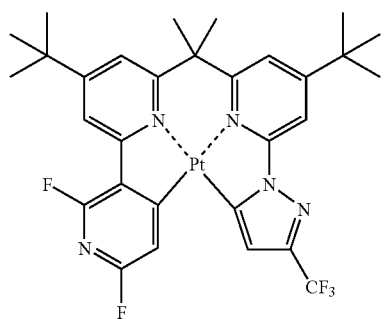
63
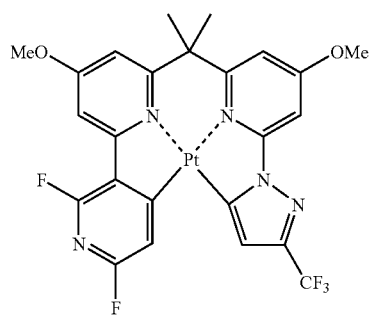
64
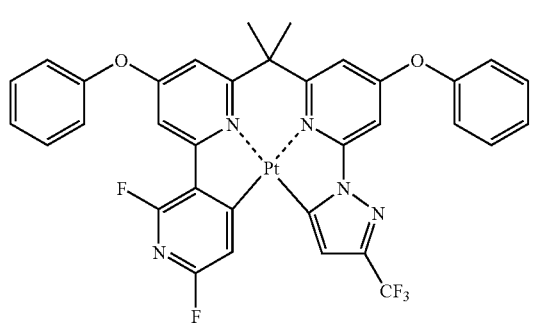
65
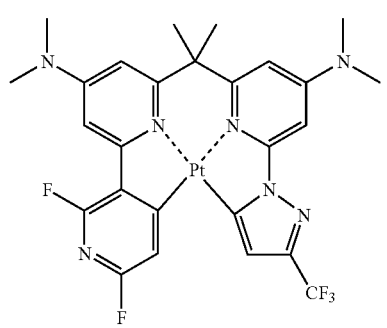
66
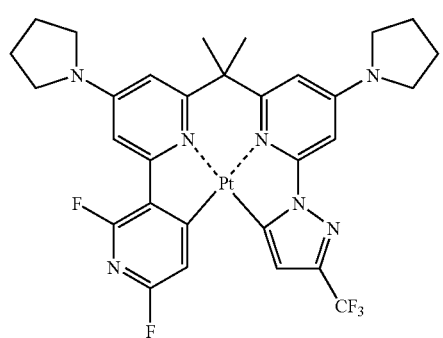
67
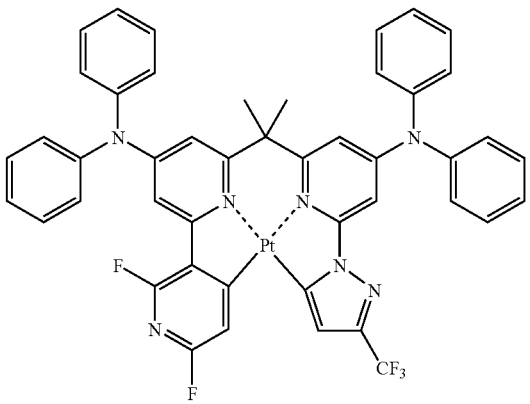
68
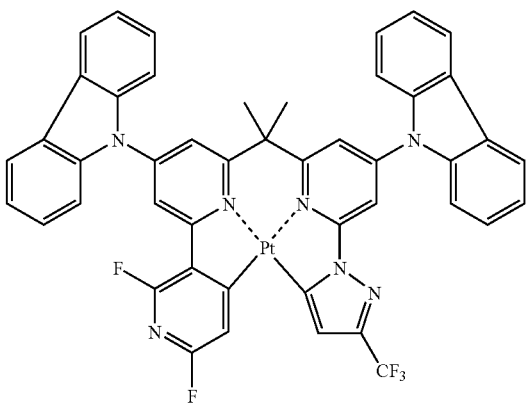
69
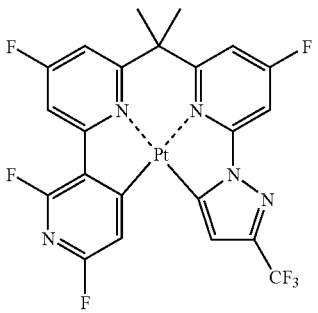
70
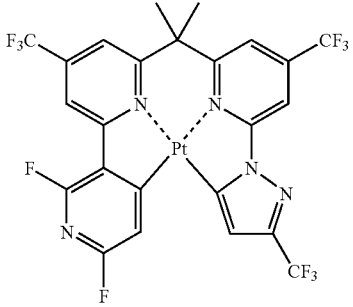
71

-continued
72
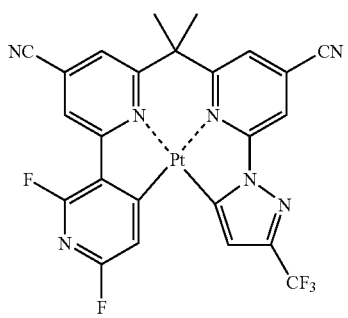
73
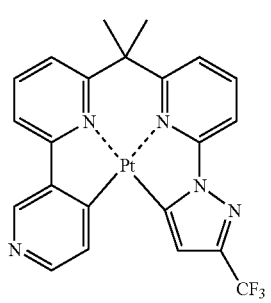
74
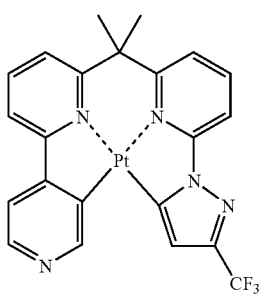
75
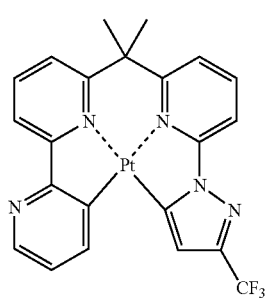
76
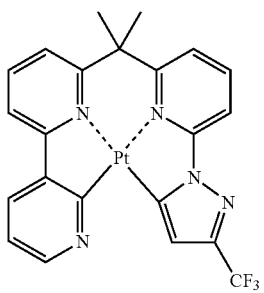
-continued
77
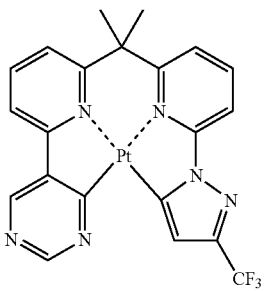
78
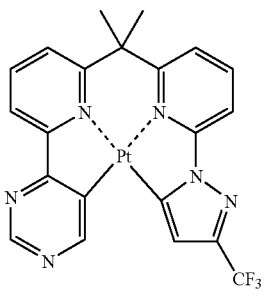
79
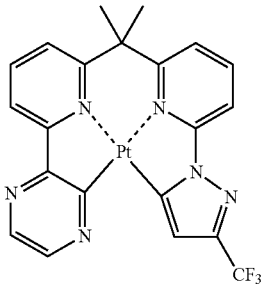
80
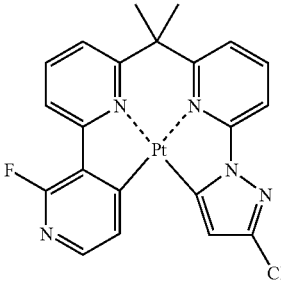
81
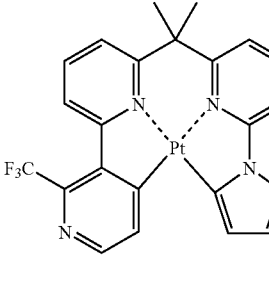

82 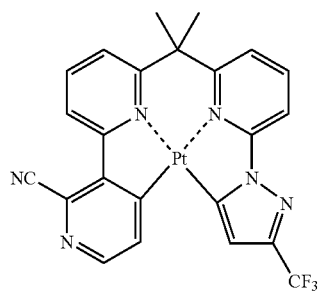
83 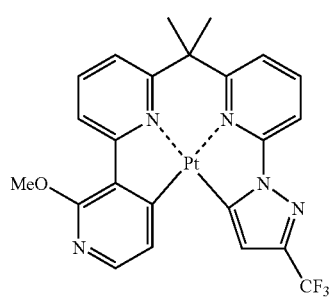
84 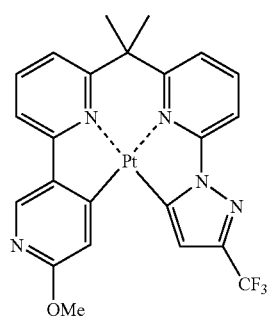
85 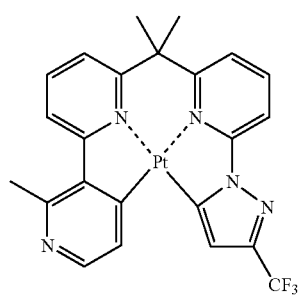
86 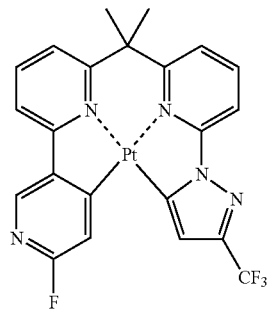
87 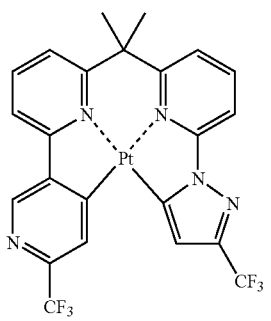
88 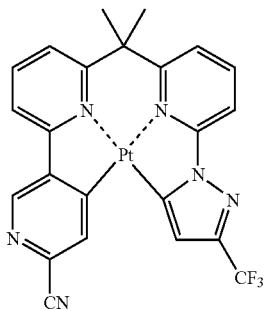
89 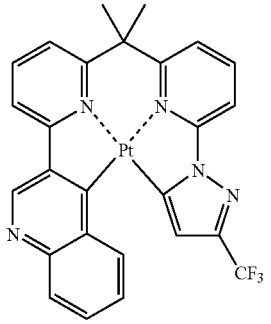
90 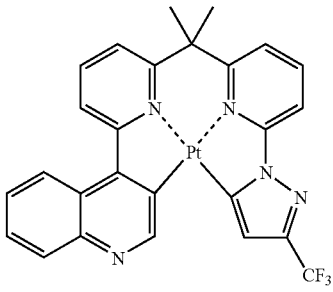
91 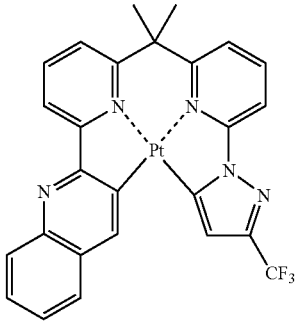

92
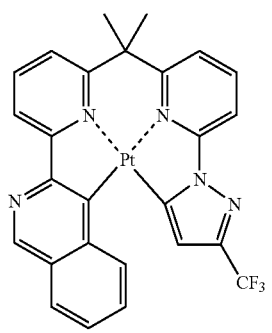
93
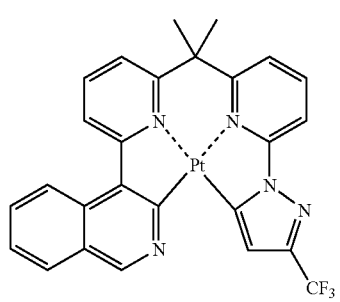
94
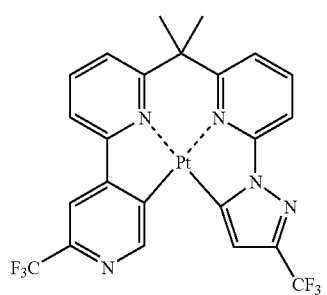
95
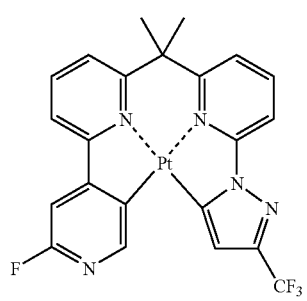
96
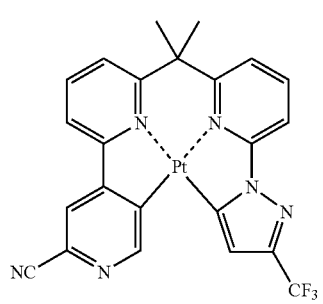
97
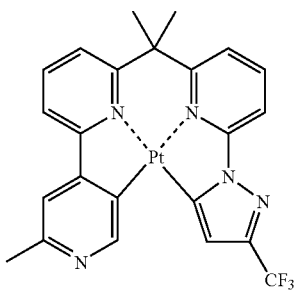
98
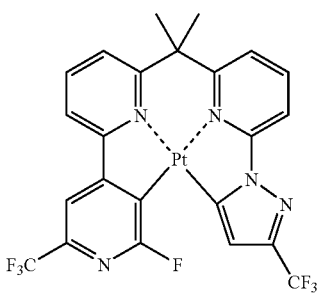
99
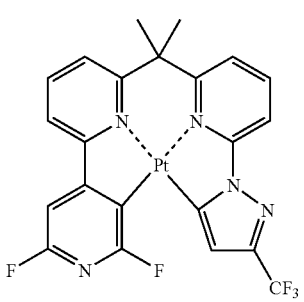
100
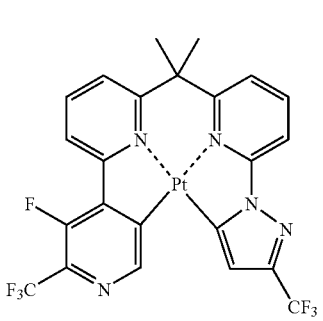
101
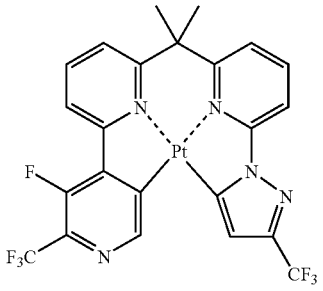

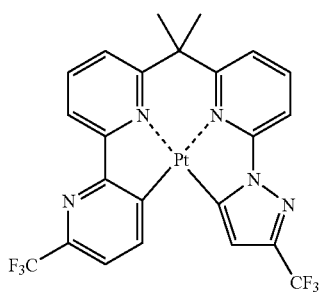
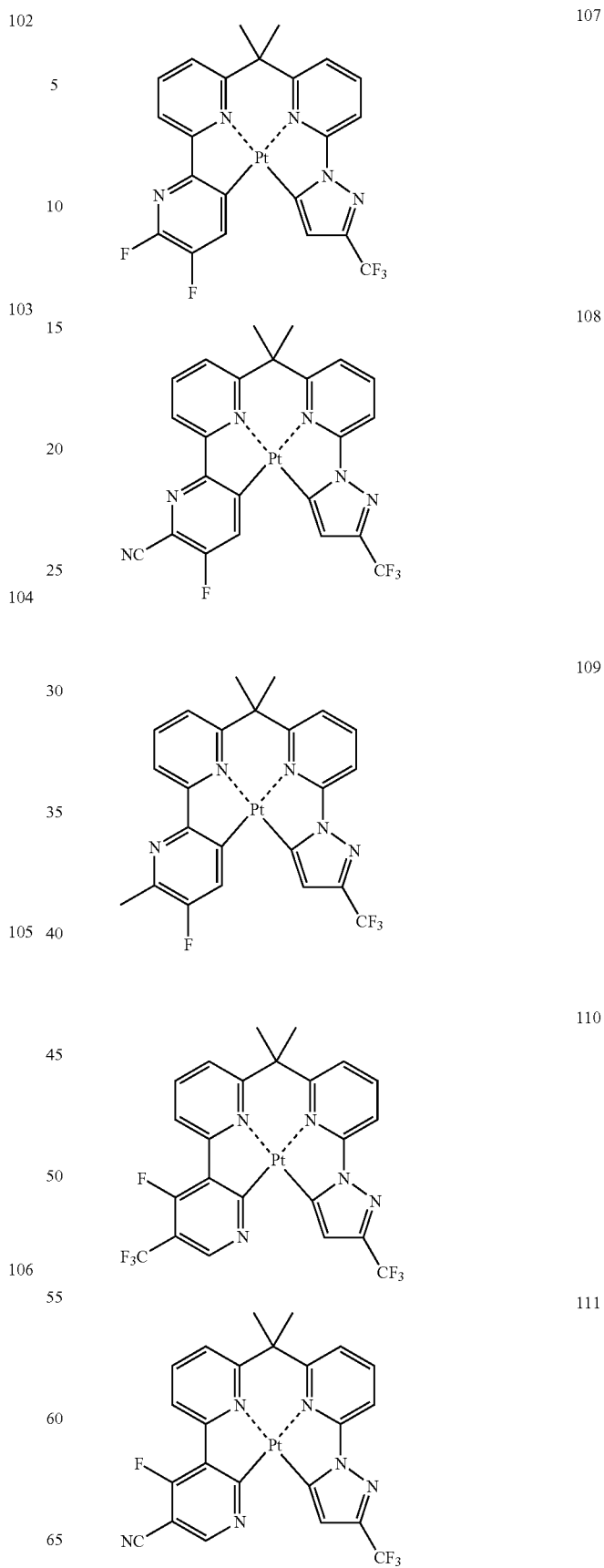

112 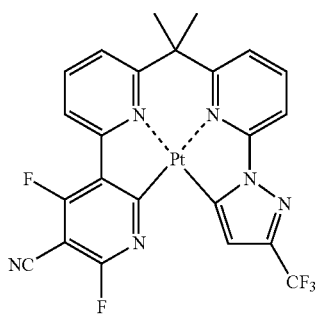
113 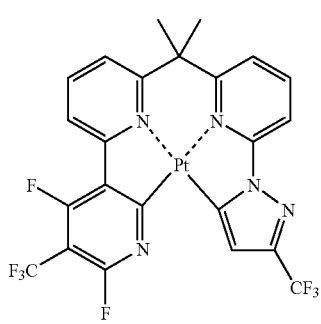
114 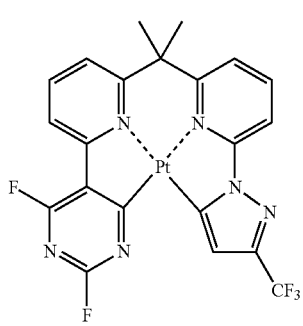
115 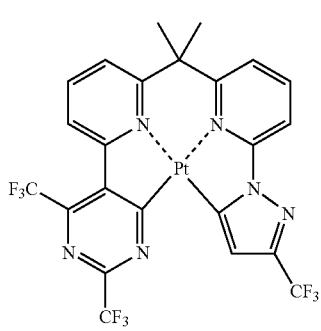
116 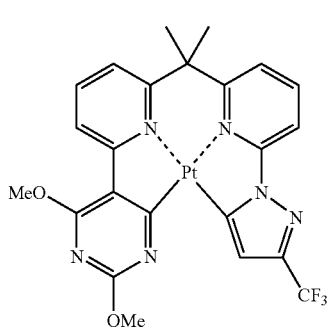
117 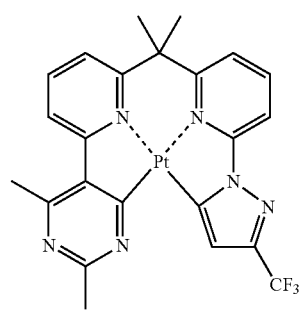
118 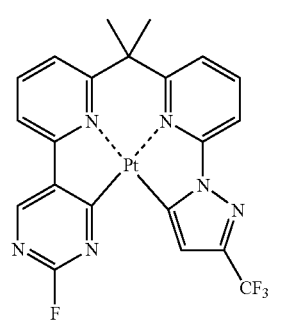
119 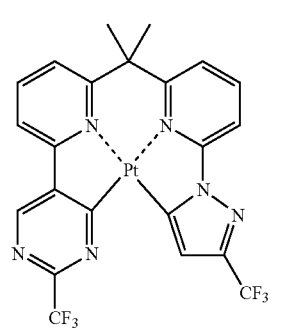
120 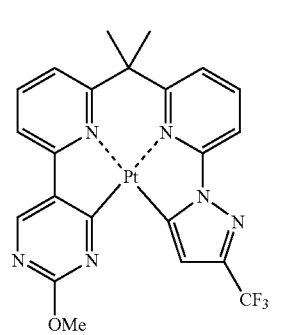
121 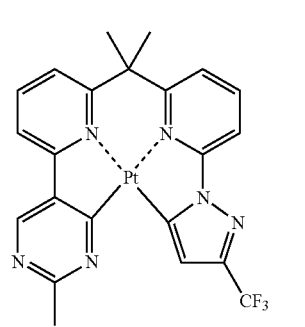

122 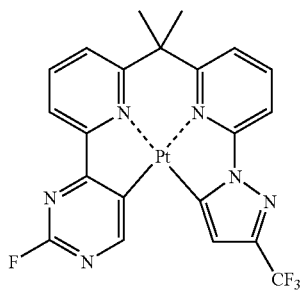
123 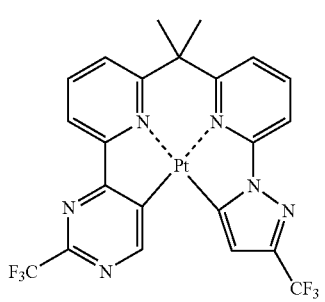
124 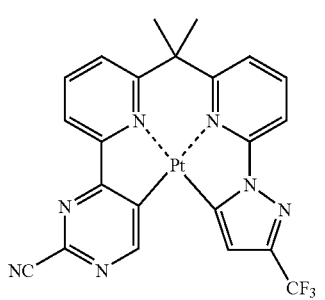
125 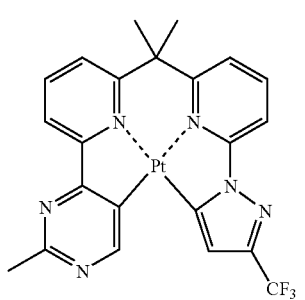
126 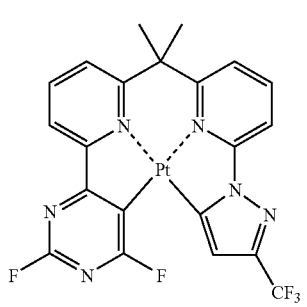
127 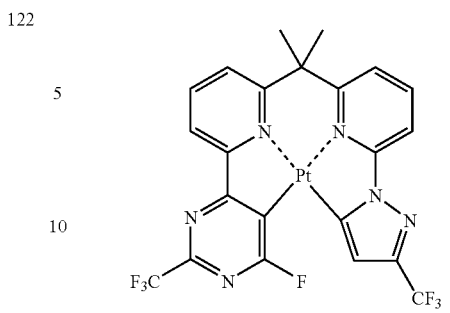
128 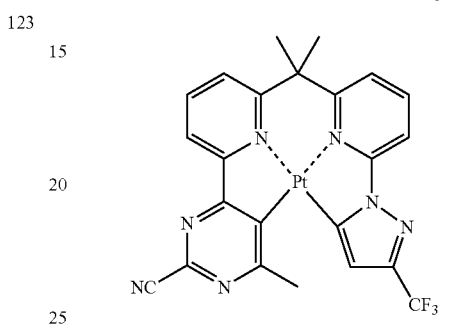
129 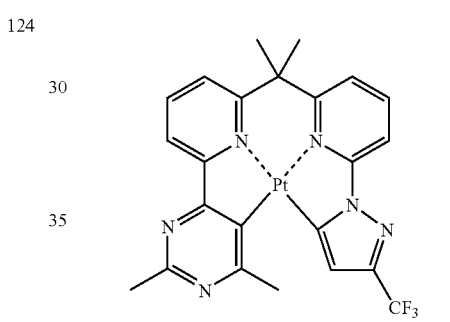
130 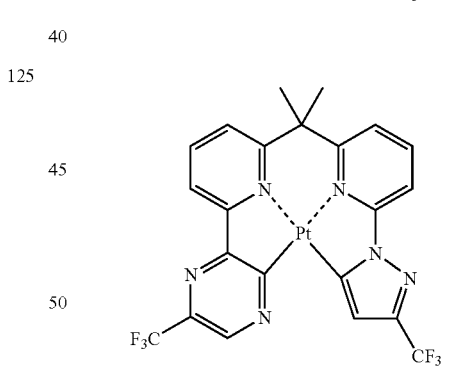
131 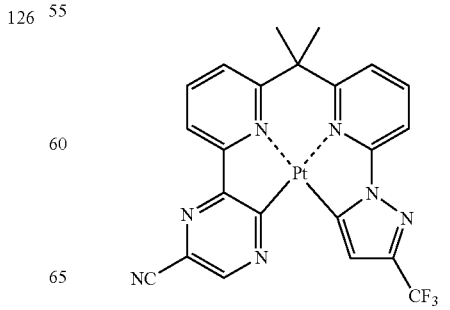

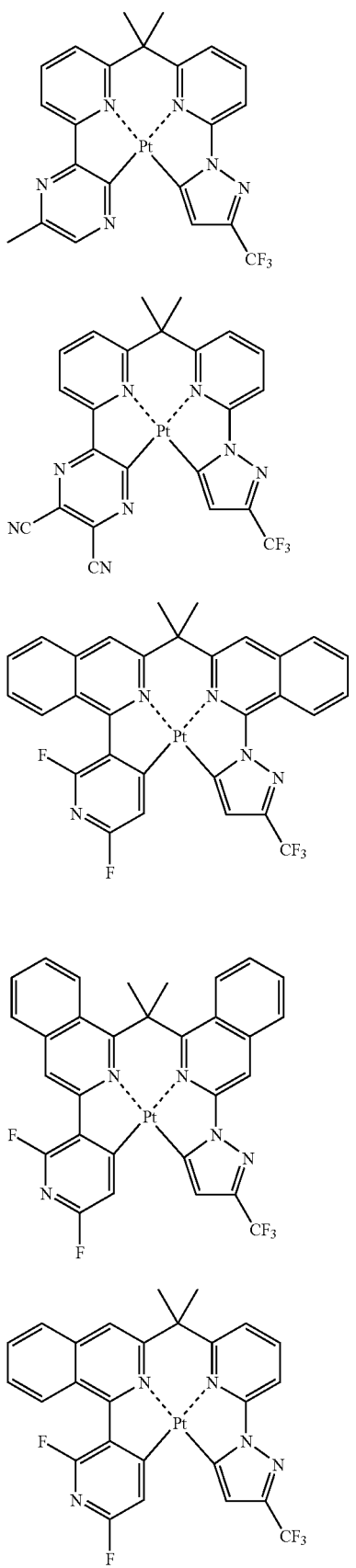
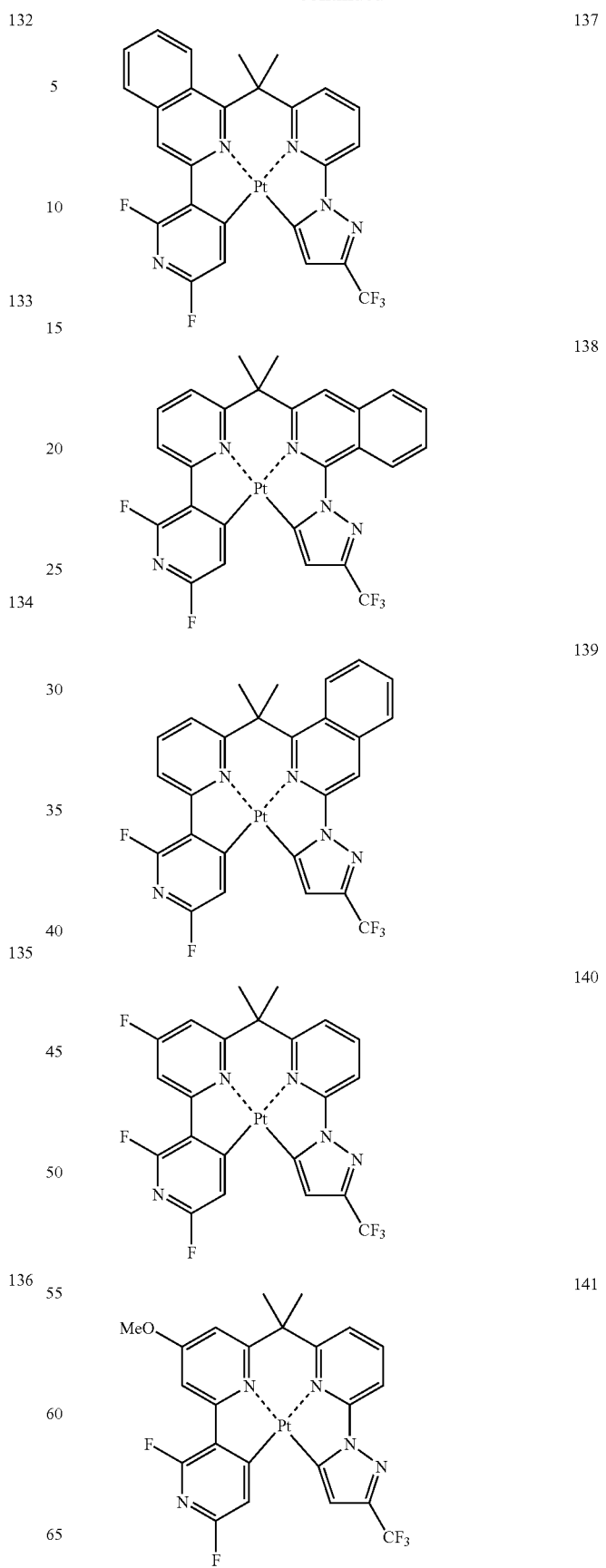

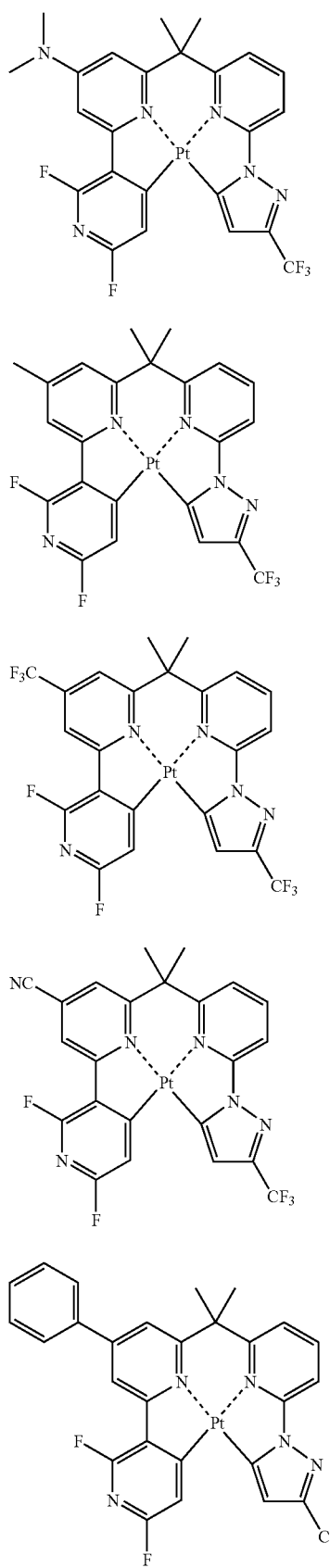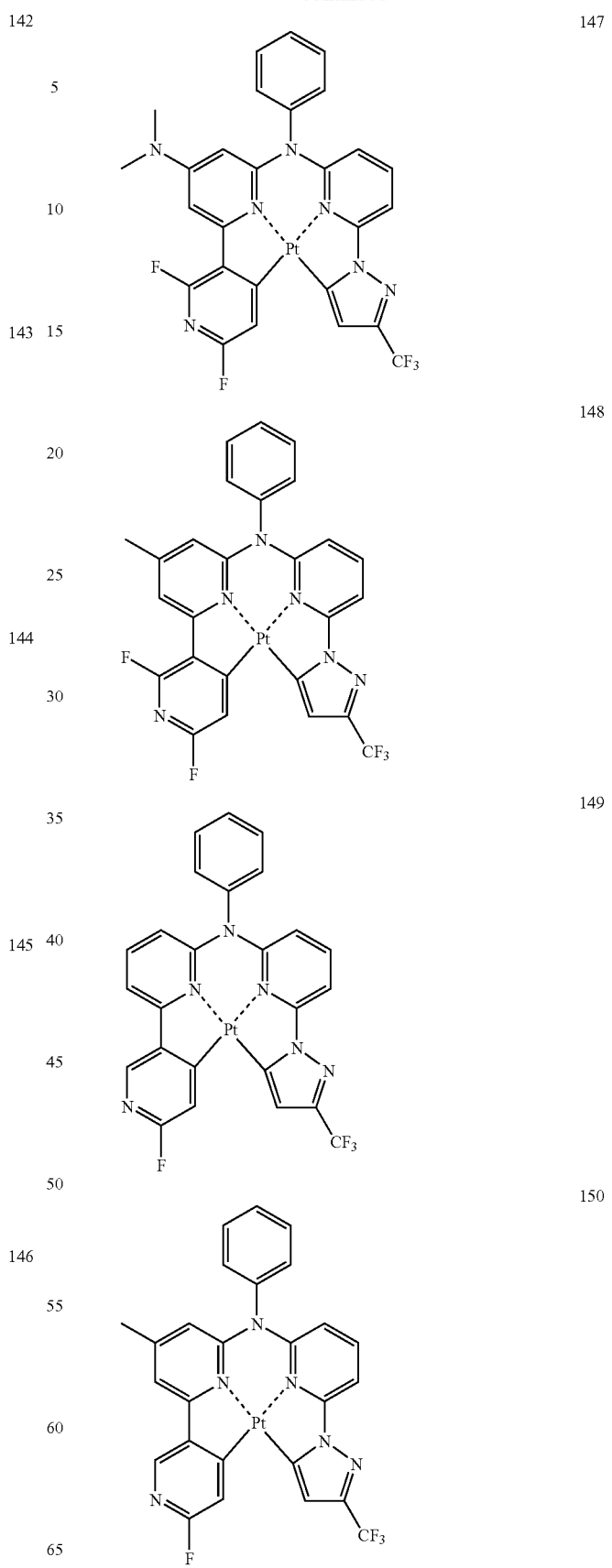

151 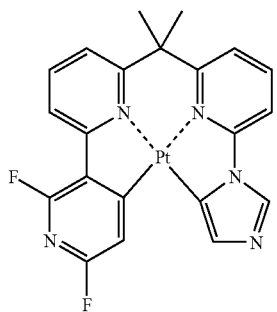
152 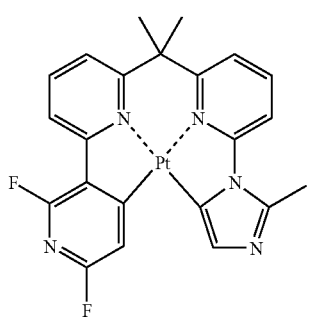
153 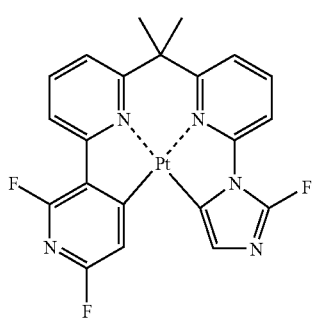
154 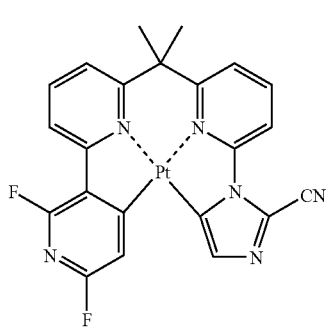
155 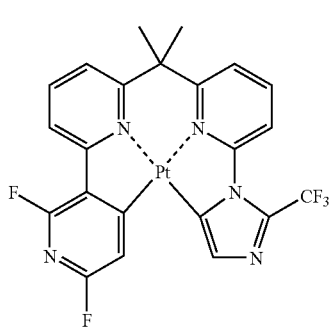
156 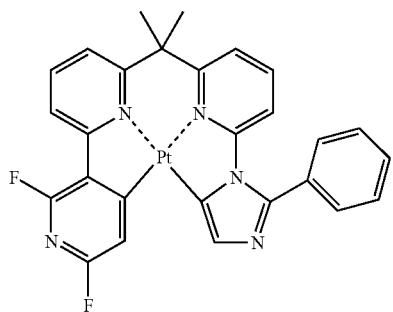
157 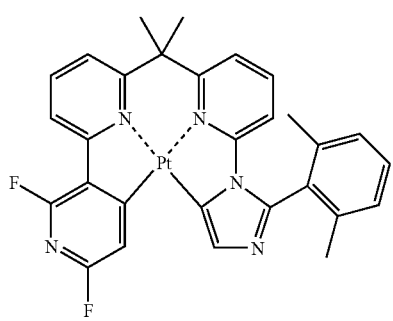
158 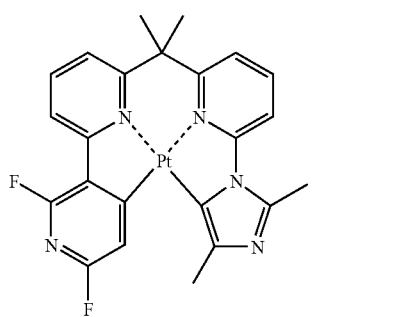
159 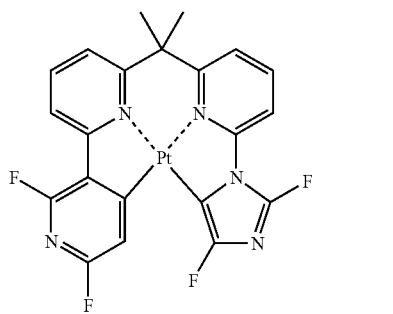
160 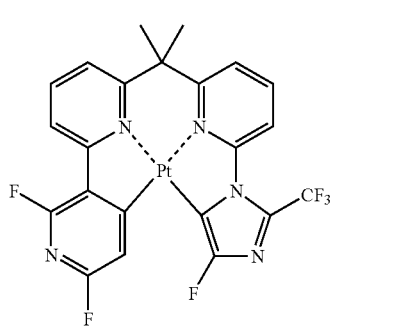

| | |
|---|---|
| 161 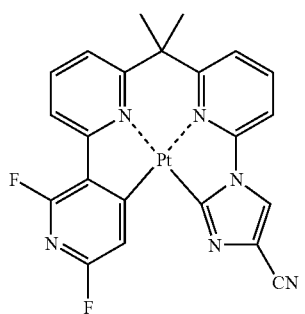 | 166 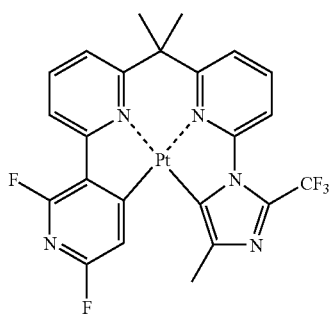 |
| 162 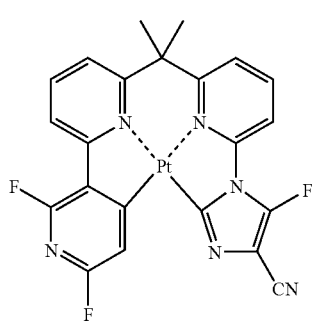 | 167 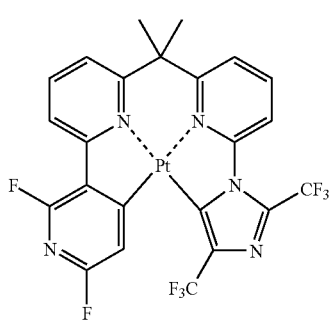 |
| 163 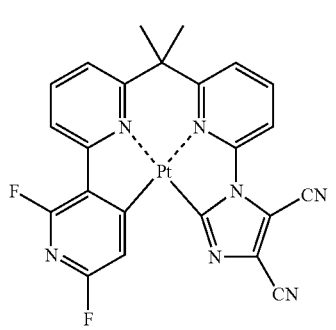 | 168 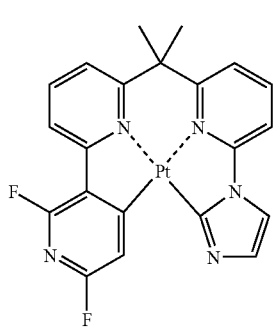 |
| 164 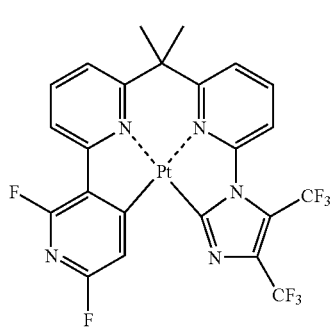 | 169 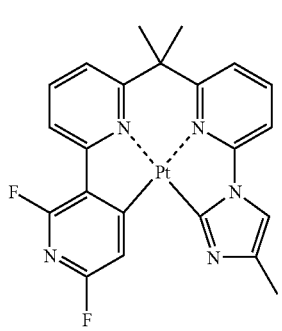 |
| 165 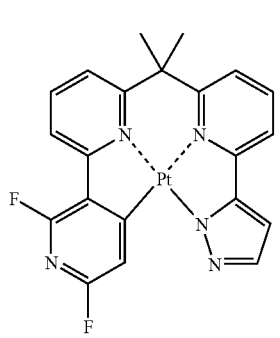 | 170 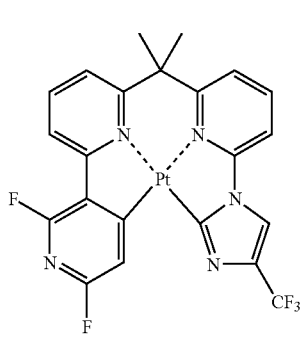 |

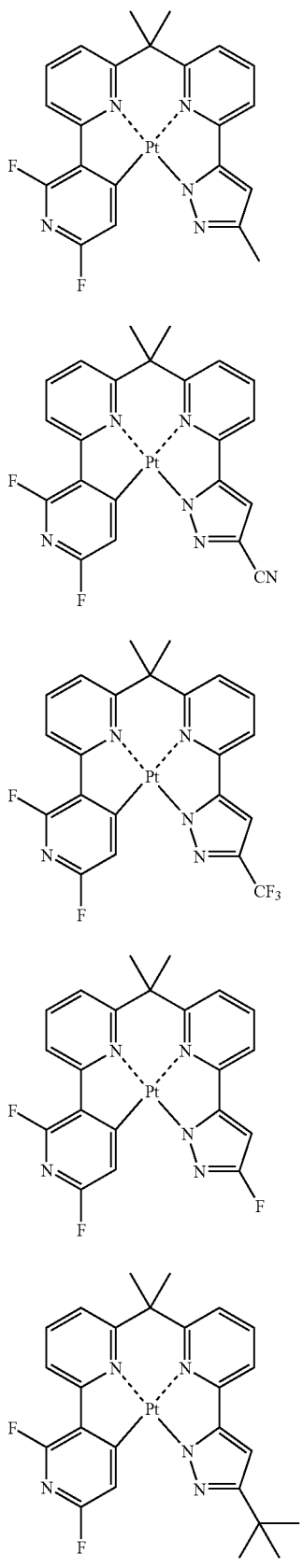
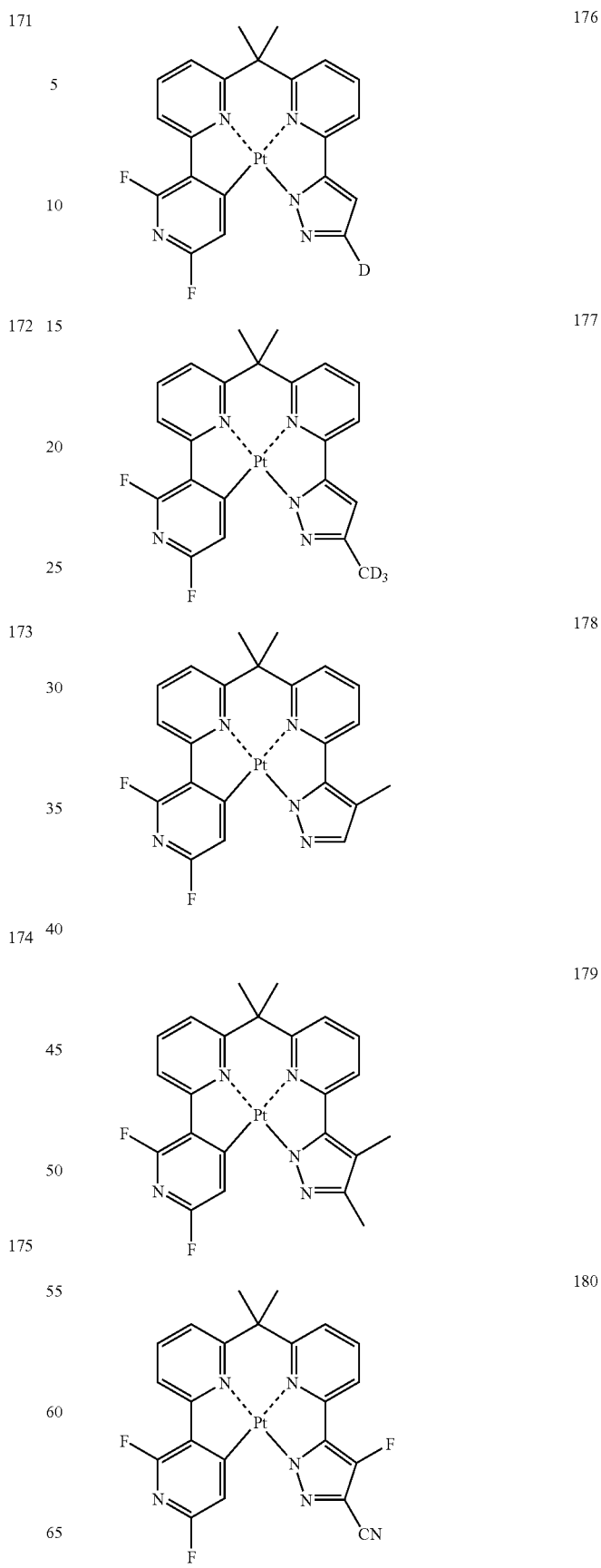

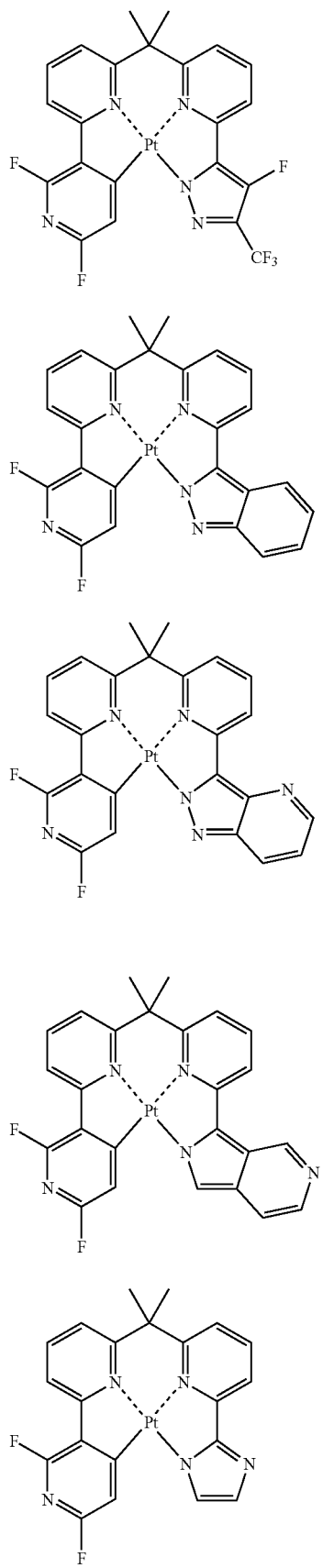
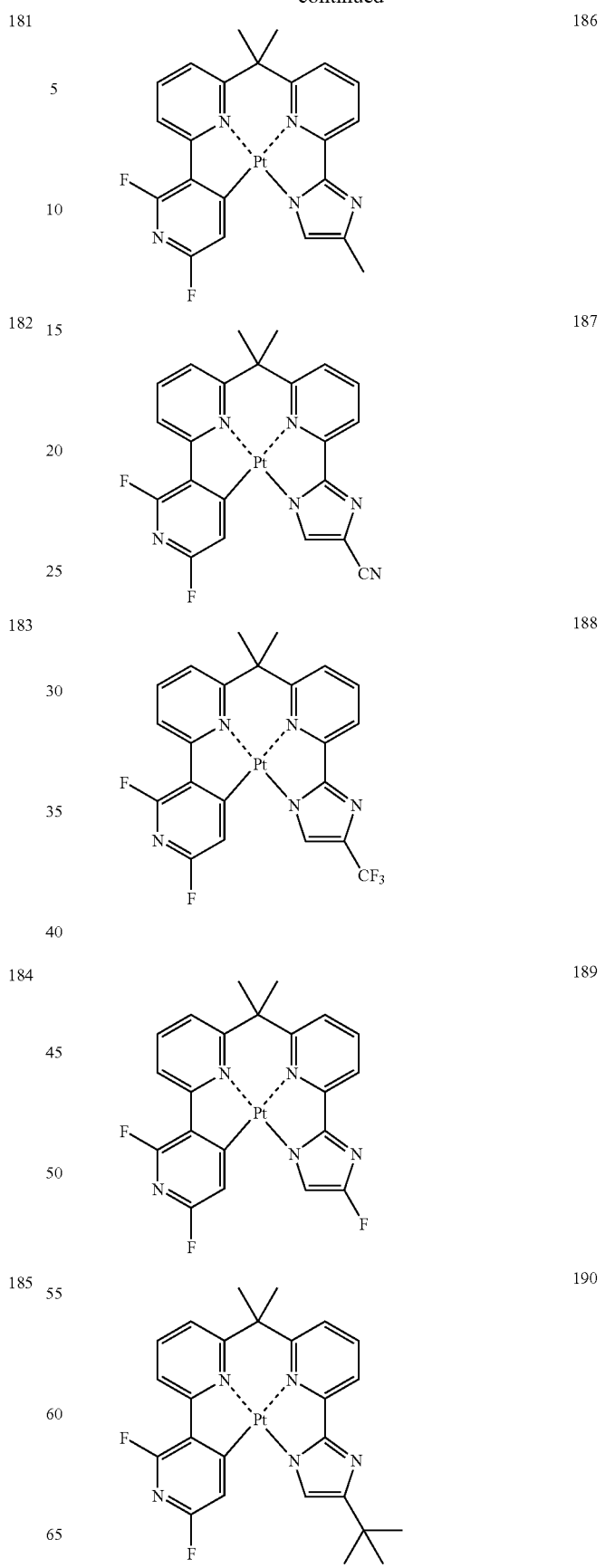

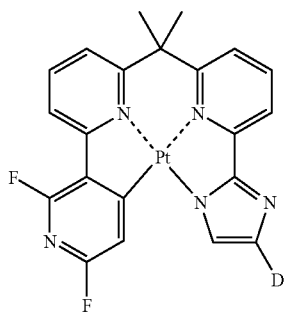
191
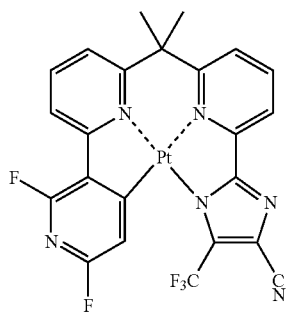
196
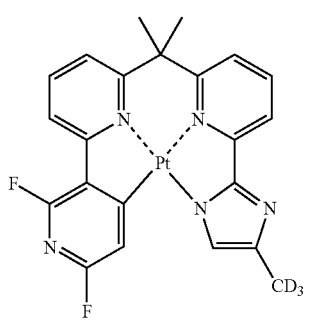
192
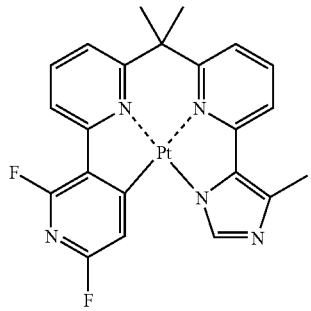
197
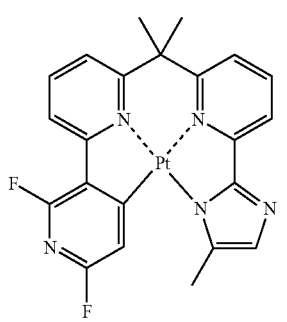
193
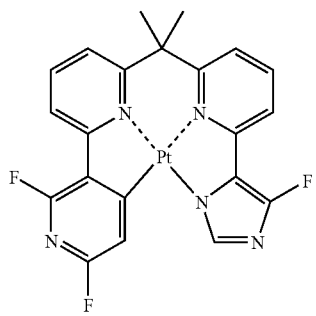
198
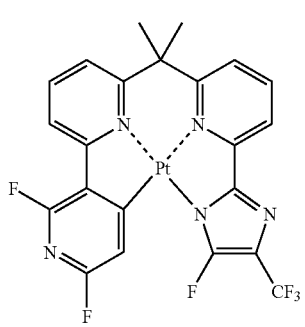
194
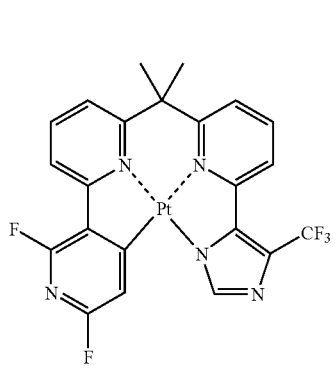
199
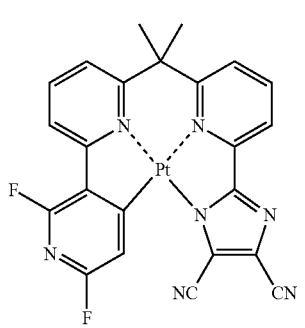
195
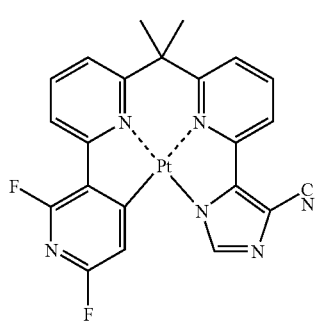
200

-continued
| | |
|---|---|
| 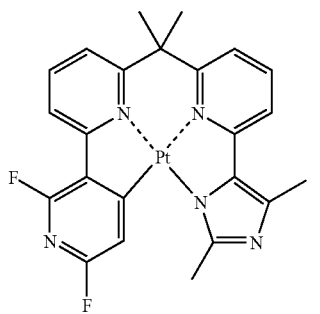 201 | 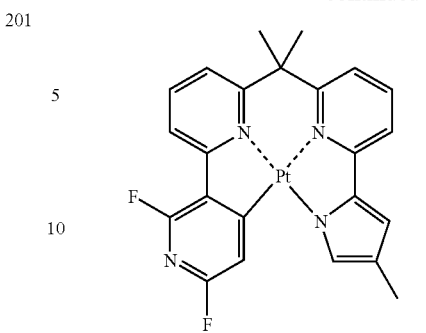 206 |
| 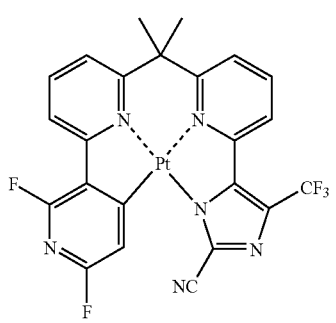 202 | 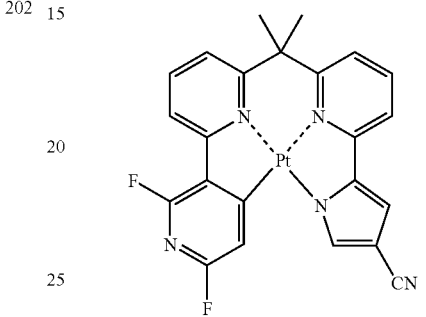 207 |
| 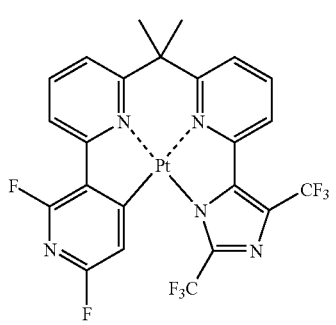 203 | 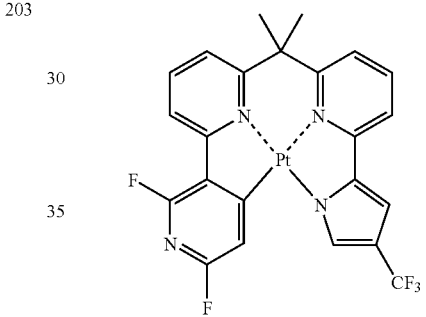 208 |
| 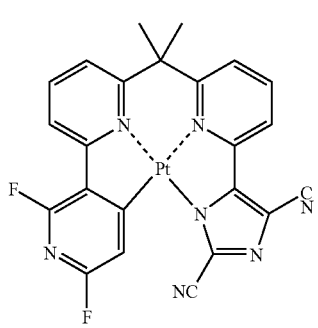 204 | 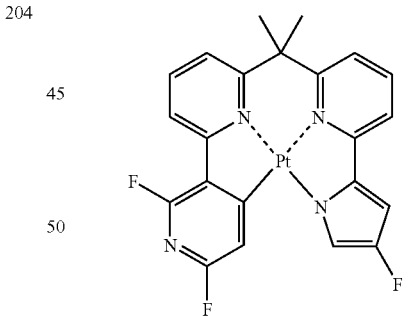 209 |
| 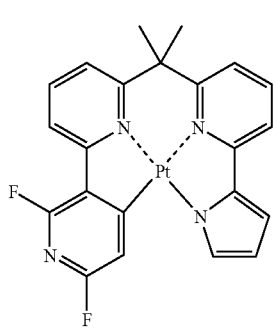 205 | 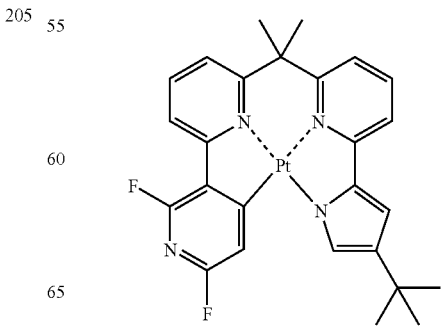 210 |

-continued
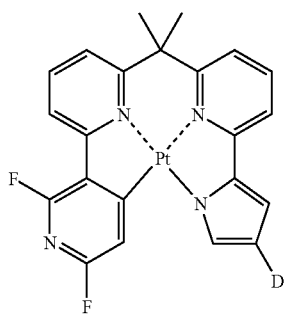  211
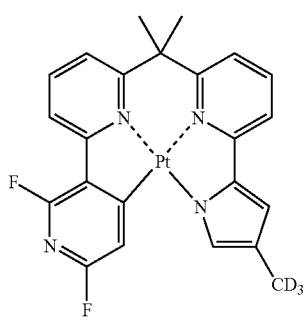  212
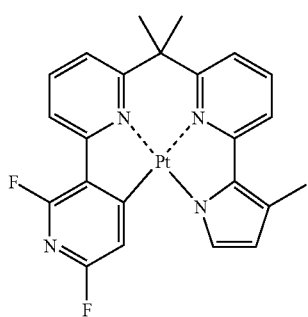  213
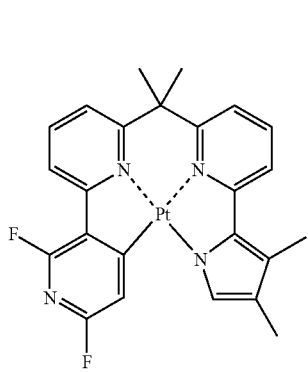  214
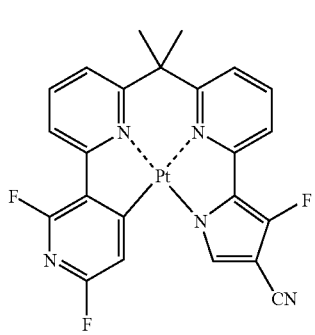  215
-continued
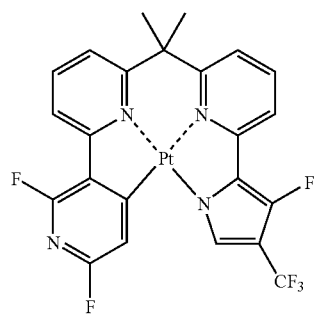  216
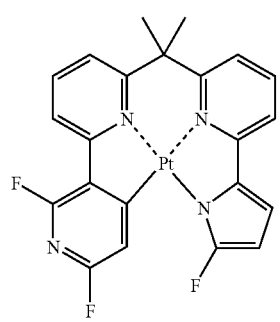  217
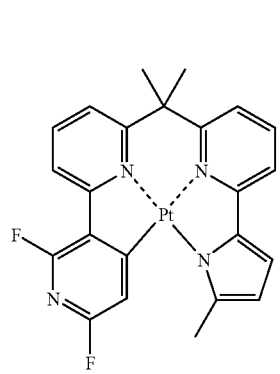  218
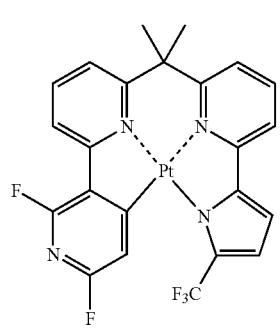  219
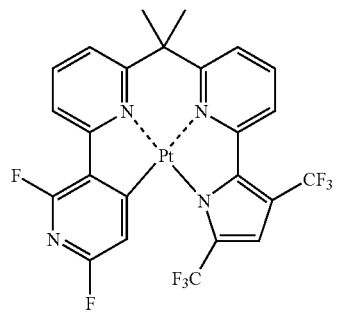  220

221
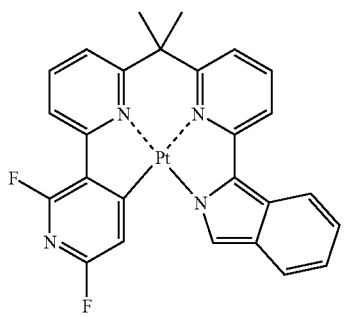
222
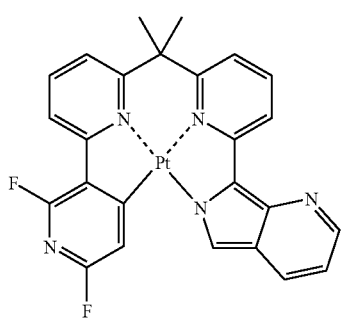
223
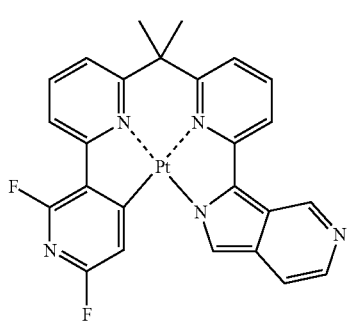
224
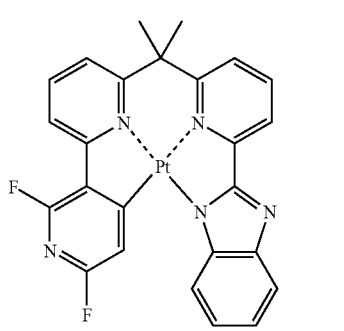
225
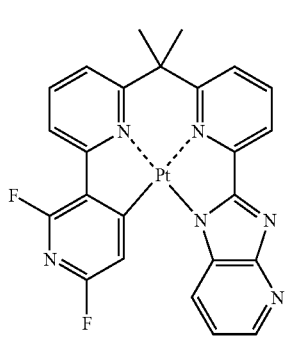
226
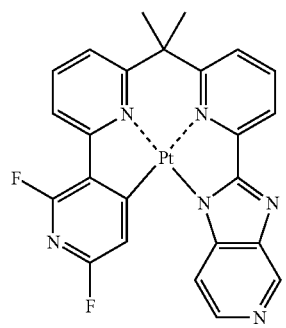
227
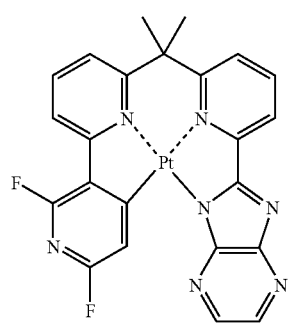
228
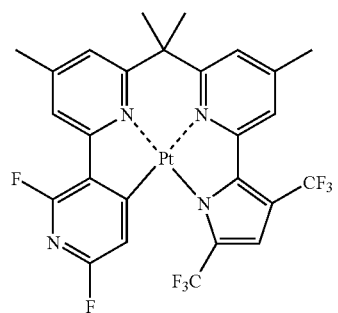
229
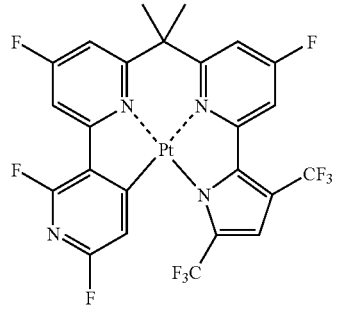
230
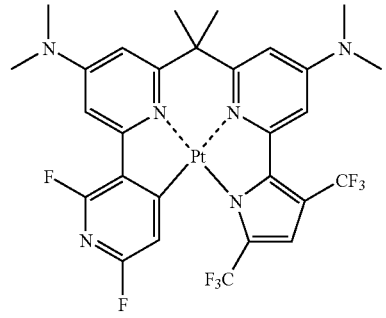

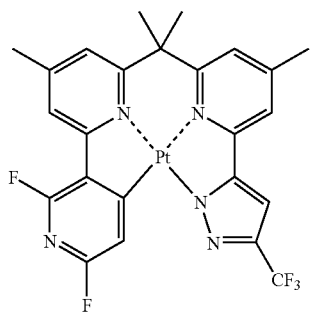
231
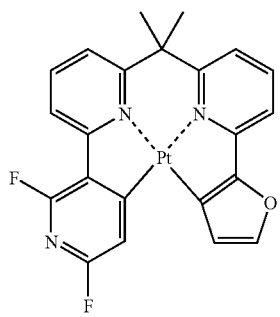
237
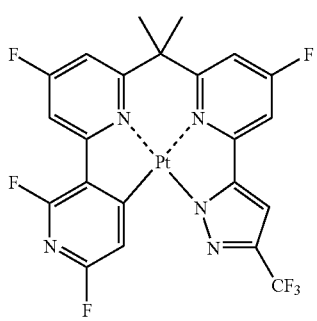
232
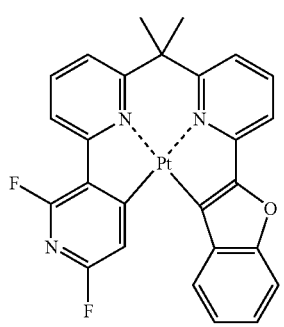
238
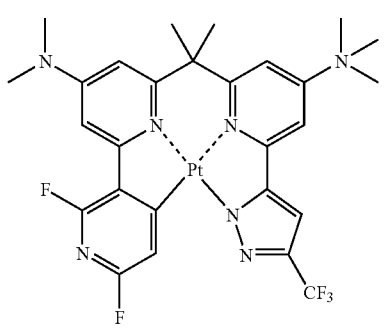
234
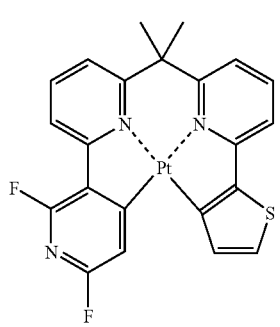
239
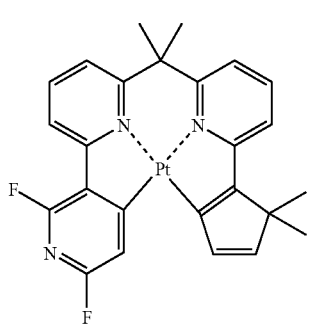
235
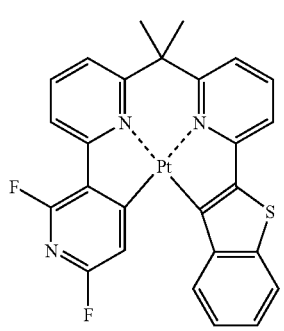
240
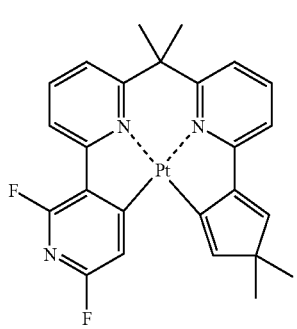
236
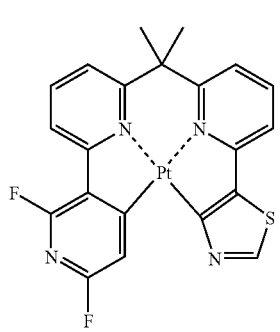
241

242
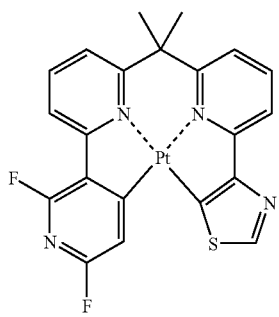
243
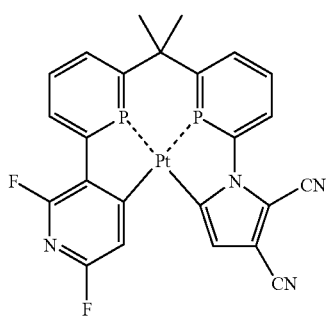
244
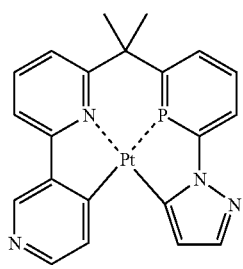
245
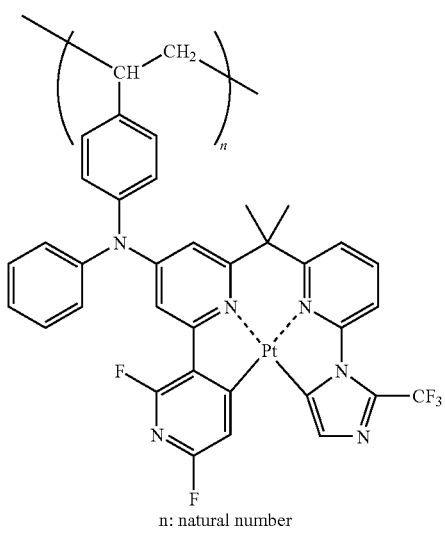
n: natural number
246
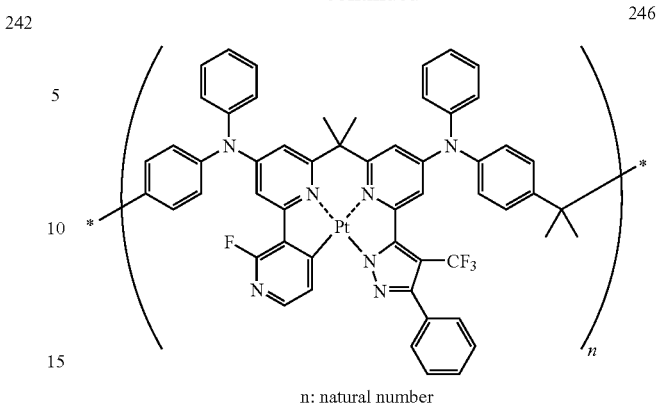
n: natural number
247
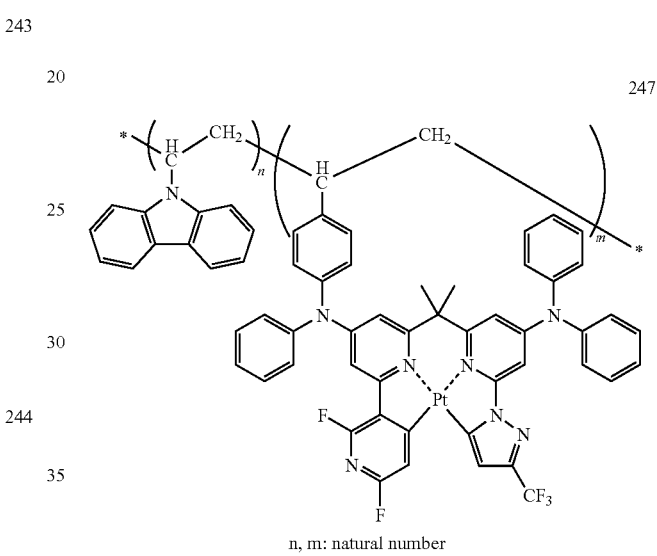
n, m: natural number
248
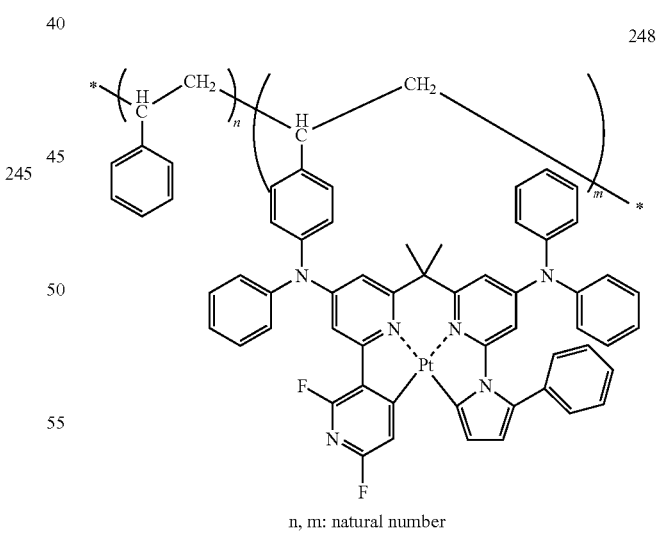
n, m: natural number
A method for manufacturing the metal complex of formula (4) will be described.
The metal complex of formula (4) is prepared by the reaction between a compound of formula (C-0) shown below (hereinafter also referred to as a ligand) and a platinum salt in a solvent.

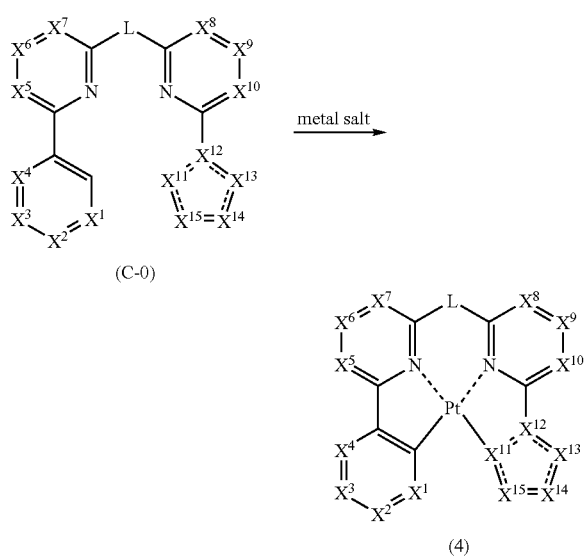

(C-0)

(4)

In formula (C-0), $X^1$, $X^2$, $X^3$, $X^4$, $X^5$, $X^6$, $X^7$, $X^9$, $X^{10}$, $X^{11}$, $X^{12}$, $X^{13}$, $X^{14}$, $X^{15}$, and L are as defined for formula (4), and the preferred ranges of $X^1$, $X^2$, $X^3$, $X^4$, $X^5$, $X^6$, $X^7$, $X^8$, $X^9$, $X^{10}$, $X^{11}$, $X^{12}$, $X^{13}$, $X^{14}$, $X^{15}$, and L are the same as those described with respect to formula (4).

In manufacturing the platinum complex, examples of the platinum salt that can be used in the reaction include those having divalent platinum, such as platinum chloride, platinum bromide, platinum iodide, platinum acetylacetonate, bis(benzonitrile)dichloroplatinum, bis(acetonitrile)dichloroplatinum, dichloro(1,5-cyclooctadiene)platinum, dibromobis(triphenylphosphine)platinum, dichloro(1,10-phenanthroline)platinum, dichlorobis(triphenylphosphine)platinum, ammonium tetrachloroplatinate, diamminedibromoplatinate, diamminedichloroplatinum, diamminediiodoplatinum, potassium tetrabromoplatinate, potassium tetrachloroplatinate, sodium tetrachloroplatinate, dimethylbis(dimethyl sulfoxide)platinum, dimethylbis(dimethyl sulfide)platinum, and dimethyl(bicyclo[2.2.1]hepta-2,5-diene)platinum.

Preferred of these platinum salts are platinum halides, such as platinum chloride, platinum bromide, and platinum iodide; nitrile complexes, such as bis(benzonitrile)dichloroplatinum and bis(acetonitrile)dichloroplatinum; and olefin complexes, such as dichloro(1,5-cyclooctadiene)platinum. More preferred of them are platinum halides, such as platinum chloride and platinum bromide; and nitrile complexes, such as bis(benzonitrile)dichloroplatinum and bis(acetonitrile)dichloroplatinum.

The platinum salt used in manufacturing the platinum complex may contain crystal water, a solvent for crystallization, or a coordinated solvent. The valence of platinum of the platinum salt is preferably, but not limited to, 2 or 0, more preferably 2.

In using a platinum salt containing one platinum atom per molecule in manufacturing the platinum complex the amount of the platinum salt to be used in the formation of the platinum complex is usually 0.1 to 10 mol, preferably 0.5 to 5 mol, even more preferably 1 to 3 mol, per mole of the ligand. When in using a platinum salt containing n platinum atoms, the amount to be used is one nth of that recited above.

In manufacturing the platinum complex, examples of the solvent that can be used in the reaction between the platinum salt and the ligand include amides, such as N,N-dimethylformamide, formamide, and N,N-dimethylacetamide; nitriles, such as acetonitrile, propionitrile, butyronitrile, and benzonitrile; halogenated hydrocarbons, such as dichloromethane, 1,2-dichloroethane, chloroform, carbon tetrachloride, chlorobenzene, and o-dichlorobenzene; aliphatic hydrocarbons, such as pentane, hexane, octane, and decane; aromatic hydrocarbons, such as benzene, toluene, xylene, and mesitylene; ethers, such as diethyl ether, diisopropyl ether, butyl ether, tert-butyl methyl ether, 1,2-dimethoxyethane, tetrahydrofuran, and 1,4-dioxane; ketones, such as acetone, methyl ethyl ketone and methyl isobutyl ketone; alcohols, such as methanol, ethanol, 1-propanol, 2-propanol, tert-butyl alcohol, 2-methoxyethanol, 2-ethoxyethanol, ethylene glycol, and glycerol; and water.

Preferred of them are nitriles, such as acetonitrile, propionitrile, butyronitrile, and benzonitrile; aromatic hydrocarbons, such as benzene, toluene, xylene, and mesitylene; and alcohols, such as methanol, ethanol, 1-propanol, 2-propanol, tert-butyl alcohol, 2-methoxyethanol, 2-ethoxyethanol, ethylene glycol, and glycerol. Particularly preferred are nitriles, such as acetonitrile, propionitrile, butyronitrile, and benzonitrile, and aromatic hydrocarbons, such as benzene, toluene, xylene, and mesitylene.

These solvents may be used either individually or in combination of two or more thereof.

In manufacturing the platinum complex, the amount of the solvent to be used in the reaction is not limited as long as the reaction proceeds sufficiently but is preferably 1 to 200 times, more preferably 5 to 100 times, the volume of the ligand.

In manufacturing the platinum complex, in a case where the reaction between the platinum salt and the ligand is accompanied by production of an acidic substance, such as hydrogen halide, the reaction may be carried out in the presence of a basic substance. Examples of suitable basic substances include tertiary amines, such as triethylamine, diisopropylethylamine, pyridine, and 1,8-dimethylaminonaphthalene; metal alkoxides, such as sodium methoxide and sodium ethoxide; and inorganic bases, such as sodium hydroxide, potassium hydroxide, potassium carbonate, and sodium hydrogencarbonate.

In manufacturing the platinum complex, the reaction is preferably performed in an inert gas atmosphere, such as nitrogen or argon.

In manufacturing the platinum complex, while the reaction temperature, time, and pressure vary depending on the reactants, the solvent, and the like, the temperature is usually 20° to 300° C., preferably 50° to 250° C., more preferably 80° to 220° C.; the time is usually 30 minutes to 24 hours, preferably 1 to 12 hours, more preferably 2 to 10 hours; and the pressure is usually atmospheric pressure but, where necessary may be increased or decreased pressure.

In manufacturing the platinum complex, the heating means used to conduct the reaction include, but are not limited to, an oil bath, a mantle heater, and microwave heating.

The platinum complex thus produced may be isolated and purified where needed by, for example, column chromatography, recrystallization, reprecipitation, sublimation, and a combination thereof.

Of the platinum complexes of formula (4), those represented by formula (5a-1) may also be prepared in accordance with the following reaction scheme:

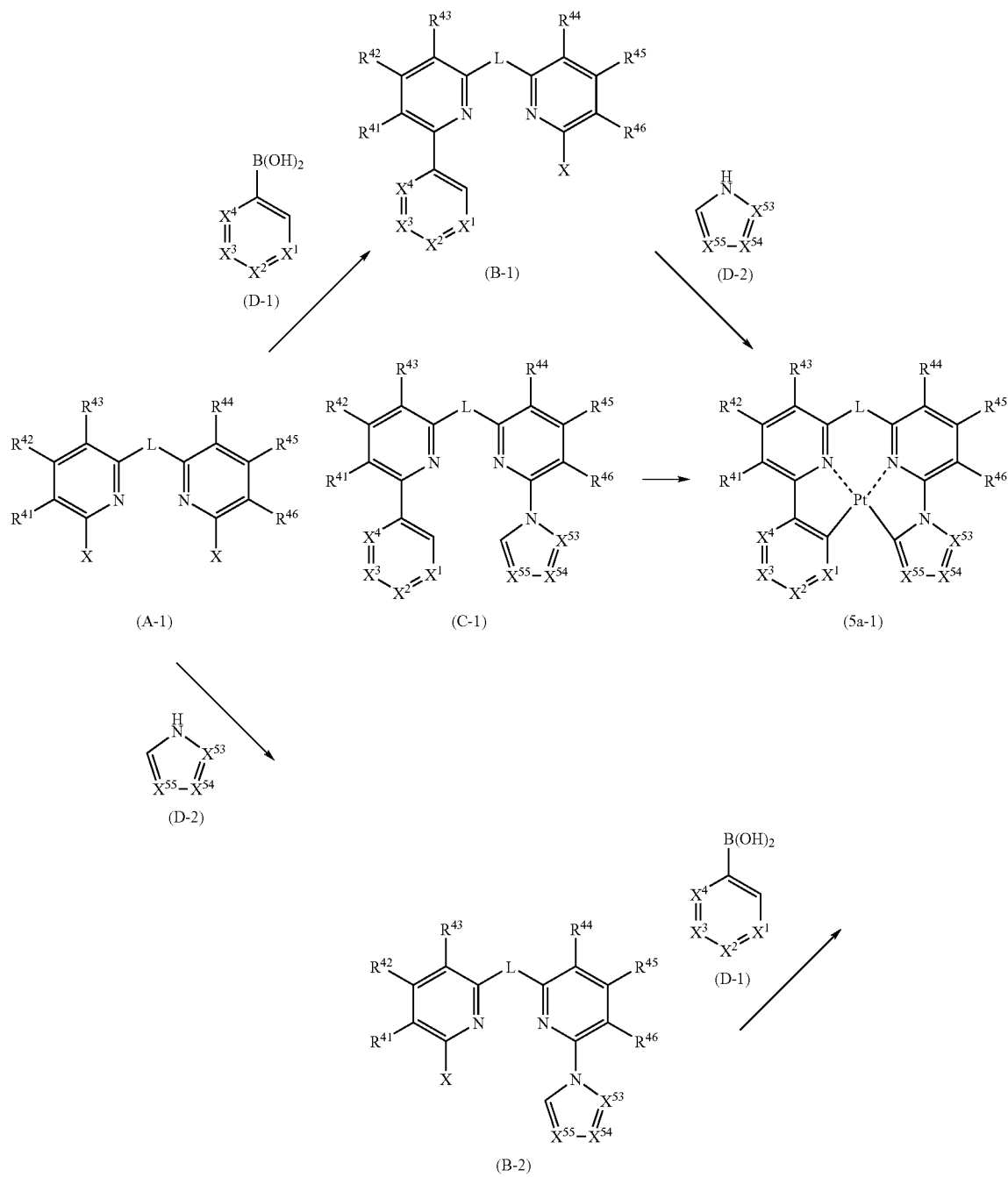

In the formulae, $X^1$, $X^2$, $X^3$, $X^4$, $X^{53}$, $X^{54}$, $X^{55}$, $R^{41}$, $R^{42}$, $R^{43}$, $R^{44}$, $R^{45}$, $R^{46}$, and L are as defined for formula (5a-3).

The step of obtaining (B-1) from (A-1) and the step of obtaining (C-1) from (B-2) are carried out by following the method reported in, e.g., *Synth. Commun.*, 11, 513 (1981).

The step of obtaining (C-1) from (B-1) and the step of obtaining (B-2) from (A-1) are achieved in accordance with the method reported in, e.g., *Angew. Chem. Int. Ed.*, 42, 2051-2053 (2003).

The step of obtaining the platinum complex of formula (5a-1) from (C-1) is carried out by dissolving a compound (C-1) and 1 to 1.5 equivalents of platinum (II) chloride in benzonitrile and heating the reaction system at 130° C. to the refluxing temperature (i.e., the boiling point of benzonitrile, 191° C.) for 30 minutes to 4 hours while stirring. The platinum complex of formula (4) may be purified by recrystallization using chloroform, dichloromethane, toluene, xylene, acetonitrile, butyronitrile, benzonitrile, ethyl acetate, or the like, silica gel column chromatography, sublimation, and the like.

In a case where a defined substituent changes under some reaction conditions in the aforementioned synthesis, or where a defined substituent is unsuitable to effect the synthesis, the synthesis is easily accomplished by, for example, protection and deprotection of the functional group by referring, e.g., to T. W. Greene, *Protective Groups in Organic Synthesis*, John Wiley & Sons, Inc. (1981). Where necessary, the order of reaction steps, such as the step of introducing a substituent, may be changed appropriately.

The amount of the luminescent material in the light-emitting layer is usually 0.1% to 50% by mass based on the total mass of the materials making up the light-emitting layer. It is preferably 1% to 50% by mass, more preferably 2% to 40% by mass, in view of durability and external quantum efficiency.

The thickness of the light-emitting layer is preferably, but not limited to, 2 to 500 nm, more preferably 3 to 200 nm, even more preferably 5 to 100 nm, in view of external quantum efficiency.

<Host Material>

The host materials that can be used in the invention include not only the compounds of formulae (1), (2), and (3) but other compounds acting as a charge transport material or a hole transport material. Charge transporting host materials are preferred. Two or more host materials may be used in combination. For example, an electron transporting host material and a hole transporting host material may be used in combination. Examples of useful host materials other than the compounds of the invention include pyrroles, indoles, carbazoles, azaindoles, azacarbazoles, triazoles, oxazoles, oxadiazoles, pyrazoles, imidazoles, thiofenes, polyarylalkanes, pyrazolilnes, pyrazolones, phenylenediamines, arylamines, amino-substituted chalcones, styrylanthracenes, fluorenones, hydrazones, stilbenes, silazanes, aromatic tertiary amine compounds, styrylamine compounds, porphyrin compounds; electrically conductive oligomers or polymers, such as polysilane compounds, poly(N-vinylcarbazole) and its derivatives, aniline copolymers, thiophene oligomers, and polythiophene; organic silanes, carbon film, pyridines, pyrimidines, triazines, anthraquinodimethanes, anthrones, diphenylquinones, thiopyrane dioxide derivatives, carbodiimides, fluorenylidenemethanes, distyrylpyrazines, fluorine-substituted aromatic compounds; heterocyclic tetracarboxylic acid anhydrides, such as naphthalenetetracarboxylic acid anhydride and perylenetetracarboxylic acid anhydride; and various metal complexes and derivatives thereof (having a substituent or a fused ring), such as metallophthalocyanines, 8-quinolinol metal complexes, metal complexes having benzoxazole or benzothiazole as a ligand.

In the light-emitting layer, it is preferred that the host material (e.g., the compound of formula (1), (2), or (3)) have a higher $T_1$ energy (lowest excited triplet energy) level than the above described phosphorescent material in terms of color purity, luminescence efficiency, and driving durability.

The host compound content is preferably, but not limited to, 15% to 99% by mass, more preferably 30% to 95% by mass, even more preferably 50% to 93% by mass, based on the total mass of materials making up the light-emitting layer in terms of luminescence efficiency and driving voltage. When the host material is a mixture of the compound of formula (1), (2), or (3) and other host compound(s), the proportion of the compound of formula (1), (2), or (3) in the total host material is preferably 30% to 100% by mass, more preferably 50% to 100% by mass, even more preferably at least 70% to 100% by mass.

(Hole Injection Layer, Hole Transport Layer)

The hole injection layer and the hole transport layer function to accept holes from the anode or from the side of the anode and transport the holes to the side of the cathode. Hole injection materials and hole transport materials that can be used in these layers may be either low molecular or high molecular compounds. Examples of suitable hole injection/transport materials include pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, phthalocyanine compounds, porphyrin compounds, thiophene derivatives, organic silane derivatives, carbon, and metal complexes, such as iridium complexes.

The hole injection or transport layer in the organic EL device may contain an electron accepting dopant. Examples of the electron accepting dopant include either organic or inorganic compound, which has ability to oxidize an organic compound.

Examples of the inorganic accepting dopant include metal halides, such as ferric chloride, aluminum chloride, gallium chloride, indium chloride, and antimony pentachloride, and metal oxides, such as vanadium pentoxide and molybdenum trioxide.

Suitable examples of the organic accepting dopant include compounds having a nitro group, a halogen atom, a cyano group, a trifluoromethyl group, etc. as a substituent, quinone compounds, acid anhydride compounds, and fullerene and its derivatives. Other useful organic accepting dopants are described in JP 6-212153A, JP 11-111463A, JP 11-251067A, JP 2000-196140A, JP 2000-286054A, JP 2000-315580A, JP 2001-102175A, JP 2001-160493A, JP 2002-252085A, JP 2002-56985A, JP 2003-157981A, JP 2003-217862A, JP 2003-229278A, JP 2004-342614A, JP 2005-72012A, JP 2005-166637A, and JP 2005-209643A.

Preferred of these accepting dopants are hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and fullerene C60. More preferred of them are hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, and 2,3,5,6-tetracyanopyridine. Tetrafluorotetracyanoquinodimethane is particularly preferred.

The accepting dopants may be used either individually or as a mixture of two or more thereof. The amount of the accepting dopant is preferably, though dependent on the accepting dopant compound, 0.01% to 50% by mass, more preferably 0.05% to 20% by mass, even more preferably 0.1% to 10% by mass, based on the material making up the hole transport layer.

The hole injection layer and the hole transport layer each preferably have a thickness of 500 nm or less not to increase the driving voltage. The thickness of the hole transport layer is preferably 1 to 500 nm, more preferably 5 to 200 nm, even more preferably 10 to 100 nm. The thickness of the hole injection layer is preferably 0.1 to 200 nm, more preferably 0.5 to 100 nm, even more preferably 1 to 100 nm.

Each of the hole injection layer and the hole transport layer may have a single layer structure formed of one or more of the above described materials or a multilayer structure composed of sublayers having the same or different compositions.
(Electron Injection Layer, Electron Transport Layer)

The electron injection layer and the electron transport layer function to accept electrons from the cathode or from the side of the cathode and transport the electrons to the side of the anode. Electron injection materials and electron transport materials that can be used in these layers may be either low molecular or high molecular compounds.

Examples of suitable electron injection/transport materials include the compounds of the invention, pyridine derivatives, quinoline derivatives, pyrimidine derivatives, pyrazine derivatives, phthalazine derivatives, phenanthroline derivative, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrane dioxide derivatives, carbodiimide derivatives, fluorenylidenemethane derivatives, distyrylpyrazine derivatives, aromatic tetracarboxylic acid anhydrides, such as naphthalenetetracarboxylic acid anhydride and perylenetetracarboxylic acid anhydride; various metal complexes, such as metallophthalocyanines, 8-quinolinol metal complexes, metal complexes having benzoxazole or benzothiazole as a ligand; and organic silane derivative typified by silole.

The electron injection or transport layer in the organic EL device may contain an electron donating dopant, which has ability to reduce an organic compound. Suitable examples of the donating dopant include alkali metals (e.g., Li), alkaline earth metals (e.g., Mg), transition metals, rare earth metals, and reducing organic compounds. The metals as a donating dopant preferably have a work function of 4.2 eV or less. Examples of such metals are Li, Na, K, Be, Mg, Ca, Sr, Ba, Y, Cs, La, Sm, Gd, and Yb. Examples of the reducing organic compounds are nitrogen-containing compounds, sulfur-containing compounds, and phosphorus-containing compounds.

Materials described in JP 6-212153A, JP 2000-196140A, JP 2003-68468A, JP 2003-229278A, and JP 2004-342614A are also useful as a donating dopant.

These donating dopants may be used either individually or in combination of two or more thereof. The amount of the donating dopant is preferably, though dependent on the donating dopant, 0.1% to 99% by mass, more preferably 1.0% to 80% by mass, even more preferably 2.0% to 70% by mass, based on the material making up the electron transport layer.

The electron injection layer and the electron transport layer each preferably have a thickness of 500 nm or less not to increase the driving voltage.

The thickness of the electron transport layer is preferably 1 to 500 nm, more preferably 5 to 200 nm, even more preferably 10 to 100 nm The thickness of the electron injection layer is preferably 0.1 to 200 nm, more preferably 0.2 to 100 nm, even more preferably 0.5 to 50 nm.

Each of the electron injection layer and the electron transport layer may have a single layer structure formed of one or more of the above described materials or a multilayer structure composed of sublayers having the same or different compositions.
(Hole Blocking Layer)

The hole blocking layer functions to prevent the holes transported from the anode side to the light-emitting layer from escaping to the cathode side. In the present invention, an organic layer may be provided adjoining the cathode side of the light-emitting layer to serve as a hole blocking layer.

The hole blocking layer is preferably made of an aluminum complex, e.g., aluminum (III) bis(2-methyl-8-quinolinato) 4-phenylphenolate (BAlq), a triazole derivative, or a phenanthroline derivative, e.g., 2,9-dimethyl-4,7-diphenyl-1,10-phenanthroline (BCP).

The thickness of the hole blocking layer is preferably 1 to 500 nm, more preferably 5 to 200 nm, even more preferably 10 to 100 nm.

The hole blocking layer may have a single layer structure formed of one or more of the above described materials or a multilayer structure composed of sublayers having the same or different compositions.
(Electron Blocking Layer)

The electron blocking layer functions to prevent the electrons transported from the cathode side to the light-emitting layer from escaping to the anode side. In the present invention, an organic layer may be provided adjoining the anode side of the light-emitting layer to serve as an electron blocking layer.

The electron blocking layer may be made of any of the aforementioned hole transport materials.

The thickness of the electron blocking layer is preferably 1 to 500 nm, more preferably 5 to 200 nm, even more preferably 10 to 100 nm.

The electron blocking layer may have a single layer structure formed of one or more of the above described materials or a multilayer structure composed of sublayers having the same or different compositions.
(Protective Layer)

The whole organic EL device may be protected with a protective layer.

The protective layer can be of any material that prevents substances which may accelerate deterioration of the device, such as moisture and oxygen, from entering the device.

The details of the protective layer are described in JP 2008-270736A and JP 2007-266458A, which are herein incorporated by reference.
(Charge Generating Layer)

In order to improve luminescence efficiency, the organic EL device of the invention may have a charge generating layer between light emitting sublayers (emission sublayers).

The charge generating layer functions to generate charges (i.e., holes and electrons) on electric field application and to inject the charges generated into emission sublayers adjoining thereto.

The details of the charge generating layer are described in JP 11-329748A, JP 2003-272860A, and JP 2004-39617A, which are herein incorporated by reference.
(Sealing)

The device may be wholly sealed in a sealing container.

A desiccant or an inert liquid may be put in a space between the sealing container and the device. Useful desiccants include, but are not limited to, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. Useful inert liquids include, but are not limited to, paraffins, liquid paraffins, fluorine-containing solvents (e.g., perfluoroalkanes, perfluoroamines, and perfluoroethers), chlorine-containing solvents, and silicone oils.

The organic EL device emits light on applying a direct current (which may contain an alternating component, if needed) voltage usually of 2 to 15 V or a direct current between the anode and the cathode.

For driving the device, the methods taught in JP 2-148687A, JP 6-301355A, JP 5-29080A, JP 7-134558A, JP 8-234685A, JP 8-241047A, Japanese Patent 2784615, and U.S. Pat. Nos. 5,828,429 and 6,023,308 can be used.

The organic EL device of the invention is suited for use in display devices, displays, backlights, electrophotography, lighting sources, light sources for writing, reading, or exposure, signs, billboards, interior accessories, optical communications, and so on.

EXAMPLES

The invention will now be illustrated in greater detail with reference to Examples, but it should be understood that the invention is not deemed to be limited thereto.

Compounds of the invention and comparative compounds shown below were synthesized.

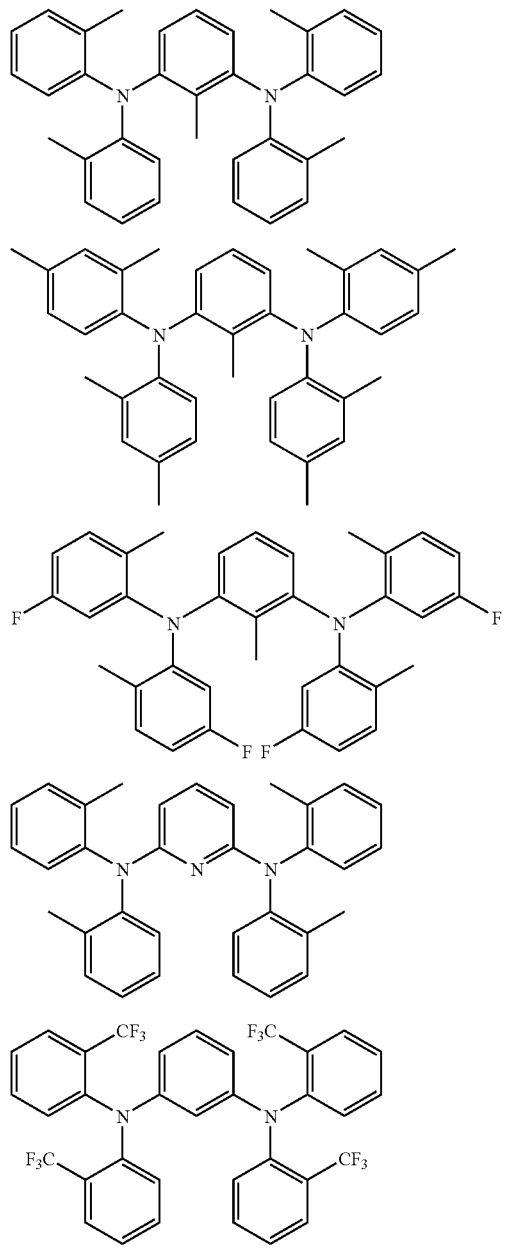

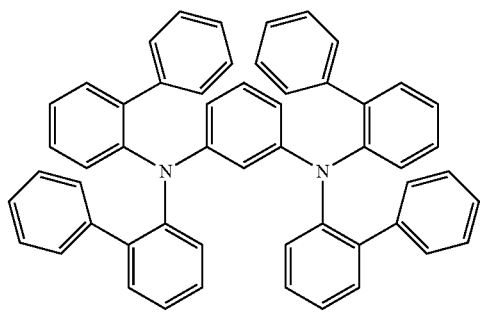

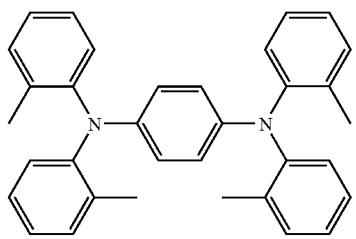

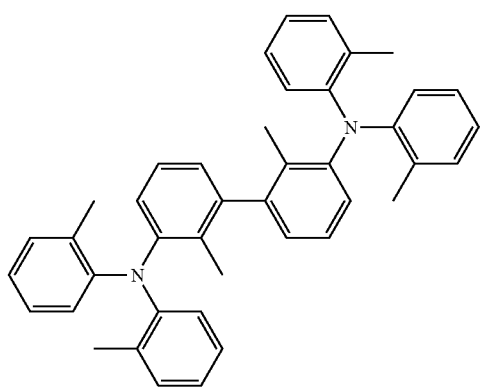

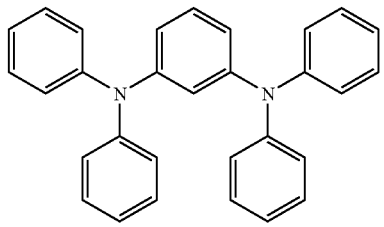

Comparative Compound 1

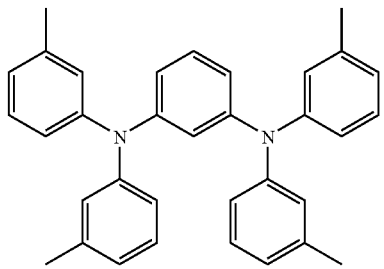

Comparative Compound 2

Comparative Compound 3

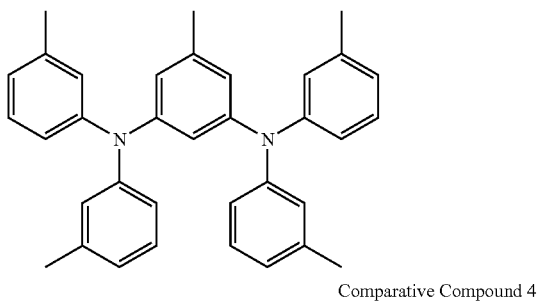

Comparative Compound 4

Comparative Compound 5

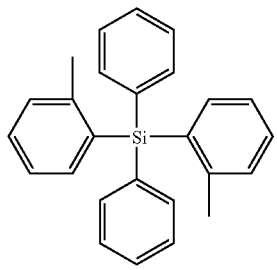

Comparative Compound 6

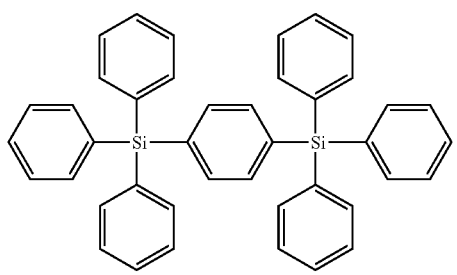

Comparative Compound 7

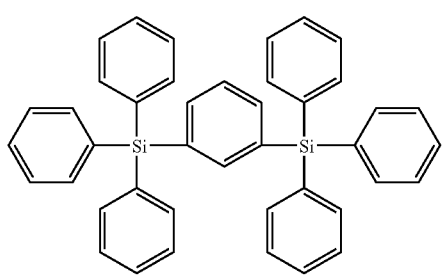

Synthesis Example 1

Preparation of Compound 1

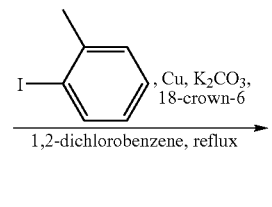

56%
Compound 1

A mixture of 1.20 g (10.0 mmol) of 2,6-diaminotoluene, 34.8 g (160 mmol) of o-iodotoluene, 3.54 g (40.0 mmol) of copper powder, 11.6 g (80.0 mmol) of potassium carbonate, 0.264 g (0.500 mmol) of 18-crown-6, and 10 ml of 1,2-dichlorobenzene was heated under reflux for 5 hours while stirring in a nitrogen atmosphere. After cooling the reaction system to room temperature, 100 ml of isopropyl alcohol was added. The solid precipitated was collected by filtration, washed successively with 5% hydrochloric acid, pure water, and methanol, and completely dissolved in 40 ml of chloroform. The insoluble matter (copper powder) was removed by filtration, and the filtrate was concentrated and recrystallized from a 1:1 mixture of toluene and hexane to give 1.35 g (56%) of Compound 1 as white crystals.

$^1$H NMR δ (300 MHz, CDCl$_3$, ppm): 7.15 (d, 2H), 7.08-6.97 (m, 8H), 6.95-6.89 (m, 3H), 6.74-6.66 (m, 4H), 6.52 (d, 2H), 1.94 (s, 3H), 1.81 (s, 3H), 1.50 (s, 3H)

The resulting product was purified by sublimation to make a device (HPLC purity: 100.0%).

A 2.5 cm square quartz glass substrate having a thickness of 0.5 mm was cleaned by ultrasonication in 2-propanol, followed by UV-ozone treatment for 30 minutes. Each of compounds 1, 4, and 5 and comparative compounds A, B, and F was deposited on the cleaned substrate by vacuum vapor deposition to a thickness of 50 nm. The following physical properties (a), (b), and (c) of the deposited film were determined. The results obtained are shown in Table 1.

(a) Ionization Potential (Ip)

Measured using a photoelectron spectrometer AC-1 from Riken Keiki Co., Ltd.

(b) Electron Affinity (Ea)

The band gap (Eg) was obtained from the longer wavelength end of the absorption spectrum. Then, Ea was obtained according to formula: Ea=Ip−Eg.

(c) Excited Triplet Level (T$_1$ Energy)

The phosphorescence spectrum was determined at −196° C. The T$_1$ energy was obtained from the shorter wavelength end of the spectrum.

TABLE 1

| Compound Number | Ip (eV) | Ea (eV) | T$_1$ (eV) |
|---|---|---|---|
| Compound 1 | 5.8 | 1.9 | 3.1 |
| Compound 4 | 5.7 | 1.9 | 3.1 |
| Compound 5 | 5.9 | 2.0 | 3.1 |
| Comparative Compound 1 | 5.6 | 1.9 | 2.7 |
| Comparative Compound 2 | 5.5 | 1.8 | 2.7 |
| Comparative Compound 6 | — | — | 3.2 |

Ip of Comparative Compound 6 was not measurable because the Ip was above the detection limit (6.0 eV).

<Organic Electroluminescent Device>

Example 1

Preparation of Device 1-1

An ITO-coated glass substrate (2.5 mm×2.5 mm×0.5 mm(t)) (a product from Geomatec Corp.; surface resistivity: 10 Ω/sq) was cleaned by ultrasonication in 2-propanol, followed by UV-ozone treatment for 30 minutes. The following four organic compound layers were successively formed in the order described on the ITO film (transparent anode) by vacuum vapor deposition to the respective thicknesses described.

First layer: copper phthalocyanine (CuPc) (10 nm)

Second layer: NPD (see below) (40 nm)

Third layer (light-emitting layer): Compound 1 and D-158 (see below) in a weight ratio of 93:7 (which composition will be referred to as "cpd. 1+7% D-158") (30 nm)

Fourth layer: BAlq (30 nm)

Subsequently, lithium fluoride and metallic aluminum were deposited in that order on the fourth layer to a thickness of 0.1 nm and 100 nm, respectively, to form a cathode.

The resulting coated substrate was transferred into a glove box purged with nitrogen without being exposed to air, where it was sealed in a glass container using a UV curing adhesive (XNR5516HV from Nagase Chemtex Corp.) to complete an organic electroluminescent device 1-1. The compounds used in the preparation of the organic electroluminescent device 1-1 and the other devices hereinafter described are shown below.

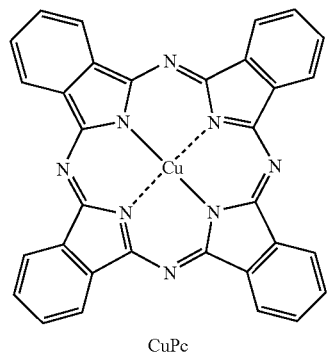

CuPc

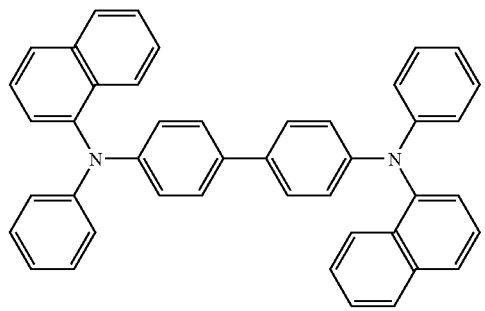

NPD

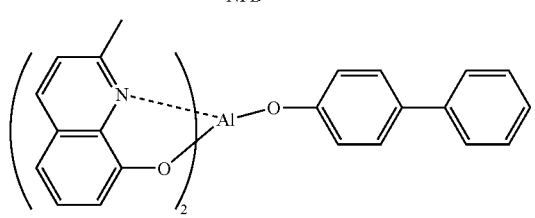

BAlq

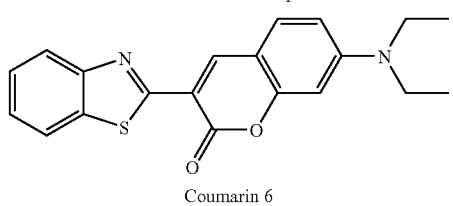

Coumarin 6

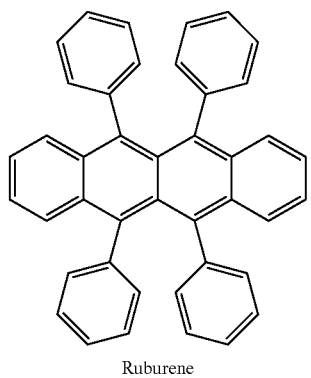

Ruburene

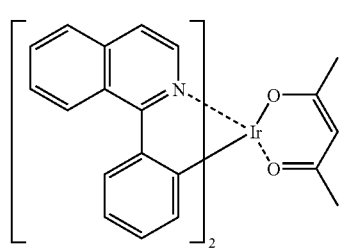

D-16

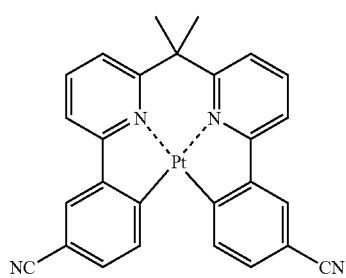

D-35

-continued

D-46

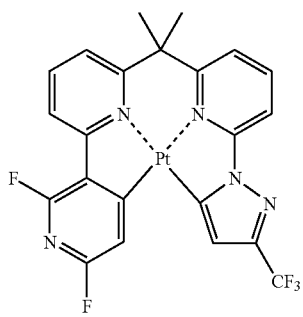

D-107

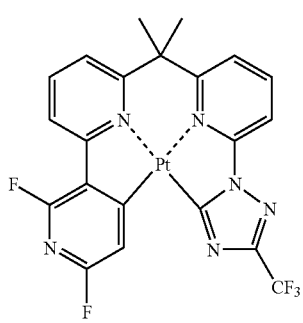

-continued

D-158

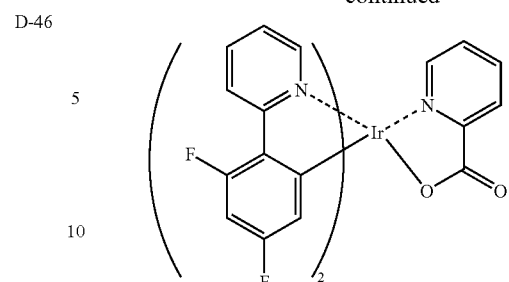

D-159

[structure of D-159]

Preparation of Other Devices

Other devices were prepared in the same manner as for device 1-1 except for changing the composition of the light-emitting layer as shown in Table 2.

TABLE 2

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 1-1 | cpd. 1 + 10% D-158 | 469 | 10 | 10 | 10 |
| Inventive Device 1-4 | cpd. 4 + 7% D-158 | 469 | 10 | 11 | 9 |
| Inventive Device 1-17 | cpd. 17 + 7% D-158 | 469 | 9 | 12 | 9 |
| Inventive Device 1-20 | cpd. 20 + 7% D-158 | 469 | 8 | 9 | 7 |
| Inventive Device 1-27 | cpd. 27 + 7% D-158 | 470 | 9 | 10 | 8 |
| Inventive Device 1-32 | cpd. 32 + 7% D-158 | 469 | 8 | 8 | 8 |
| Comparative Device 1-1 | comparative cpd. 1 + 7% D-158 | 470 | 2 | 21 | <0.1 |
| Comparative Device 1-3 | comparative cpd. 3 + 7% D-158 | 470 | 3 | 18 | <0.1 |
| Comparative Device 1-6 | comparative cpd. 6 + 7% D-158 | 469 | 5 | 15 | 1 |

Example 2

Organic devices were prepared in the same manner as in "Preparation of device 1-1" except for changing the composition of the light-emitting layer as shown in Table 3.

TABLE 3

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 2-1 | cpd. 1 + 7% D-46 | 466 | 10 | 10 | 10 |
| Inventive Device 2-5 | cpd. 5 + 7% D-46 | 466 | 10 | 11 | 9 |

TABLE 3-continued

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 2-15 | cpd. 15 + 7% D-46 | 464 | 10 | 10 | 6 |
| Inventive Device 2-20 | cpd. 20 + 7% D-46 | 467 | 8 | 12 | 5 |
| Inventive Device 2-27 | cpd. 27 + 7% D-46 | 467 | 10 | 10 | 4 |
| Inventive Device 2-32 | cpd. 32 + 7% D-46 | 466 | 8 | 9 | 4 |
| Comparative Device 2-1 | comparative cpd. 1 + 7% D-46 | Unmeasurable due to considerable secondary light emission | | | |
| Comparative Device 2-4 | comparative cpd. 4 + 7% D-46 | Unmeasurable due to considerable secondary light emission | | | |
| Comparative Device 2-7 | comparative cpd. 7 + 7% D-46 | 466 | 3 | 21 | 0.1 |

Example 3

Organic devices were prepared in the same manner as in "Preparation of device 1-1" except for changing the composition of the light-emitting layer as shown in Table 4.

TABLE 4

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 3-1 | cpd. 1 + 7% D-107 | 461 | 10 | 10 | 10 |
| Inventive Device 3-4 | cpd. 4 + 7% D-107 | 461 | 10 | 11 | 10 |
| Inventive Device 3-17 | cpd. 17 + 7% D-107 | 461 | 10 | 12 | 8 |
| Inventive Device 3-20 | cpd. 20 + 7% D-107 | 462 | 8 | 10 | 5 |
| Inventive Device 3-27 | cpd. 27 + 7% D-107 | 462 | 9 | 9 | 5 |
| Inventive Device 3-32 | cpd. 32 + 7% D-107 | 462 | 8 | 9 | 6 |
| Comparative Device 3-1 | comparative cpd. 1 + 7% D-107 | Unmeasurable due to considerable secondary light emission | | | |
| Comparative Device 3-2 | comparative cpd. 2 + 7% D-107 | Unmeasurable due to considerable secondary light emission | | | |
| Comparative Device 3-7 | comparative cpd. 7 + 7% D-107 | 461 | 5 | 16 | 0.5 |

Example 4

Organic devices were prepared in the same manner as in "Preparation of device 1-1" except for changing the composition of the light-emitting layer as shown in Table 5.

TABLE 5

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 4-1 | cpd. 1 + 7% D-159 | 513 | 10 | 10 | 10 |
| Inventive Device 4-5 | cpd. 5 + 7% D-159 | 513 | 10 | 11 | 8 |
| Inventive Device 4-20 | cpd. 20 + 7% D-159 | 513 | 8 | 10 | 7 |
| Inventive Device 4-32 | cpd. 32 + 7% D-159 | 513 | 9 | 8 | 8 |

TABLE 5-continued

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Comparative Device 4-1 | comparative cpd. 1 + 7% D-159 | 514 | 4 | 12 | <0.1 |
| Comparative Device 4-2 | comparative cpd. 2 + 7% D-159 | 513 | 5 | 12 | <0.1 |
| Comparative Device 4-6 | comparative cpd. 6 + 7% D-159 | 513 | 7 | 13 | 2 |

Example 5

Organic devices were prepared in the same manner as in "Preparation of device 1-1" except for changing the composition of the light-emitting layer as shown in Table 6.

TABLE 6

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 5-1 | cpd. 1 + 7% D-35 | 503 | 10 | 10 | 10 |
| Inventive Device 5-15 | cpd. 15 + 7% D-35 | 501 | 11 | 10 | 6 |
| Inventive Device 5-27 | cpd. 27 + 7% D-35 | 504 | 10 | 10 | 6 |
| Inventive Device 5-32 | cpd. 32 + 7% D-35 | 503 | 8 | 10 | 8 |
| Comparative Device 5-1 | comparative cpd. 1 + 7% D-35 | 504 | 4 | 12 | <0.1 |
| Comparative Device 5-5 | comparative cpd. 5 + 7% D-35 | 503 | 6 | 16 | 0.5 |
| Comparative Device 5-7 | comparative cpd. 7 + 7% D-35 | 503 | 6 | 14 | 1 |

Example 6

Organic devices were prepared in the same manner as in "Preparation of device 1-1" except for changing the composition of the light-emitting layer as shown in Table 7.

TABLE 6

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 6-1 | cpd. 1 + 7% D-16 | 625 | 10 | 10 | 10 |
| Inventive Device 6-4 | cpd. 4 + 7% D-16 | 626 | 10 | 11 | 10 |
| Inventive Device 6-20 | cpd. 20 + 7% D-16 | 626 | 8 | 10 | 7 |
| Inventive Device 6-27 | cpd. 27 + 7% D-16 | 626 | 9 | 10 | 6 |
| Comparative Device 6-1 | comparative cpd. 1 + 7% D-16 | 629 | 7 | 11 | <0.1 |
| Comparative Device 6-3 | comparative cpd. 3 + 7% D-16 | 628 | 7 | 11 | <0.1 |
| Comparative Device 6-6 | comparative cpd. 6 + 7% D-16 | 625 | 8 | 13 | 3 |

Example 7

Organic devices were prepared in the same manner as in "Preparation of device 1-1" except for changing the composition of the light-emitting layer as shown in Table 8.

TABLE 8

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 7-1 | cpd. 1 + 7% coumarin 6 | 496 | 10 | 10 | 10 |
| Inventive Device 7-20 | cpd. 20 + 7% coumarin 6 | 496 | 10 | 10 | 8 |
| Inventive Device 7-32 | cpd. 32 + 7% coumarin 6 | 497 | 10 | 10 | 10 |
| Comparative Device 7-1 | comparative cpd. 1 + 7% coumarin 6 | 496 | 7 | 12 | 0.2 |
| Comparative Device 7-6 | comparative cpd. 6 + 7% coumarin 6 | 496 | 8 | 13 | 5 |

Example 8

Organic devices were prepared in the same manner as in "Preparation of device 1-1" except for changing the composition of the light-emitting layer as shown in Table 9.

TABLE 9

| Designation of Device | Composition of Light-emitting layer | Maximum Luminescence Wavelength (nm) | Relative External Quantum Efficiency | Relative Driving Voltage | Relative Driving Durability |
|---|---|---|---|---|---|
| Inventive Device 8-1 | cpd. 1 + 7% rubrene | 555 | 10 | 10 | 10 |
| Inventive Device 8-20 | cpd. 20 + 7% rubrene | 555 | 10 | 10 | 8 |
| Inventive Device 8-32 | cpd. 32 + 7% rubrene | 555 | 10 | 10 | 9 |
| Comparative Device 8-1 | comparative cpd. 1 + 7% rubrene | 556 | 7 | 11 | 0.5 |
| Comparative Device 8-6 | comparative cpd. 6 + 7% rubrene | 555 | 9 | 13 | 6 |

The devices prepared as above were evaluated as follows. The results obtained are shown in Tables 2 to 9.

(a) Relative External Quantum Efficiency

A DC voltage was applied to the device by use of Source-Measure Unit Model 2400 supplied by Toyo Corp., and the luminance was measured with a luminance meter BM-8 from Topcon Corp. The luminescence spectrum and wavelength were determined using a spectrum analyzer PMA-11 from Hamamatsu Photonics K.K. The external quantum efficiency at a luminance of around 1000 cd/m² was calculated from these parameters in accordance with the luminance conversion method and expressed relatively taking the results of device 1-1, 2-1, 3-1, 4-1, 5-1, 6-1, 7-1, 8-1, and 9-1 as 10.

(b) Relative Driving Voltage

A DC voltage required to make the device emit light with a luminance of 1000 cd/m² was measured as a measure of the relative driving voltage. The results were relatively expressed taking the results of device 1-1, 2-1, 3-1, 4-1, 5-1, 6-1, 7-1, 8-1, and 9-1 as 10.

(c) Relative Driving Durability

The time period of reducing the luminance of the device from 1000 cd/m² to 500 cd/m² was measured as a measure of the relative driving durability. The results were relatively expressed taking the results of device 1-1, 2-1, 3-1, 4-1, 5-1, 6-1, 7-1, 8-1, and 9-1 as 10. The device emit light with a luminance of 1000 cd/m² was measured and then the time relatively expressed taking the results of device 1-1, 2-1, 3-1, 4-1, 5-1, 6-1, 7-1, 8-1, and 9-1 as 10.

(d) Maximum Luminance Wavelength

A DC voltage was applied to the device to make the device emit light with a luminance of 1000 cd/m². The maximum luminance wavelength was obtained from the luminance spectrum.

It is seen from the results of Tables 2 through 9 that the organic EL devices containing the compound of formula (1), (2) or (3) have higher efficiency, lower driving voltage, and higher driving durability than those containing comparative compounds.

What is claimed is:

1. An organic electroluminescent device comprising: a cathode; an anode; and a light-emitting layer between the cathode and the anode, the light-emitting layer including a compound represented by formula (3):

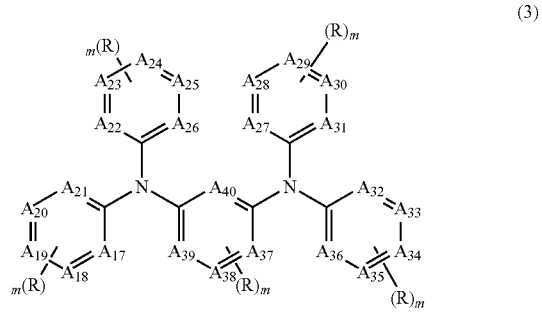

wherein $A_{18}, A_{19}, A_{20}, A_{21}, A_{22}, A_{23}, A_{24}, A_{25}, A_{26}, A_{27}, A_{28}, A_{29}, A_{30}, A_{31}, A_{32}, A_{33}, A_{34}, A_{35}, A_{36}, A_{37}, A_{38}, A_{39}$, and $A_{40}$ each independently represent a carbon atom or a nitrogen atom; $A_{17}, A_{22}, A_{27}$, and $A_{32}$ each represent a carbon atom having R"; R" represents a substituent having an $Sp^3$ carbon atom at a bonding position thereof; a plurality of Rs each independently represent an alkyl group having 1 to 18 carbon atoms, an aryl group having 6 to 18 carbon atoms, a halogen atom, a cyano group, a nitro group, a heterocyclic group having 2 to 10 carbon atoms, a silyl group having 3 to 18 carbon atoms or a phosphoryl group having 1 to 18 carbon atoms; and m represents an integer, further wherein the ring structure comprising $A_{37}, A_{38}, A_{39}$, and $A_{40}$ comprises a substituent linked to $A_{38}$ or to $A_{40}$, wherein the substituent linked to $A_{40}$ is an alkyl substituent having 1 to 18 carbon atoms, wherein said substituent is linked to $A_{40}$ when $A_{40}$ is a carbon atom, and wherein the substituent linked to $A_{38}$ is selected from the group consisting of an alkyl group having 1 to 18 carbon atoms, a halogen atom, a cyano group, a nitro group, a heterocyclic group having 2 to 10 carbon atoms, a silyl group having 3 to 18 carbon atoms or a phosphoryl group having 1 to 18 carbon atoms, wherein said substituent is linked to $A_{38}$ when $A_{38}$ is a carbon atom.

2. The organic electroluminescent device according to claim 1, wherein the compound has an excited triplet level $T_1$ of 2.8 to 3.5 eV in a form of a thin film.

3. The organic electroluminescent device according to claim 1, wherein the light emitting layer further includes a phosphorescent material.

4. The organic electroluminescent device according to claim 3, wherein the phosphorescent material is an iridium complex or a platinum complex.

5. The organic electroluminescent device according to claim 4, wherein the phosphorescent material is a platinum complex containing a tridentate or higher polydentate ligand.

6. The organic electroluminescent device according to claim 4, wherein the phosphorescent material is a platinum complex represented by formula (4):

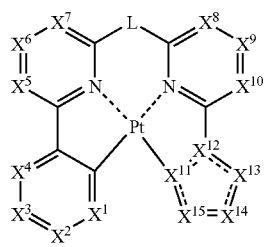

(4)

wherein $X^1, X^2, X^3$, and $X^4$ each independently represent a carbon atom or a nitrogen atom, provided that at least one of $X^1, X^2, X^3$, and $X^4$ represents a nitrogen atom; $X^5, X^6, X^7, X^8, X^9$, and $X^{10}$ each independently represent a carbon atom or a nitrogen atom; $X^{11}$ and $X^{12}$ each independently represent a carbon atom or a nitrogen atom; $X^{13}, X^{14}$, and $X^{15}$, each independently represent a carbon atom, a nitrogen atom, an oxygen atom, or a sulfur atom; a 5-membered ring skeleton formed of $X^{11}, X^{12}, X^{13}, X^{14}$, and $X^{15}$ contains 2 or less nitrogen atoms; and L represents a single bond or a divalent linking group.

7. The organic electroluminescent device according to claim 3, wherein the phosphorescent material has a maximum luminescence wavelength of 500 nm or shorter.

8. The organic electroluminescent device according to claim 1, wherein in formula (3), a plurality of Rs each independently represent an alkyl group having 1 to 18 carbon atoms, a halogen atom, a cyano group or a silyl group having 3 to 18 carbon atoms.

9. The organic electroluminescent device according to claim 1, wherein in formula (3), m represents an integer of 0 to 2.

10. The organic electroluminescent device according to claim 1, wherein the substituent having an $Sp^3$ carbon atom at a bonding position thereof represented by R" is an alkyl group having 1 to 18 carbon atoms.

11. The organic electroluminescent device according to claim 10, wherein the substituent having an $Sp^3$ carbon atom at a bonding position thereof represented by R" is a methyl group, a trifluoromethyl group, an ethyl group, an n-propyl group, an isopropyl group, an n-butyl group or a t-butyl group.

12. The organic electroluminescent device according to claim 1, wherein the number of nitrogen atoms contained in $A^{18}$ to $A^{21}, A^{23}$ to $A^{26}, A^{28}$ to $A^{31}$, and $A^{33}$ to $A^{40}$ is 0 to 5.

* * * * *